United States Patent [19]
Sakano et al.

[11] Patent Number: 5,629,920
[45] Date of Patent: *May 13, 1997

[54] PHOTOELECTRIC SENSOR, INFORMATION RECORDING SYSTEM, AND INFORMATION RECORDING METHOD

[75] Inventors: Shinichi Sakano; Daigo Aoki; Minoru Utsumi; Masanori Akada; Osamu Shimizu, all of Tokyo, Japan

[73] Assignee: Dai Nippon Printing Co., Ltd., Tokyo, Japan

[*] Notice: The term of this patent shall not extend beyond the expiration date of Pat. No. 5,488,601.

[21] Appl. No.: 543,135

[22] Filed: Oct. 13, 1995

Related U.S. Application Data

[63] Continuation of Ser. No. 141,110, Oct. 26, 1993, Pat. No. 5,488,601.

[30] Foreign Application Priority Data

| Oct. 26, 1992 | [JP] | Japan | 4-287983 |
| Jan. 27, 1993 | [JP] | Japan | 5-011721 |
| Apr. 28, 1993 | [JP] | Japan | 5-102244 |
| Jul. 14, 1993 | [JP] | Japan | 5-173988 |

[51] Int. Cl.$^6$ .................................................. G11B 7/00
[52] U.S. Cl. .................. 369/120; 365/112; 430/37; 430/56; 430/57; 430/60; 399/159
[58] Field of Search .................... 369/120, 112; 359/72, 79, 87, 103; 365/112; 355/210, 211, 217; 430/48, 59, 55, 58, 65, 78, 37, 56, 57, 54, 60

[56] References Cited

U.S. PATENT DOCUMENTS

| 3,824,099 | 7/1974 | Champ et al. | |
| 3,887,366 | 6/1975 | Champ et al. | 430/31 |
| 3,898,084 | 8/1975 | Champ et al. | 430/31 |

(List continued on next page.)

FOREIGN PATENT DOCUMENTS

| 47-037543 | 12/1972 | Japan . |
| 47-037544 | 12/1972 | Japan . |
| 48-043942 | 6/1973 | Japan . |

(List continued on next page.)

OTHER PUBLICATIONS

M. Hiramoto et al.: Photocurrent Multiplication in Amorphous Silicon Carbide Films; Appl. Phys. Lett.; 59 (16), 1992 (1991).

M. Hiramoto et al.: Photocurrent Multiplication in Amorphous Silicon Carbide Films; J. Imag. Sci. Technol.; 37(2), 192 (1993).

(List continued on next page.)

Primary Examiner—Georgia Y. Epps
Assistant Examiner—Kim-Kwok Chu
Attorney, Agent, or Firm—Morgan & Finnegan, L.L.P.

[57] ABSTRACT

An information recording system including a photoelectric sensor having a semiconductive, photoconductive layer stacked on an electrode, and an information recording medium having an information recording layer stacked on an electrode so that information can be recorded on the information recording layer by an electric field or electric charge. The photoelectric sensor and the information recording medium are disposed to face each other, and information exposure is carried out with a voltage being applied between the two electrodes, thereby enabling information to be recorded on the information recording medium. The photoconductive layer of the photoelectric sensor is capable of amplifying an electric field or electric charge given to the information recording medium, so that the intensity of electric field or the amount of electric charge given to the information recording medium can be increased to a level higher than the light energy actually applied. Accordingly, information recording of high sensitivity can be performed even if information exposure is carried out with a relatively small light energy.

4 Claims, 20 Drawing Sheets

U.S. PATENT DOCUMENTS

| | | | |
|---|---|---|---|
| 3,958,207 | 5/1976 | Tutihasi | 338/15 |
| 4,423,129 | 12/1983 | Takasu et al. | 430/59 |
| 4,474,865 | 10/1984 | Ong et al. | 430/58 |
| 4,628,017 | 12/1986 | Tagoku | 430/48 |
| 4,632,893 | 12/1986 | Rochat et al. | 430/58 |
| 4,751,163 | 6/1988 | Hagiwara et al. | 430/59 |
| 4,842,970 | 6/1989 | Tai et al. | 430/58 |
| 4,859,556 | 8/1989 | Sasaki | 430/73 |
| 4,873,164 | 10/1989 | Ono et al. | 430/58 |
| 4,886,846 | 12/1989 | Shimada et al. | 430/59 |
| 4,910,110 | 3/1990 | Kuroda et al. | 430/59 |
| 4,916,039 | 4/1990 | Hashimoto et al. | 430/57 |
| 4,925,759 | 5/1990 | Hanatani et al. | 430/59 |
| 4,939,055 | 7/1990 | Ueda | 430/59 |
| 5,041,665 | 8/1991 | Akasaki et al. | 564/307 |
| 5,169,987 | 12/1992 | Akasaki et al. | 564/307 |
| 5,213,922 | 5/1993 | Matsuo | 430/48 |
| 5,298,947 | 3/1994 | Aono | 355/211 |
| 5,308,724 | 5/1994 | Takanushi | 430/48 |
| 5,424,156 | 6/1995 | Aoki | 430/59 |
| 5,488,601 | 1/1996 | Sakano et al. | 369/120 |

FOREIGN PATENT DOCUMENTS

| | | |
|---|---|---|
| 49-105536 | 10/1974 | Japan . |
| 56-120649 | 9/1981 | Japan . |
| 57-101844 | 6/1982 | Japan . |
| 58-182640 | 10/1983 | Japan . |
| 58-198043 | 11/1983 | Japan . |
| 59-195660 | 11/1984 | Japan . |
| 60-069657 | 4/1985 | Japan . |
| 61-162555 | 7/1986 | Japan . |
| 62-002267 | 1/1987 | Japan . |
| 62-287257 | 12/1987 | Japan . |
| 64-019356 | 1/1989 | Japan . |
| 64-022969 | 1/1989 | Japan . |
| 64-028650 | 1/1989 | Japan . |
| 64-028652 | 1/1989 | Japan . |
| 64-029848 | 1/1989 | Japan . |
| 64-057263 | 3/1989 | Japan . |
| 64-068761 | 3/1989 | Japan . |
| 64-021459 | 4/1989 | Japan . |
| 64-105956 | 4/1989 | Japan . |
| 01106864 | 4/1989 | Japan . |
| 64-025748 | 5/1989 | Japan . |
| 01131215 | 5/1989 | Japan . |
| 01142643 | 6/1989 | Japan . |
| 01142654 | 6/1989 | Japan . |
| 01142655 | 6/1989 | Japan . |
| 01146843 | 6/1989 | Japan . |
| 01146844 | 6/1989 | Japan . |
| 01146845 | 6/1989 | Japan . |
| 01146846 | 6/1989 | Japan . |
| 01146847 | 6/1989 | Japan . |
| 01155357 | 6/1989 | Japan . |
| 01155358 | 6/1989 | Japan . |
| 01161245 | 6/1989 | Japan . |
| 01164954 | 6/1989 | Japan . |
| 01164952 | 6/1989 | Japan . |
| 01180553 | 7/1989 | Japan . |
| 01198761 | 8/1989 | Japan . |
| 64-038753 | 8/1989 | Japan . |
| 01198762 | 8/1989 | Japan . |
| 01198763 | 8/1989 | Japan . |
| 01200361 | 8/1989 | Japan . |
| 01200362 | 8/1989 | Japan . |
| 01201668 | 8/1989 | Japan . |
| 01201670 | 8/1989 | Japan . |
| 01230055 | 9/1989 | Japan . |
| 01255861 | 10/1989 | Japan . |
| 01290366 | 11/1989 | Japan . |
| 02061644 | 3/1990 | Japan . |
| 2-244157 | 9/1990 | Japan . |
| 2-245762 | 10/1990 | Japan . |
| 2-245766 | 10/1990 | Japan . |
| 03007942 | 2/1991 | Japan . |
| 3246560 | 11/1991 | Japan . |
| 04070842 | 3/1992 | Japan . |
| 04046347 | 7/1992 | Japan . |
| 04066022 | 10/1992 | Japan . |
| 05107775 | 4/1993 | Japan . |
| 05107776 | 4/1993 | Japan . |
| 05107777 | 4/1993 | Japan . |
| 05270140 | 10/1993 | Japan . |
| 06130347 | 5/1994 | Japan . |

OTHER PUBLICATIONS

M. Hiramoto et al.: Photocurrent Multiplication Phenomenon in Organic Pigment Film; The Extended Abstract of the 53rd Autumn Meeting of the Japan Society of Applied Physics; 1043 (1992).

M. Hiramoto et al.: Photocurrent Multiplication in Organic Pigment Films; Final Program and the Proceedings of the 9th International Congress on Advances in Non–Impact Printing Technologies; Japan Hardcopy '93; 671 (1993).

T. Yajima et al.: Mechanism of Photocurrent Multiplication in Organic/Inorganic Layered Photoreceptors Consisting of a–SiC:H; The Proceedings of the Annual Conference of Japan Hardcopy '92 for the Society of Electrophotography of Japan; 211 (1992).

A. Fujii et al.: Plastic Devices Using Memory–Type Organic Photoconductor; The Extended Abstract of the 39th Spring Meeting of the Japan Society of Applied Physics and related Societies; 1064 (1992).

PHOTOELECTRIC SENSOR, INFORMATION RECORDING SYSTEM, AND INFORMATION RECORDING METHOD

This is a continuation of application Ser. No. 08/141,110, filed Oct. 26, 1993, now U.S. Pat. No. 5,488,601 issued on Jan. 30, 1996.

BACKGROUND OF THE INVENTION

The present invention relates to a photoelectric sensor capable of recording light information on an information recording medium in the form of visible information or electrostatic information. The present invention also relates to an information recording system including the photoelectric sensor and an information recording medium, and to an information recording method and an information recording and reproducing method, which employ the information recording system. More particularly, the present invention relates to an information recording system including a photoelectric sensor having a semiconductive, photoconductive layer that markedly amplifies the information recording performance with respect to an information recording medium, and also relates to an information recording method and an information recording and reproducing method, which employ the information recording system.

There has heretofore been an information recording and reproducing method in which a photoelectric sensor having a photoconductive layer provided with an electrode on the front side thereof is disposed to face, on an optical axis, an information recording medium having an electric charge retaining layer provided with an electrode on the rear side thereof, and exposure is carried out with a voltage being applied between the two electrodes, thereby enabling electrostatic charge corresponding to the incident optical image to be recorded on the electric charge retaining layer, and then the recorded electrostatic information is reproduced by toner development or electric potential reading method, as described, for example, in Japanese Patent Application Laid-Open (KOKAI) Nos. 01-290366 and 01-289975. There is another conventional information recording and reproducing method in which the electric charge retaining layer in the above-described method is replaced by a thermoplastic resin layer, and after electrostatic charge has been recorded on the surface of the thermoplastic resin layer, heating is carried out to form a frost image on the surface of the thermoplastic resin layer, thereby making the recorded electrostatic charge visible, as described, for example, in Japanese Patent Application Laid-Open (KOKAI) No. 03-192288.

The present applicants have developed an information recording and reproducing method in which the information recording layer of the above-described information recording medium is a polymer dispersed liquid crystal layer, and in which exposure is carried out under voltage application in the same way as the above, and the molecules in the liquid crystal layer are aligned by an electric field formed by a photoelectric sensor, thereby effecting information recording, and the recorded information is reproduced as visible information by transmitted or reflected light. With regard to the information recording and reproducing method, we have filed applications as Japanese Patent Application Nos. 04-3394 and 04-24722. This method enables the recorded information to be made visible without using a polarized light plate.

Under these circumstances, there has been a demand for an information recording method which enables information recording of higher sensitivity and higher resolution.

It is an object of the present invention to provide a photoelectric sensor used to form information on an information recording medium, which has superior information forming power and improved information recording sensitivity, and to provide an information recording system including the photoelectric sensor, and an information recording method and an information recording and reproducing method, which employ the information recording system.

SUMMARY OF THE INVENTION

The present invention provides a photoelectric sensor having a photoconductive layer on an electrode and used to form information on an information recording medium, the photoelectric sensor being semiconductive and having such a function that when information exposure is carried out with a voltage being applied between the electrode of the photoelectric sensor and an electrode of the information recording medium, information can be recorded on the information recording medium with an electric current amplified to a level higher than the intensity of a photoelectric current induced by the information exposure, and that even after termination of the information exposure, when the voltage is continuously applied, the photoelectric sensor sustains electrical conductivity and continuously effects information recording to the information recording medium.

In addition, the present invention provides a photoelectric sensor having a photoconductive layer on an electrode and used to form information on an information recording medium having an information recording layer stacked on an electrode so that information can be formed on the information recording layer by an electric field or electric charge given thereto from the photoelectric sensor disposed to face the information recording medium, the photoelectric sensor being semiconductive and having such a function that when information exposure is carried out with a voltage being applied between the electrode of the photoelectric sensor and the electrode of the information recording medium, the electric field or electric charge given to the information recording medium is amplified, and that even after termination of the information exposure, when the voltage is continuously applied, the photoelectric sensor sustains electrical conductivity and continuously gives the electric field or electric charge to the information recording medium.

The photoconductive layer may have a double-layered structure including a charge generation layer and a charge transport layer.

The charge generation layer may be composed of a charge generating substance and a resin binder.

The charge generating substance may be a fluorenone-azo pigment.

The charge generating substance may be a bis-azo pigment represented by the following chemical structural formula:

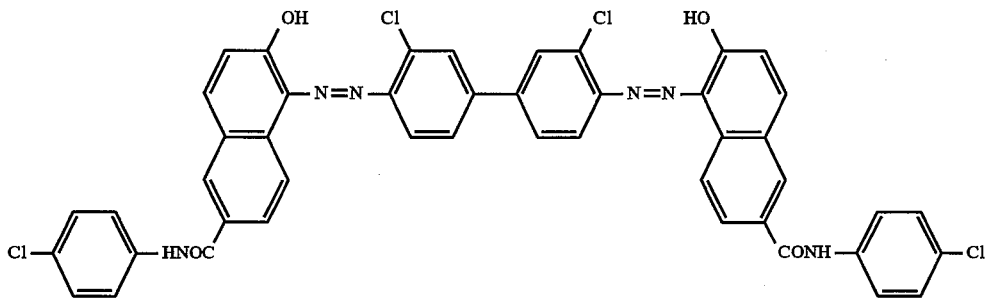

Preferably, the resin binder in the charge generation layer is at least one selected from among a polyester resin, a vinyl chloride-vinyl acetate copolymer resin, a vinyl acetate resin, a polyvinyl butyral resin, a polyvinyl acetal resin, and a polyvinyl formal resin.

The charge transport layer may be composed of a charge transport substance and a resin binder.

The charge transport substance may be para-dimethyl stilbene.

The charge transport substance may be a butadiene derivative having the following structure:

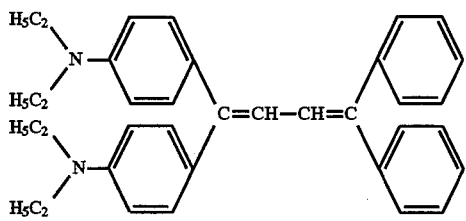

Preferably, the resin binder in the charge transport layer is at least one selected from among a polystyrene resin, a styrene derivative resin, a styrene-butadiene copolymer resin, a polycarbonate resin, a polyarylate resin, and a phenoxy resin.

The electrodes preferably have a conductivity of not higher than $10^6$ ohm-cm in terms of resistivity.

Preferably, the photoelectric sensor is obtained by aging it in dark at a relative humidity of not higher than 60%.

Preferably, when an electric field having an intensity of $10^5$ V/cm to $10^6$ V/cm is applied to the photoelectric sensor during the voltage application, the passing current density at the unexposed portion is $10^{-4}$ A/cm$^2$ to $10^{-7}$ A/cm$^2$.

Preferably, when exposure is carried out under voltage application, the electrical conductivity of the exposed portion increases more than that of the unexposed portion, and even after termination of the exposure, the conductivity of the exposed portion is held higher than that of the unexposed portion as long as the voltage application is continued, and after termination of the voltage application, the conductivity of the exposed portion promptly lowers to become equal to the conductivity of the unexposed portion, thereby enabling the photoelectric sensor to be reused repeatedly and promptly.

Preferably, the absolute value of acceptance potential of the photoelectric sensor when charged positively or negatively by DC corona charging is smaller than 200 V.

Preferably, when a thermally stimulated current is measured, clear peak is observed in the range of 40° C. to 150° C.

In addition, the present invention provides an information recording system for recording light information on an information recording medium by information exposure, the system comprising the above-described photoelectric sensor and the information recording medium having an information recording layer formed on an electrode, the photoelectric sensor and the information recording medium being disposed on an optical axis to face each other across a gap and connected to each other so that a voltage can be applied between the electrode of the photoelectric sensor and the electrode of the information recording medium.

The information recording layer may comprise a liquid crystal phase and a resin phase.

The information recording layer may be composed of an ultraviolet curing resin, a liquid crystal, and a surface-active agent.

The liquid crystal may be a mixture of a smectic liquid crystal and a nematic liquid crystal.

Preferably, the resin phase constituting the information recording layer is formed of an ultraviolet curing resin, and the surface layer of the information recording layer is formed from a skin layer made of only the ultraviolet curing resin.

The information recording layer may be made of a thermoplastic resin and heated after electric charge corresponding to information exposure has been given to a surface thereof, thereby forming a frost image corresponding to the information exposure on the surface of the information recording layer.

The information recording layer may be a mixture of a β-pinene polymer and an α-methylstyrene polymer.

The information recording layer may be an electric charge retaining layer, so that electric charge corresponding to information exposure is given to and formed on a surface of the information recording layer, or the electric charge formed on the surface of the information recording layer is developed with a toner.

The information recording layer may have memory properties.

Preferably, when an electric field having an intensity of $10^5$ V/cm to $10^6$ V/cm is applied to the photoelectric sensor, the passing current density at the unexposed portion is $10^{-4}$ A/cm$^2$ to $10^{-7}$ A/cm$^2$, and the resistivity of the information recording medium is $10^{10}$ ohm-cm to $10^{13}$ ohm-cm.

The photoelectric sensor and the information recording medium may be stacked to face each other across an air layer formed by a spacer of an insulating film having a thickness of 3 μm to 30 μm.

In addition, the present invention provides an information recording system having a photoconductive layer, a dielectric layer, an information recording layer, and an upper electrode, which are successively stacked on a lower electrode in the mentioned order, wherein a photoelectric sensor part including the lower electrode and the photoconductive layer comprises the above-described photoelectric sensor, and the lower and upper electrodes are connected together so that a voltage can be applied therebetween.

Preferably, the dielectric layer is made of polyparaxylylene.

In addition, the present invention provides an information recording and reproducing method wherein light information is recorded on an information recording medium by information exposure, the method comprising: using the above-described photoelectric sensor and the information recording medium having an information recording layer formed on an electrode, at least one of the electrodes of the photoelectric sensor and the information recording medium being transparent; disposing the photoelectric sensor and the information recording medium on an optical axis to face each other across a gap; carrying out light information exposure while applying a voltage between the two electrodes, thereby recording light information on the information recording medium; and reproducing the light information recorded on the information recording medium as visible information by transmitted or reflected light.

The information recording layer of the information recording medium may comprise a liquid crystal phase and a resin phase.

The information recording layer of the information recording medium may be composed of an ultraviolet curing resin, a liquid crystal, and a surface-active agent.

The liquid crystal may be a mixture of a smectic liquid crystal and a nematic liquid crystal.

Preferably, the resin phase constituting the information recording layer is formed of an ultraviolet curing resin, and the surface layer of the information recording layer is formed from a skin layer made of only the ultraviolet curing resin.

In addition, the present invention provides an information recording and reproducing method wherein light information is recorded on an information recording medium by information exposure, the method comprising: using the above-described photoelectric sensor and the information recording medium having an information recording layer of a thermoplastic resin formed on an electrode; carrying out light information exposure; heating the information recording layer after electric charge has been given to a surface thereof by the light information exposure, thereby forming a frost image corresponding to the information exposure on the surface of the information recording layer; and reproducing the light information recorded on the information recording medium as visible information by transmitted or reflected light.

The information recording layer may be a mixture of a β-pinene polymer and an α-methylstyrene polymer.

In addition, the present invention provides an information recording and reproducing method wherein light information is recorded on an information recording medium by information exposure, the method comprising: using the above-described photoelectric sensor and the information recording medium having as an information recording layer an electric charge retaining layer formed on an electrode; carrying out light information exposure to give electric charge to the information recording layer, thereby recording light information on the information recording medium; and reading and reproducing the recorded light information with an electric potential sensor.

In addition, the present invention provides an information recording and reproducing method wherein light information is recorded on an information recording medium by information exposure, the method comprising: using the above-described photoelectric sensor and the information recording medium having as an information recording layer an electric charge retaining layer formed on an electrode; carrying out light information exposure to give electric charge to the information recording layer, thereby recording light information on the information recording medium; developing the recorded light information with a toner; and reproducing the recorded light information as visible information by transmitted or reflected light.

In addition, the present invention provides an information recording and reproducing method wherein light information is recorded on an information recording medium by information exposure, the method comprising: using the information recording medium having a photoconductive layer, a dielectric layer, an information recording layer, and an upper electrode, which are successively stacked on a lower electrode in the mentioned order, in which a photoelectric sensor part including the lower electrode and the photoconductive layer comprises the above-described photoelectric sensor, at least one of the upper and lower electrodes being transparent; carrying out light information exposure while applying a voltage between the upper and lower electrodes, thereby recording light information on the information recording medium; and reproducing the light information recorded on the information recording medium as visible information by transmitted or reflected light.

The dielectric layer is preferably made of polyparaxylylene.

The recorded light information may be read with a scanner having a CCD sensor and output as an image by a sublimation transfer printer.

Preferably, the voltage applied between the respective electrodes of the photoelectric sensor and the information recording medium is a DC voltage of 500 V to 1,000, and the voltage application time is in the range of 0.01 sec. to 0.1 sec., and projection exposure is carried out from the photoelectric sensor side for ½ sec. to ¹/₂₀₀ sec. by using an imaging camera.

In addition, the present invention provides an information recording method wherein light information is recorded on an information recording medium by information exposure, the method comprising: using the above-described information recording system; applying a voltage between the two electrodes and, at the time same, carrying out information exposure; and terminating the voltage application at the same time as the information exposure terminates.

In addition, the present invention provides an information recording method wherein light information is recorded on an information recording medium by information exposure, the method comprising: using the above-described information recording system; applying a voltage between the two electrodes and, at the same time, carrying out information exposure; and continuing the voltage application even after the information exposure has terminated.

In addition, the present invention provides an information recording method wherein light information is recorded on an information recording medium by information exposure, the method comprising: using the above-described information recording system; carrying out information exposure after initiation of application of a voltage between the two electrodes; and terminating the voltage application at the same time as the information exposure terminates.

In addition, the present invention provides an information recording method wherein light information is recorded on an information recording medium by information exposure, the method comprising: using the above-described information recording system; carrying out information exposure after initiation of application of a voltage between the two electrodes; and continuing the voltage application even after the information exposure has terminated.

Preferably, the voltage applied between the respective electrodes of the photoelectric sensor and the information recording medium is a DC voltage of 500 V to 1,000 V, and the voltage application time is in the range of 0.01 sec. to 0.1 sec., and projection exposure is carried out from the photoelectric sensor side for ½ sec. to ¹/₂₀₀ sec. by using an imaging camera.

In addition, the present invention provides a photoelectric sensor having a photoconductive layer on an electrode and used to form information on an information recording medium, the photoelectric sensor having such a function that when information exposure is carried out with a voltage being applied between the electrode of the photoelectric sensor and an electrode of the information recording medium after uniform exposure has been carried out over the whole surface of the photoelectric sensor, information can be recorded on the information recording medium with an electric current amplified to a level higher than the intensity of a photoelectric current induced by the information exposure, and that even after termination of the information exposure, when the voltage is continuously applied, the photoelectric sensor sustains electrical conductivity and continuously effects information recording to the information recording medium.

Preferably, the electrodes have a conductivity of not higher than $10^6$ ohm-cm in terms of resistivity.

The photoconductive layer may contain poly-N-vinylcarbazole and a dye admixture.

Preferably, the dye admixture contained in the photoconductive layer is a compound as shown below:

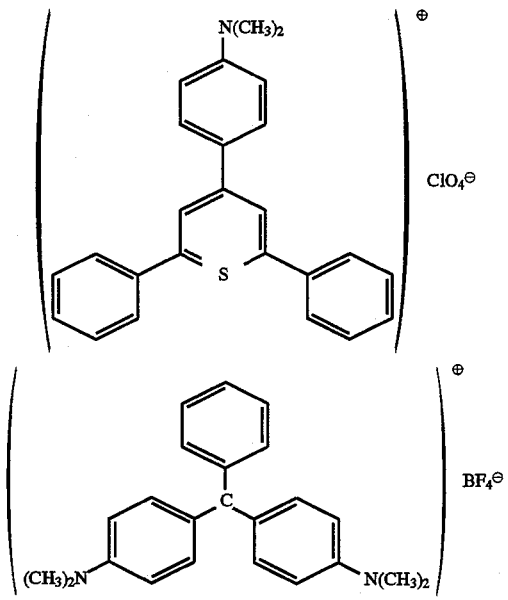

-continued

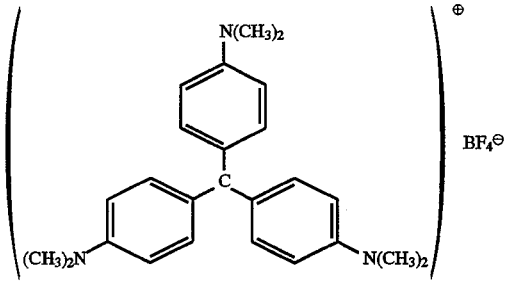

Preferably, when an electric field having an intensity of $10^5$ V/cm to $10^6$ V/cm is applied to the photoelectric sensor during the voltage application after uniform exposure has been carried out over the whole surface of the photoelectric sensor, the passing current density at the unexposed portion is $10^{-4}$ A/cm$^2$ to $10^{-7}$ A/cm$^2$.

Preferably, the absolute value of acceptance potential of the photoelectric sensor when charged positively or negatively by DC corona charging after uniform exposure has been carried out over the whole surface thereof is smaller than 200 V.

Preferably, when a thermally stimulated current is measured after uniform exposure has been carried out over the whole surface of the photoelectric sensor, clear peak is observed in the range of 40° C. to 150° C.

The uniform exposure is preferably carried out under conditions of a relative humidity of not higher than 60% and an illuminance of 200 lux.

In addition, the present invention provides an information recording system for recording light information on an information recording medium by information exposure, the system comprising the above-described photoelectric sensor, which has already been subjected to uniform exposure over the whole surface thereof, and the information recording medium having an information recording layer formed on an electrode, the photoelectric sensor and the information recording medium being disposed on an optical axis to face each other across a gap and connected to each other so that a voltage can be applied between the electrode of the photoelectric sensor and the electrode of the information recording medium.

The information recording layer of the information recording medium may comprise a liquid crystal phase and a resin phase.

The information recording layer of the information recording medium may be composed of an ultraviolet curing resin, a liquid crystal, and a surface-active agent.

The liquid crystal may be a mixture of a smectic liquid crystal and a nematic liquid crystal.

Preferably, the resin phase constituting the information recording layer is formed of an ultraviolet curing resin, and the surface layer of the information recording layer is formed from a skin layer made of only the ultraviolet curing resin.

Preferably, when an electric field having an intensity of $10^5$ V/cm to $10^6$ V/cm is applied to the photoelectric sensor, the passing current density at the unexposed portion is $10^{-4}$ A/cm$^2$ to $10^{-7}$ A/cm$^2$, and the resistivity of the information recording medium is $10^{10}$ ohm-cm to $10^{13}$ ohm-cm.

The information recording layer may be made of a thermoplastic resin and heated after electric charge corresponding to information exposure has been given to a surface thereof, thereby forming a frost image corresponding to the information exposure on the surface of the information recording layer.

The information recording layer may be a mixture of a β-pinene polymer and an α-methylstyrene polymer.

The information recording layer may be an electric charge retaining layer, so that electric charge corresponding to information exposure is given to and formed on a surface of the information recording layer, or the electric charge formed on the surface of the information recording layer is developed with a toner.

The information recording layer may have memory properties.

The photoelectric sensor, which manifests semiconductivity when subjected to uniform exposure, and the information recording medium may be stacked to face each other across an air layer formed by a spacer of an insulating film having a thickness of 3 µm to 30 µm.

In addition, the present invention provides an information recording system having a photoconductive layer, a dielectric layer, an information recording layer, and an upper electrode, which are successively stacked on a lower electrode in the mentioned order, wherein a photoelectric sensor part including the lower electrode and the photoconductive layer comprises the above-described photoelectric sensor, which manifests semiconductivity when subjected to uniform exposure, and the lower and upper electrodes are connected together so that a voltage can be applied therebetween.

The dielectric layer is preferably made of polyparaxylylene.

In addition, the present invention provides an information recording and reproducing method wherein light information is recorded on an information recording medium by information exposure, the method comprising: using the above-described photoelectric sensor, which manifests semiconductivity when subjected to uniform exposure, and the information recording medium having an information recording layer formed on an electrode, at least one of the electrodes of the photoelectric sensor and the information recording medium being transparent; disposing the photoelectric sensor and the information recording medium on an optical axis to face each other across a gap after uniform exposure has been carried out over the whole surface of the photoelectric sensor; carrying out light information exposure while applying a voltage between the two electrodes, thereby recording light information on the information recording medium; and reproducing the light information recorded on the information recording medium as visible information by transmitted or reflected light.

The information recording layer of the information recording medium may comprise a liquid crystal phase and a resin phase.

The information recording layer of the information recording medium may be composed of an ultraviolet curing resin, a liquid crystal, and a surface-active agent.

The liquid crystal may be a mixture of a smectic liquid crystal and a nematic liquid crystal.

Preferably, the resin phase constituting the information recording layer is formed of an ultraviolet curing resin, and the surface layer of the information recording layer is formed from a skin layer made of only the ultraviolet curing resin.

In addition, the present invention provides an information recording and reproducing method wherein light information is recorded on an information recording medium by information exposure, the method comprising: using the above-described photoelectric sensor, which manifests semiconductivity when subjected to uniform exposure, and the information recording medium having an information recording layer of a thermoplastic resin formed on an electrode; carrying out light information exposure after uniform exposure has been carried out over the whole surface of the photoelectric sensor; heating the information recording layer after electric charge has been given to a surface thereof by the light information exposure, thereby forming a frost image corresponding to the information exposure on the surface of the information recording layer; and reproducing the light information recorded on the information recording medium as visible information by transmitted or reflected light.

The information recording layer may be a mixture of a β-pinene polymer and an α-methylstyrene polymer.

In addition, the present invention provides an information recording and reproducing method wherein light information is recorded on an information recording medium by information exposure, the method comprising: using the above-described photoelectric sensor, which manifests semiconductivity when subjected to uniform exposure, and the information recording medium having as an information recording layer an electric charge retaining layer formed on an electrode; carrying out light information exposure after uniform exposure has been carried out over the whole surface of the photoelectric sensor to give electric charge to the information recording layer, thereby recording light information on the information recording medium; and reading and reproducing the recorded light information with an electric potential sensor.

In addition, the present invention provides an information recording and reproducing method wherein light information is recorded on an information recording medium by information exposure, the method comprising: using the above-described photoelectric sensor, which manifests semiconductivity when subjected to uniform exposure, and the information recording medium having as an information recording layer an electric charge retaining layer formed on an electrode; carrying out light information exposure after uniform exposure has been carried out over the whole surface of the photoelectric sensor to give electric charge to the information recording layer, thereby recording light information on the information recording medium; developing the recorded light information with a toner; and reproducing the recorded light information as visible information by transmitted or reflected light.

In addition, the present invention provides an information recording and reproducing method wherein light information is recorded on an information recording medium by information exposure, the method comprising: using the information recording medium having a photoconductive layer, a dielectric layer, an information recording layer, and an upper electrode, which are successively stacked on a lower electrode in the mentioned order, in which a photoelectric sensor part including the lower electrode and the photoconductive layer comprises the above-described photoelectric sensor, which manifests semiconductivity when subjected to uniform exposure, at least one of the upper and lower electrodes being transparent; carrying out light information exposure while applying a voltage between the upper and lower electrodes after uniform exposure has been carried out over the whole surface of the photoelectric sensor, thereby recording light information on the information recording medium; and reproducing the light information recorded on the information recording medium as visible information by transmitted or reflected light.

The dielectric layer is preferably made of polyparaxylylene.

The recorded light information may be read with a scanner having a CCD sensor and output as an image by a sublimation transfer printer.

In addition, the present invention provides an information recording method wherein light information is recorded on an information recording medium by information exposure, the method comprising: using the above-described information recording system; applying, after uniform exposure has been carried out over the whole surface of the photoelectric sensor, a voltage between the two electrodes and, at the same time, carrying out information exposure; and terminating the voltage application at the same time as the information exposure terminates.

In addition, the present invention provides an information recording method wherein light information is recorded on an information recording medium by information exposure, the method comprising: using the above-described information recording system; applying, after uniform exposure has been carried out over the whole surface of the photoelectric sensor, a voltage between the two electrodes and, at the same time, carrying out information exposure; and continuing the voltage application even after the information exposure has terminated.

In addition, the present invention provides an information recording method wherein light information is recorded on an information recording medium by information exposure, the method comprising: using the above-described information recording system; carrying out, after uniform exposure has been carried out over the whole surface of the photoelectric sensor, information exposure after initiation of application of a voltage between the two electrodes; and terminating the voltage application at the same time as the information exposure terminates.

In addition, the present invention provides an information recording method wherein light information is recorded on an information recording medium by information exposure, the method comprising: using the above-described information recording system; carrying out, after uniform exposure has been carried out over the whole surface of the photoelectric sensor, information exposure after initiation of application of a voltage between the two electrodes; and continuing the voltage application even after the information exposure has terminated.

Preferably, the voltage applied between the respective electrodes of the photoelectric sensor and the information recording medium is a DC voltage of 500 V to 1,000 V, and the voltage application time is in the range of 0.01 sec. to 0.1 sec., and projection exposure is carried out from the photoelectric sensor side for ½ sec. to 1/200 sec. by using an imaging camera.

DESCRIPTION OF THE PREFERRED EMBODIMENTS

The present invention will be described below in detail. The photoelectric sensor of the present invention, which is used in an information recording system, has a photoconductive layer stacked on an electrode. The photoconductive layer may have a single-layer structure or a double-layered structure including a charge generation layer and a charge transport layer, which are stacked one on top of another. The photoconductive layer generally functions such that when it is irradiated with light, photocarriers (electrons or holes) are generated in the irradiated portion and these carriers are movable across the width of the layer. The photoelectric sensor of the present invention is provided with semiconductivity by properly combining together a photoconductive layer and an electrode as described later, thereby enabling an electric field or electric charge, which is given to an information recording medium when the photoelectric sensor is irradiated with light, to be amplified with time during the light irradiation. In addition, even after the termination of the light irradiation, when the voltage is continuously applied, the photoelectric sensor sustains the increased conductivity and continuously gives the electric field or the electric charge to the information recording medium.

The photoelectric sensor of the present invention has persistent conductivity and amplifying function. A photosensitive material which has heretofore been known as a material having persistent conductivity is originally an insulator, and persistent conductivity is produced in the course of giving conductivity to the material by irradiation with light, for example. In contrast, the photoelectric sensor of the present invention has semiconductive properties from the beginning, and this is requirement for obtaining the function of the present invention. The function of the present invention cannot be obtained by an photosensitive material of insulating property.

Figure 5:
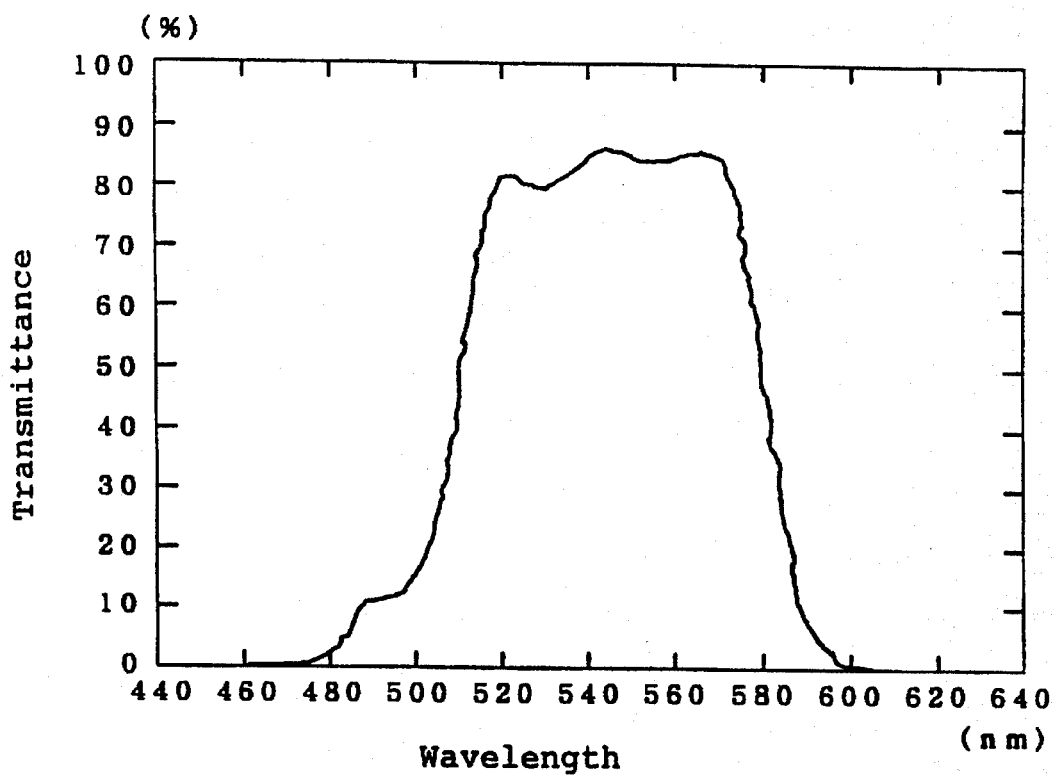
FIG. 5 is a graph showing spectral characteristics of a green filter in a measuring system used to explain the photocurrent amplifying function of the photoelectric sensor according to the present invention.

The photocurrent amplifying action taking place in the photoelectric sensor of the present invention will be explained below. A photoelectric sensor having an ITO electrode provided on a transparent glass substrate and a photoconductive layer stacked on the electrode is prepared as a photoelectric sensor for measuring the amplifying action, and a gold electrode of 0.16 cm$^2$ is stacked on the photoconductive layer. Then, a predetermined DC voltage is applied between the two electrodes with the ITO electrode used as a positive electrode. In addition, 0.5 sec. after the initiation of the voltage application, the photoelectric sensor is irradiated with light for 0.033 sec. from the substrate side. The behavior of the current flowing in the photoelectric sensor during the time of measurement is measured from the time (t=0) of initiation the light irradiation. It should be noted that as the light for irradiation, green light is selected from light emitted from a xenon lamp (L2274, manufactured by Hamamatsu Photonics K.K.) as a light source by using a green filter (manufactured by Vacuum Optics Co., of Japan), and the intensity of light is measured with an illuminometer (manufactured by Minolta Camera Co., Ltd.) to obtain green light having a luminous intensity of 20 lux. FIG. 5 shows the filter characteristics.

When the photoelectric sensor is irradiated with light having the above-described intensity, $4.2 \times 10^{11}$ photons/cm$^2$-sec. are incident on the photoconductive layer, considering the light transmittance of the transparent substrate and the ITO film and the spectral characteristics of the filter. If all the incident photons are converted into photocarriers, a photocurrent of $1.35 \times 10^{-6}$ A/cm$^2$ (per unit area) is generated in theory.

When measurement is carried out with the above-described measuring system, the ratio of the photo-induced current actually generated in the photosensitive sensor to the theoretical photocurrent (i.e., the value of photo-induced current actually generated in the photoelectric sensor/the value of theoretical photocurrent) is defined as the quantum efficiency of the photoelectric sensor. The term "photo-induced current" is employed herein to mean what is obtained by subtracting the value of base current, which is a current flowing through a portion irradiated with no light, from the value of current flowing through a portion irradiated with light. Therefore, the photo-induced current is not so-called photocurrent but a current which flows due to light irradiation in excess of the base current during the light irradiation or even after the light irradiation. The photocurrent amplifying action in the photoelectric sensor of the present invention is defined as the behavior of the photo-induced current.

Figure 6:
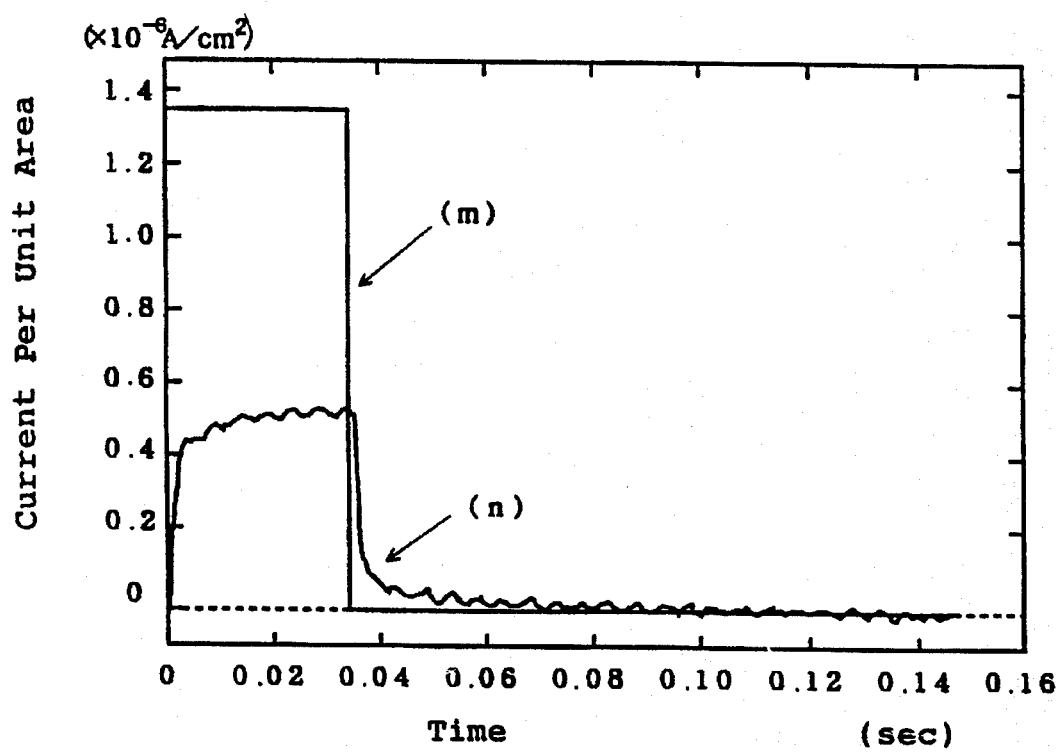
FIG. 6 is a graph showing the results of measurement of photocurrent amplifying action of a comparative sensor.
Figure 7:
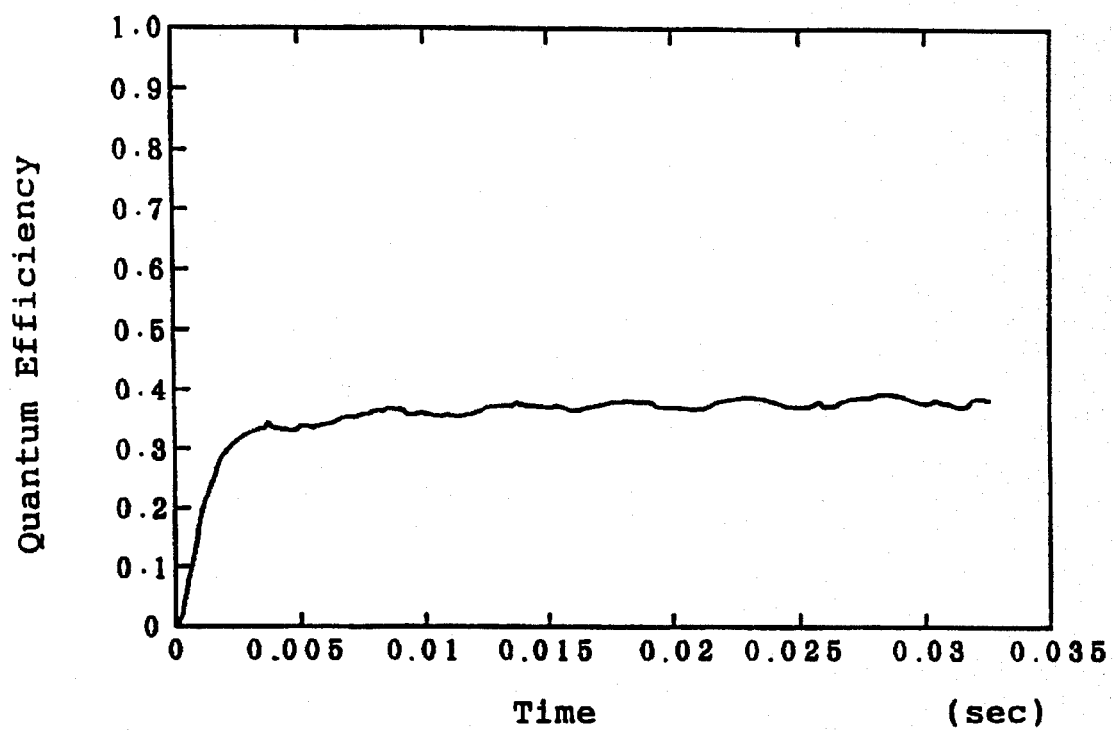
FIG. 7 is a graph showing the change of quantum efficiency of the comparative sensor during light irradiation.

The photoelectric sensor having the photocurrent amplifying function according to the present invention and a photoelectric sensor (hereinafter referred to as "comparative sensor") having no photocurrent amplifying function will be explained below by using the results of measurement carried out with the above-described measuring system. First, the results of measurement with regard to the comparative sensor are shown in FIG. 6. In FIG. 6, the line m is a reference line indicating the above-described theoretical value ($1.35 \times 10^{-6}$ A/cm$^2$). The line m shows a state wherein light irradiation is effected for 0.033 sec. and the voltage application is continued even after the termination of the light irradiation. The line n shows the current measured in the photoelectric sensor having no photocurrent amplifying function. It will be understood from the line n that the photocurrent does not increase but assumes a constant value even during the light irradiation, and the value does not exceed the theoretical value ($1.35 \times 10^{-6}$ A/cm$^2$). The quantum efficiency of the comparative sensor is almost constant at 0.4. FIG. 7 shows the change of the quantum efficiency during the light irradiation.

Figure 8:
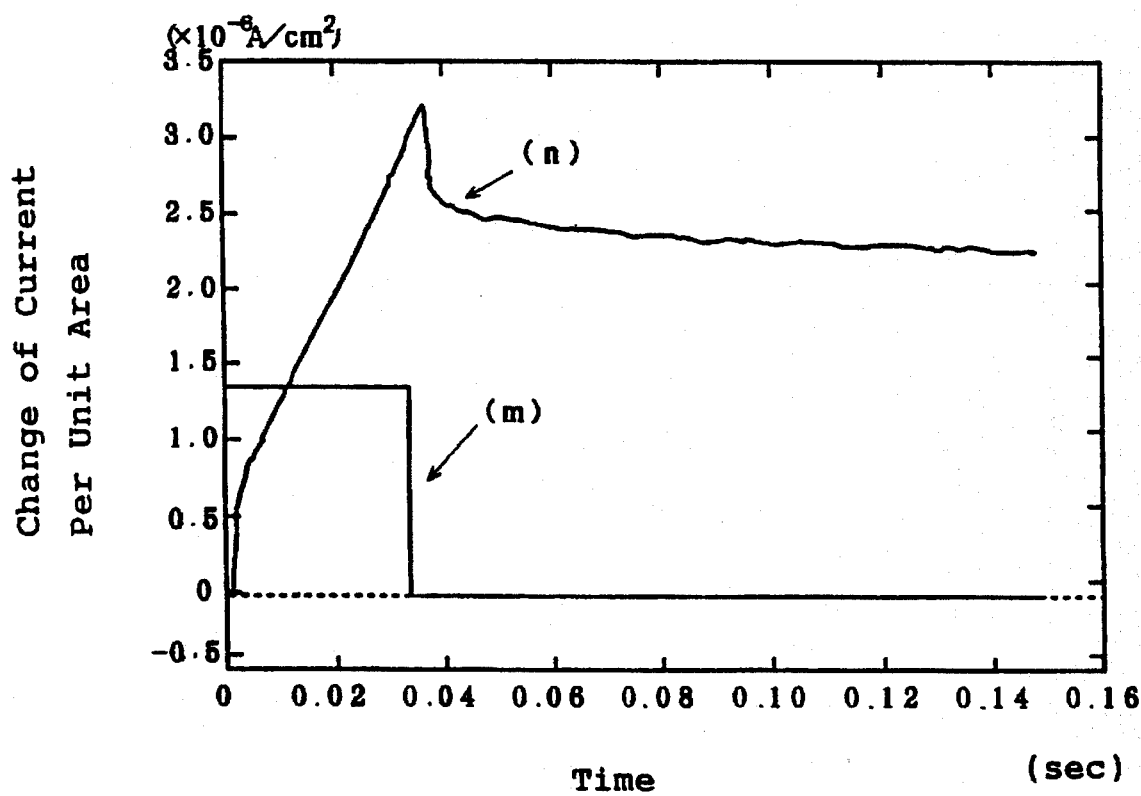
FIG. 8 is a graph showing the results of measurement of photocurrent amplifying action of the photoelectric sensor of the present invention.
Figure 9:
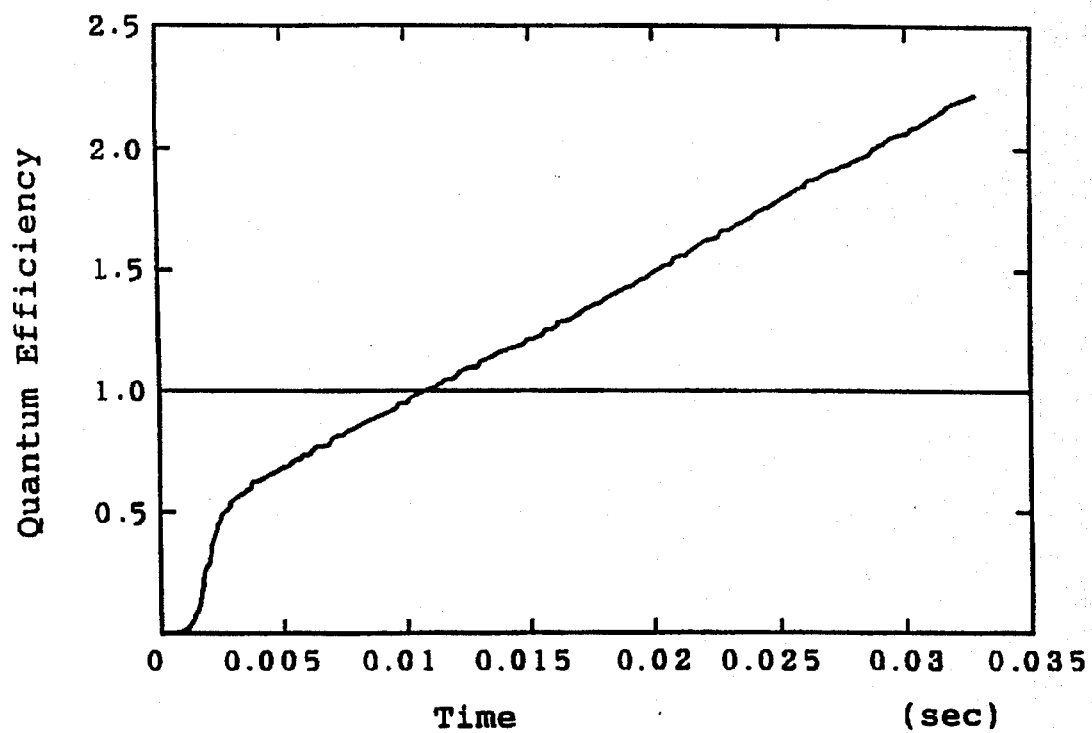
FIG. 9 is a graph showing the change of quantum efficiency of the photoelectric sensor according to the present invention during light irradiation.

In contrast, in the photoelectric sensor of the present invention the photocurrent increases during the light irradiation, as shown in FIG. 8, and as will be clear from FIG. 9, which shows the relationship between the quantum efficiency and time, the quantum efficiency exceeds 1 about 0.01 sec. after the initiation of the light irradiation, and it still continues increasing thereafter.

In the comparative sensor, the photocurrent becomes zero at the same time as the light irradiation terminates. Therefore, no current flows even when the voltage application is continued after the termination of the light irradiation. On the other hand, in the photoelectric sensor of the present invention, the photo-induced current continuously flows when the voltage application is continued even after the termination of the light irradiation. Thus, the photo-induced current can be continuously taken out.

Figure 10:
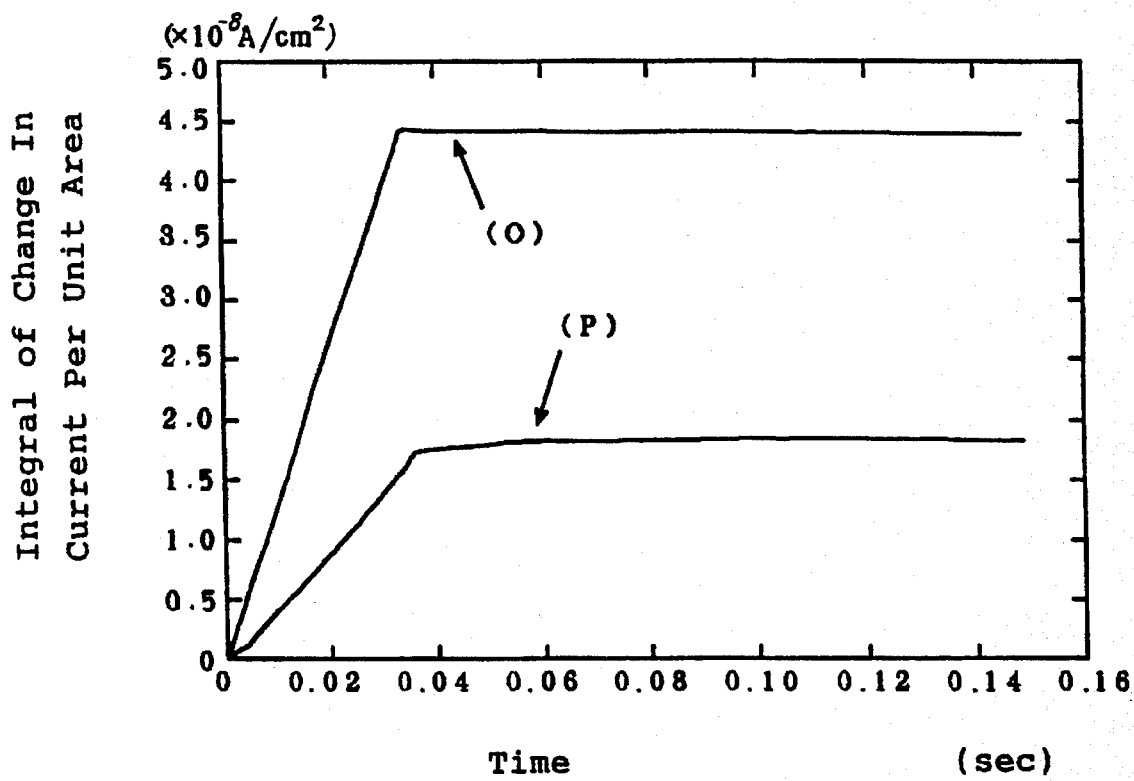
FIG. 10 is a graph showing the change with time of the integral of current density (electric charge density) in the comparative sensor.

FIG. 10 shows the change with time of the integral of current per unit area (i.e., the amount of electric charge per unit area) in the comparative sensor (theoretical value). In the graph of FIG. 10, the line O shows the change with time of the integral of current per unit area in the theoretical photoelectric sensor in which the quantum efficiency is 1, and the line P shows the change with time of the integral of current per unit area in the comparative sensor. The integral Q' of current in FIG. 10 is given by $$Q'=\int (J_{PHOTO}-J_{dark})dt(C/cm^2)$$

As will be clear from the graph, the comparative sensor has no increase in the integral after the termination of the light irradiation because $J_{PHOTO}-J_{dark}$ is zero.

Figure 11:
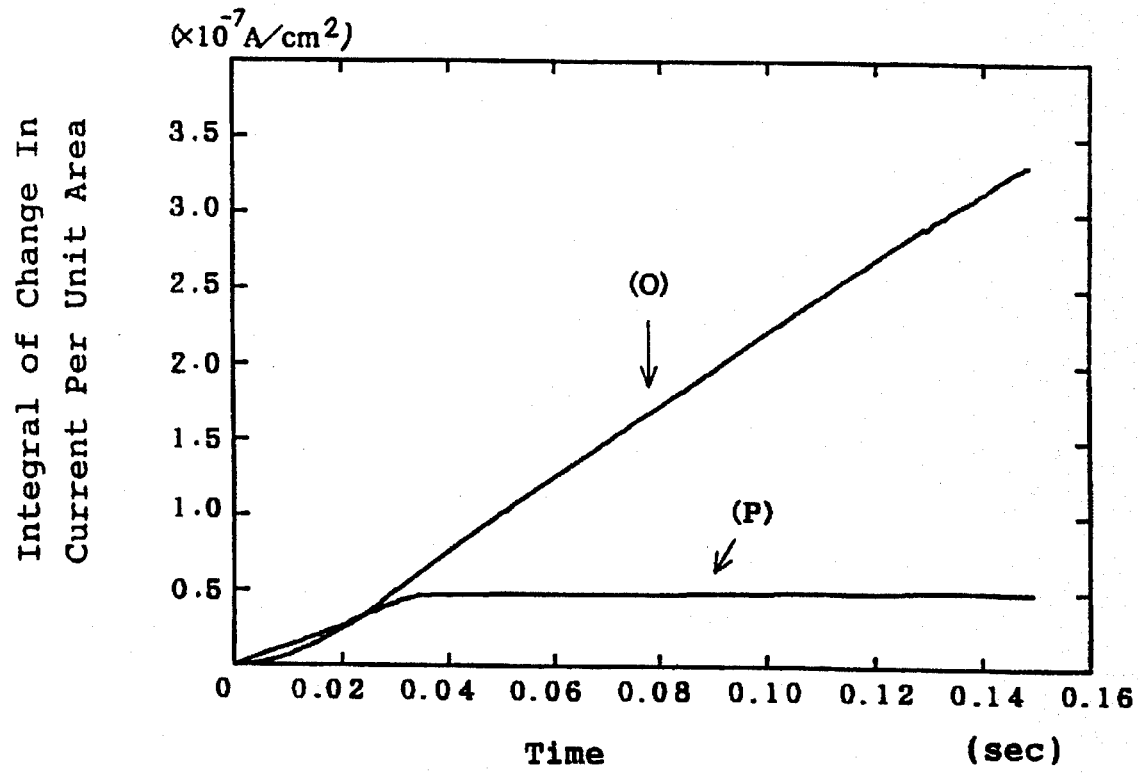
FIG. 11 is a graph showing the change with time of the integral of current density (electric charge density) in the photoelectric sensor of the present invention.

FIG. 11 similarly shows the change with time of the integral of current per unit area in the photoelectric sensor of the present invention. Similarly, the line O shows the change with time of the integral of current per unit area in the theoretical photoelectric sensor in which the quantum efficiency is 1, and the line P shows the change with time of the integral of current per unit area in the photoelectric sensor of the present invention. As will be clear from the graph, the photoelectric sensor of the present invention provides a great advantageous effect in contrast to the comparative sensor.

Although the reason for the above is not clear, it is considered that in the photoelectric sensor of the present invention all photocarriers generated as a result of the irradiation with information light do not move in the direction of the width of the photoconductive layer under the voltage application condition, but some photocarriers are trapped in trap sites present in the photoconductive layer or at the interface between the electrode and the photoconductive layer, and trapped carriers are accumulated with time, so that under the voltage application condition, a current induced by the trapped carriers flows in addition to the photocurrent generated by exposure, amplifying the apparent photocurrent. It is further surmised that when exposure is terminated with the voltage application condition maintained, photocarriers generated by the exposure immediately decay and disappear, but the decay of the trapped carriers is gentle, and hence the current induced by the trapped carriers flows in a sufficient amount although it decays. The induced current is the advantageous result obtained by amplification attributable to light in the photoelectric sensor of the present invention. Since a current larger than the amount of incident light flows by virtue of the amplifying action, it is possible to realize effective information recording to an information recording medium. The trapped carriers decay thereafter. Since the decay rate is sufficiently high in comparison to the interval of time at which a photoelectric sensor is repeatedly used in the information recording method of the present invention, the photoelectric sensor can be repeatedly used.

In a case where the photoelectric sensor is subjected to electrical measurement in a closed circuit, the following explanation may be made. In a thermal equilibrium condition after the production of the photoelectric sensor, stable space charge is formed in one or a plurality of regions in the photosensitive sensor, that is, the bulk layer of the photoconductive layer, the interface between the electrode and the charge generation layer, and the interface between the charge generation layer and the charge transport layer. In particular, if it is the minority carrier, when a forward electric field is given to the photoelectric sensor, a positive charge as the majority carrier is injected from the electrode, causing a base current to flow. However, the injected charge does not readily recombine with the space charge. In this state, if photocarriers are formed by exposure, the photocarriers also move in the direction of the electric field, causing a further increased current to flow. The photocarriers continue flowing through the closed circuit during the lifetime (t) determined by the material of the photoelectric sensor, producing such a condition that the number of carriers has apparently increased. It is considered that photocurrent amplification takes place in this way. Since the photoelectric sensor returns to the initial condition when the photocarriers disappear due to the lifetime, the photoelectric sensor can be repeatedly used. The lifetime of photocarriers in an ordinary organic photoconductive material is from 0.1 sec. to 1 sec. The photoelectric sensor returns to the initial condition in the course of the lifetime.

As a known example of the persistent conductivity in the electrophotographic process, R. M. Schaffert, "Electrophotography", translation supervised by Eiichi Inoue (Kyoritsu Shuppan), gives an explanation of persistent internal polarization and persistent conductivity. However, these phenomena are different from the phenomenon of generation of a photo-induced current by the amplifying action attributable to light in the photoelectric sensor of the present invention. In Schaffert's book, Kallman, Rennert and Calson's example is shown with regard to the persistent internal polarization, and the author explains that if a photoconductive insulating material is irradiated with light under the application of an electric field, positive and negative charges in the photoconductive insulating material are separated from each other, and as a result, carriers are trapped in the material, and they are fixed, or frozen, for a finite length of time, thereby forming an internal polarization electric field. A material that shows the above-described characteristics is sandwiched between electrodes, of which the electrode on the side from which image exposure is to be effected is a transparent electrode. In this state, exposure is carried out under the application of a voltage, thereby forming internal polarization in the shape of an image. Thereafter, the electrodes are grounded, and the upper electrode is separated, thereby forming a surface potential on the surface of the photoconductive insulating layer in the internal electrode unit. The latent image thus formed is made visible by development with a toner of opposite polarity. That is, a photoconductive material that has insulating properties is subjected to exposure carried out under voltage application to cause polarization and form a surface potential only in the exposed portion, and the difference in the surface potential, that is, the presence and absence of surface potential, on the surface of the photoconductive material is utilized for the desired purpose.

In contrast, the photoelectric sensor of the present invention does not utilize the persistent internal polarization in the insulating material for the persistent conductivity, but it employs an element that has semiconductive properties from the beginning to trap either of the two types of photocarrier and promote the injection of carriers of opposite polarity from the substrate electrode. This effect is further enhanced by exposure carried out under voltage application. Thus, an amplifying action is induced. The persistent conductivity in the photoelectric sensor of the present invention occurs as the amplifying action is induced. That is, the persistent conductivity in the present invention is the ability of the photoelectric sensor to sustain the amplified current for a finite length of time, i.e., during the exposure carried out under voltage application and under the voltage application condition after the exposure.

As another example of persistent conductivity, Schaffert shows Kallmann, Johnson, Nehr and Cassiers's example in his book and gives an explanation as follows. That is, the persistent conductivity is explained as a phenomenon in which shallow traps participate. A photoconductive material showing persistent conductivity must have a large number of shallow traps. During irradiation, electrons are absorbed, and they are freed by light energy and excited to the conduction band. Many of these electrons fall into shallow traps in the vicinity of the conduction band and stay there even after the suspension of the irradiation. If a strong electric field is applied to the material thereafter, all the electrons in the shallow traps become conduction electrons. It is also explained that the electrons in the shallow traps are released by heat energy and infrared radiation and contribute to conduction. Accordingly, the persistent conductivity described in Schaffert's book is a phenomenon in which trapped electrons formed by light irradiation exist for a finite length of time even after the termination of the irradiation and are relaxed during the finite length of time or by charging of opposite polarity, field phenomenon, etc.

Accordingly, there is basically a difference in the content between the persistent conductivity attributable to the release of the trapped electrons and the persistent conductivity obtained by the photocurrent amplifying action that is produced by the trapped charge as in the photoelectric sensor of the present invention.

The photoelectric sensor of the present invention is a semiconductive device whose resistivity in dark is preferably in the range of $10^9$ ohm-cm to $10^{13}$ ohm-cm from the viewpoint of the density of current flowing.

When the resistivity is in the range of $10^{10}$ ohm-cm to $10^{11}$ ohm-cm, a particularly remarkable amplifying action is obtained. A photoelectric sensor having a resistivity more than $10^{13}$ ohm-cm shows no amplifying action as occurs in the photoelectric sensor of the present invention in the field intensity range of $10^5$ V/cm to $10^6$ V/cm. In a photoelectric sensor having a resistivity less than $10^9$ ohm-cm, an exceedingly large current flows, so that noise is likely to occur due to the current. Therefore, such a photoelectric sensor is unfavorable.

On the other hand, photosensitive devices employed for general electrophotography have a dark resistivity in the range of $10^{14}$ ohm-cm to $10^{16}$ ohm-cm. Therefore, the photoelectric sensor of the present invention cannot attain the object of the present invention in electrophotography, whereas photoelectric sensors having a photoconductive layer with a relatively high dark resistivity for use in general electrophotography cannot be used for the purpose of the present invention.

The following relation holds between the resistivity $\rho$ (ohm-cm) and current density J (A/cm$^2$) of the photoelectric sensor:

$$\rho = (E \cdot d/J \cdot S) \times (S/d) = E/J$$

where d is the layer thickness of the photoelectric sensor, S is the electrode area, and
E is the applied field intensity (V/cm)

Therefore, the resistivity can be obtained from the applied field intensity and the current density. In Examples of the present invention, it is expressed by the current density.

Next, characteristics of the photoelectric sensor according to the present invention will be explained.

Figure 12:
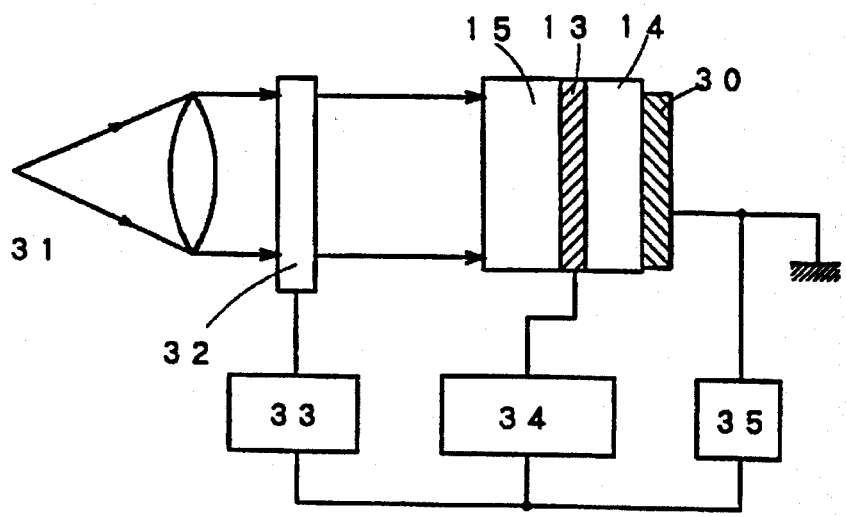
FIG. 12 illustrates a measuring circuit used to evaluate electrical characteristics of the photoelectric sensor according to the present invention.

To measure the electrical characteristics of the photoelectric sensor, a sample for measurement was prepared by depositing a gold electrode having a film thickness of 10 nm, a sheet resistivity of 1,000 ohm/sq. and a size of 0.16 cm$^2$ on the photoconductive layer of the photoelectric sensor, and a current measuring system as shown in FIG. 12 was constructed. In the figure, reference numeral 15 denotes a photoelectric sensor substrate, 13 a photoelectric sensor electrode, 14 a photoconductive layer including a charge generation layer and a charge transport layer, 30 a gold electrode, 31 a light source, 32 a shutter (No. 0 electromagnetic shutter, manufactured by Kopal Co., Ltd.), 33 a shutter driving mechanism, 34 a pulse generator (manufactured by Yokogawa Hewlett-Packard Co.), and 35 an oscilloscope.

In the current measuring system, a DC voltage of 300 V was applied between the photoelectric sensor electrode 13 as a positive electrode and the gold electrode 30 as a negative electrode, and at the same time, green light of 20 lux was applied from the glass substrate side for 1/30 sec. to effect exposure. The voltage application was continued for 0.15 sec., and the change of current with time during the voltage application was measured with the oscilloscope 35. In another experiment, no exposure was carried out, but the voltage application alone was performed, and the change of current with time was measured in the same way as the above.

Figure 13:
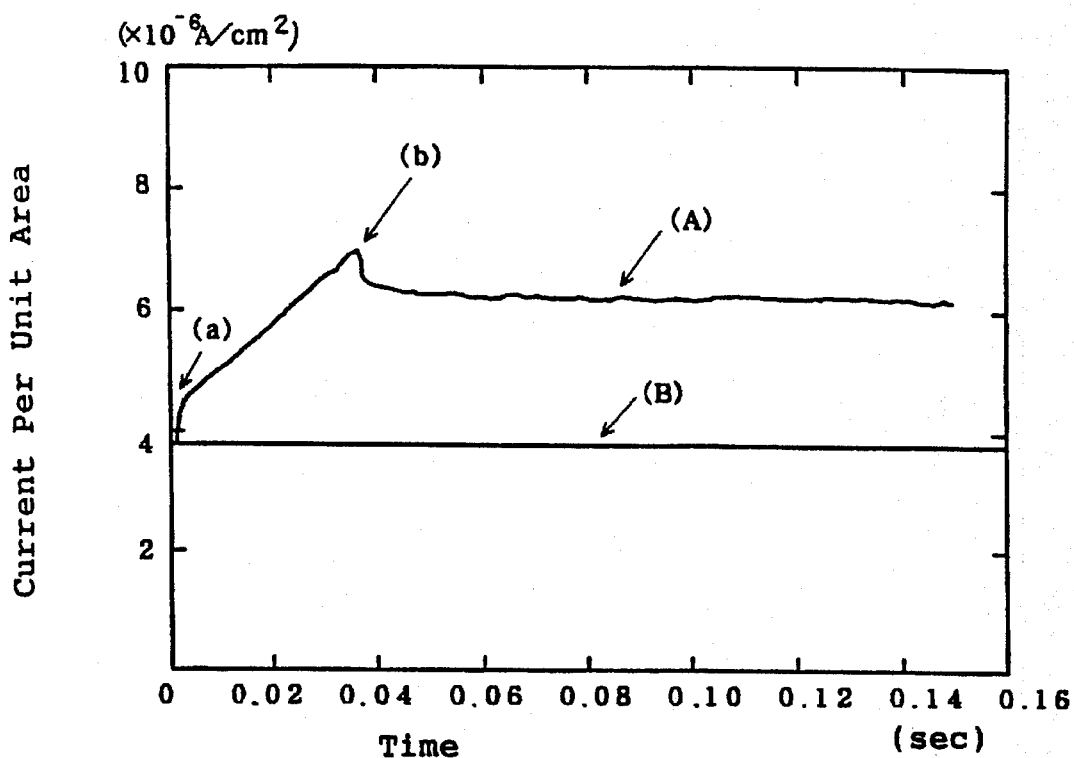
FIG. 13 is a graph showing electrical characteristics of one example of the photoelectric sensor according to the present invention.
Figure 14:
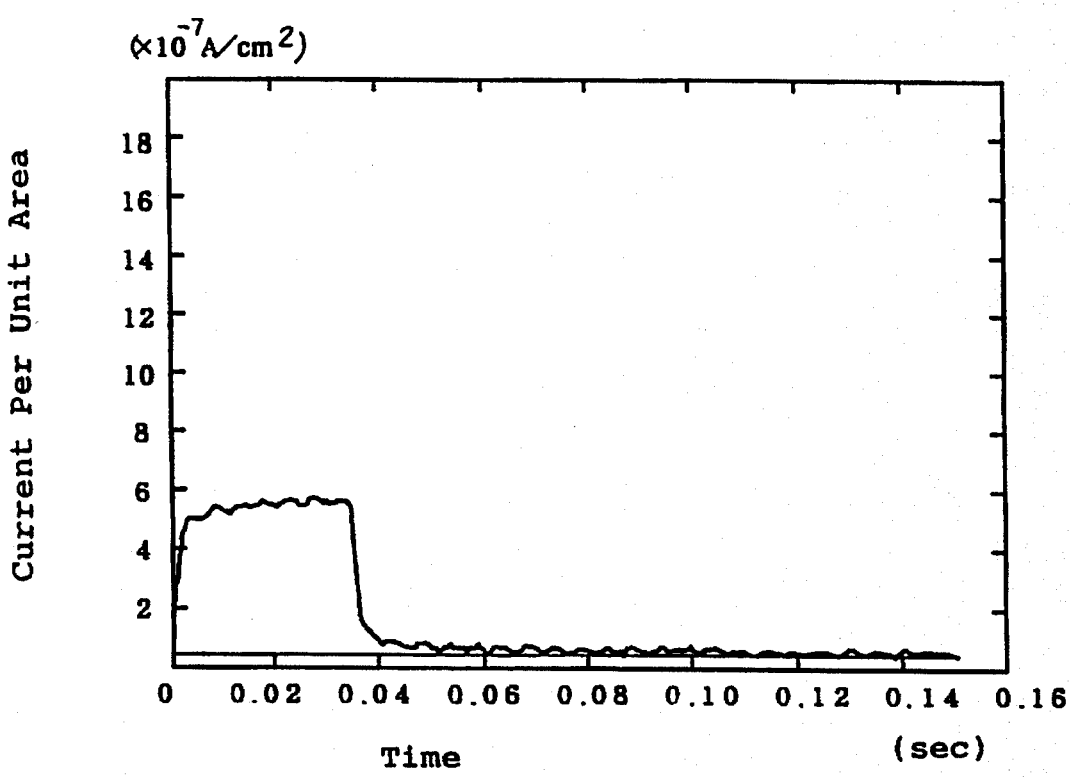
FIG. 14 is a graph showing electrical characteristics of a comparative sensor.

The results of the measurement are shown in FIGS. 13 and 14. In the graphs of these figures, the axis of abscissas represents the voltage application time (second), and the axis of ordinates represents the current density (A/cm$^2$). FIG. 13 shows the results of measurement for the photoelectric sensor of the present invention. FIG. 14 shows the results of measurement for the comparative sensor.

It will be understood from the comparison between the base currents in the two photoelectric sensors that the base current values largely differ from each other, and the photoelectric sensor of the present invention shows an amplifying action, whereas the comparative sensor shows no amplifying action, as has been described above. The amplifying action is particularly remarkable in the current density range where the base current value is $10^{-4}$ A/cm$^2$ to $10^{-7}$ A/cm$^2$.

A photoelectric sensor having a base current less than $10^{-7}$ A/cm$^2$ shows no amplifying action as occurs in the photoelectric sensor of the present invention in the field intensity range of $10^5$ V/cm to $10^6$ V/cm. On the other hand, if a field intensity of $10^6$ V/cm or more is applied in order to increase the base current value to $10^{-7}$ A/cm$^2$ or more, electric discharge breakdown or generation of image noise occurs. Therefore, the photoelectric sensor cannot be used at an excessively high field intensity. In a photoelectric sensor having a base current of $10^{-4}$ A/cm$^2$ or more, an exceedingly large current flows, so that noise is likely to occur due to the current. Therefore, such a photoelectric sensor is unfavorable.

(Thermally stimulated current characteristics of the photoelectric sensor)

Charge trap sites in the photoelectric sensor of the present invention are unique trap sites which are present in a steady state. Since a certain amount of charge has been trapped in the charge trap sites before light amplification is performed, it is possible to make an observation by measurement of the thermally stimulated current.

Figure 15:
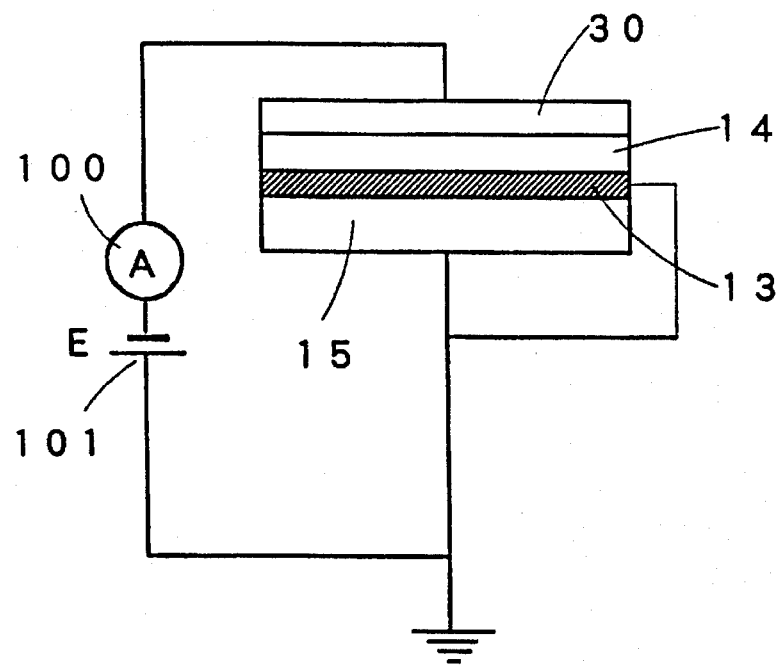
FIG. 15 illustrates a measuring circuit used to measure thermally stimulated current in the photoelectric sensor of the present invention.

The thermally stimulated current in the photoelectric sensor of the present invention was measured as follows. A sample for measurement was prepared by depositing a gold electrode having a film thickness of 30 nm, a sheet resistivity of 1,000 ohm/sq., and a size of 0.16 cm² on the photoconductive layer, and the thermally stimulated current was measured with a short-circuit thermally stimulated current measuring device (manufactured by Toyo Seiki K.K.), as shown in FIG. 15. In the figure, reference numeral 15 denotes a photoelectric sensor substrate, 13 an electrode, 14 a photoconductive layer including a charge generation layer and a charge transport layer, 30 a gold electrode, and 100 a micro-ammeter. A DC voltage of 5 V was applied between the photoelectric sensor electrode as a positive electrode and the gold electrode as a negative electrode, and at the same time, the photoelectric sensor for measurement was heated at a heating rate of 10° C./min. The current flowing during the heating process was measured with the micro-ammeter.

Figure 16:
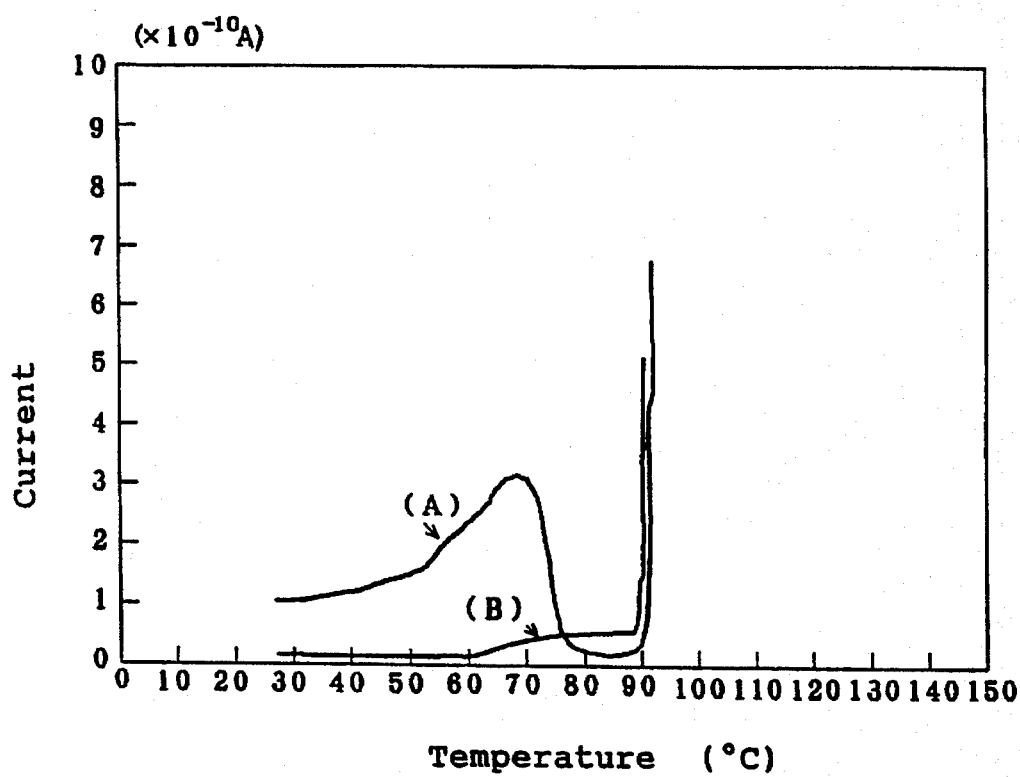
FIG. 16 is a graph showing the results of measurement of thermally stimulated current in the photoelectric sensor of the present invention and the comparative sensor.

The results of the measurement are shown in FIG. 16. In the graph of FIG. 16, the axis of abscissas represents the heating temperature (°C.), and the axis of ordinates represents the current value (A). In the figure, the line A shows the measured values of current flowing in the photoelectric sensor showing amplifying action. The line B shows the current values measured for the photoelectric sensor showing no amplifying action.

As shown by the line A, in the photoelectric sensor having the amplifying function according to the present invention, a clear peaked waveform is observed besides the base current in the temperature range of 40° C. to 150° C. In the sample having no amplifying action, on the other hand, such a peaked waveform cannot be observed. This is considered to be attributable to the charge trapped in the trap sites present in the photoelectric sensor. Thus, no amplifying effect can be expected unless the photoelectric sensor has electric charge accumulated therein to such an extent that a peak can be clearly observed in the measurement of the thermally stimulated current. The shape of the peak, the vertex of the peak, the temperature range, etc. depend on the material used.

(Stored charge light decay characteristics of the photoelectric sensor)

Figure 17:
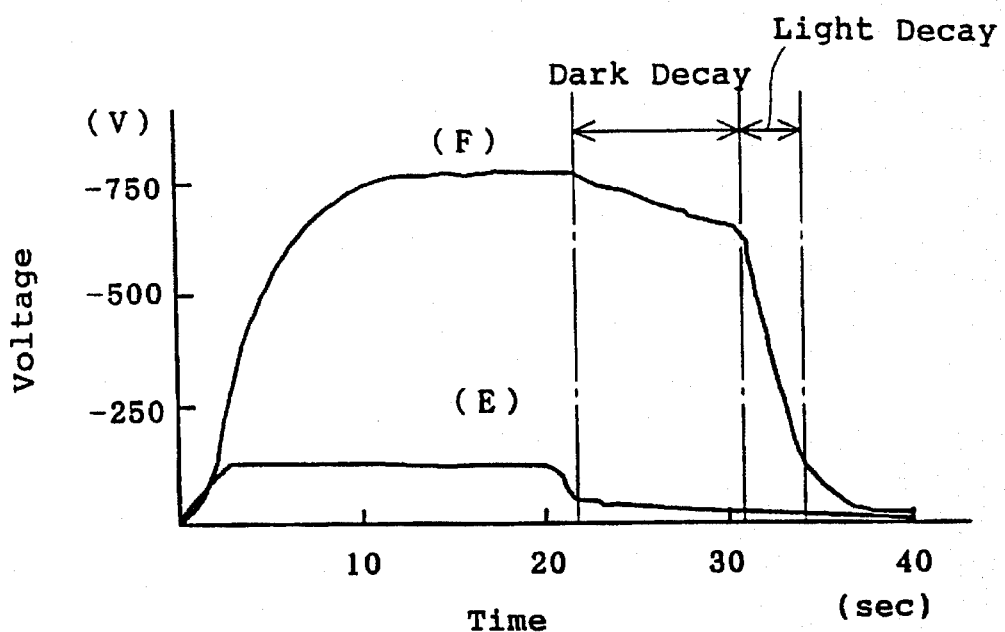
FIG. 17 is a graph showing stored charge light decay characteristics of the photoelectric sensor of the present invention and the comparative sensor.

Stored charge light decay characteristics of the photoelectric sensor according to the present invention were measured as follows. After the photoconductive layer of each photoelectric sensor had been corona-charged for 20 sec. at −5 kV, it was allowed to stand for 10 sec. to let dark decay occur. Then, green light of 25 lux was applied to the photoelectric sensor for 10 sec., and the change of the surface potential of each photoelectric sensor with time was measured with an electrostatic copying paper testing device (EPA-8100, manufactured by Kawaguchi Denki Works Co. Ltd.). The results of the measurement are shown in FIG. 17. In the graph of FIG. 17, the axis of abscissas represents the time (second) elapsed from the initiation of the corona charging until the termination of light decay, and the axis of ordinates represents the charge potential (V). In the figure, the line E shows the results of the measurement for the photoelectric sensor of the present invention, and the line F shows those for the comparative sensor.

Let us define the surface potential 10 sec. after the termination of the corona charging as acceptance potential. It will be understood from the figure that in the photoelectric sensor of the present invention, there is substantially no acceptance potential, and the dark decay is fast, whereas, in the comparative sensor, the acceptance potential is as high as about −700 V, and the dark decay is slow. Thus, the comparative sensor has stored charge light decay characteristics different from those of the photoelectric sensor of the present invention. It should be noted that the value of acceptance potential and the dark decay curve depend on the material used.

(Aging of the photoelectric sensor)

The photoelectric sensor of the present invention does not stably show sufficiently high sensitivity immediately after it has been produced, although the reason for this is not clear. It is necessary in order to satisfactorily manifest the above-described amplifying action to age the photoelectric sensor for a predetermined period of time after the production of it. Particularly, the desired performance can be exhibited even more favorably when the aging is effected in dark at a relative humidity of not more than 60%. The change of the condition caused by the aging can be confirmed by the acceptance potential described in the above stored charge light decay measurement.

Figure 18:
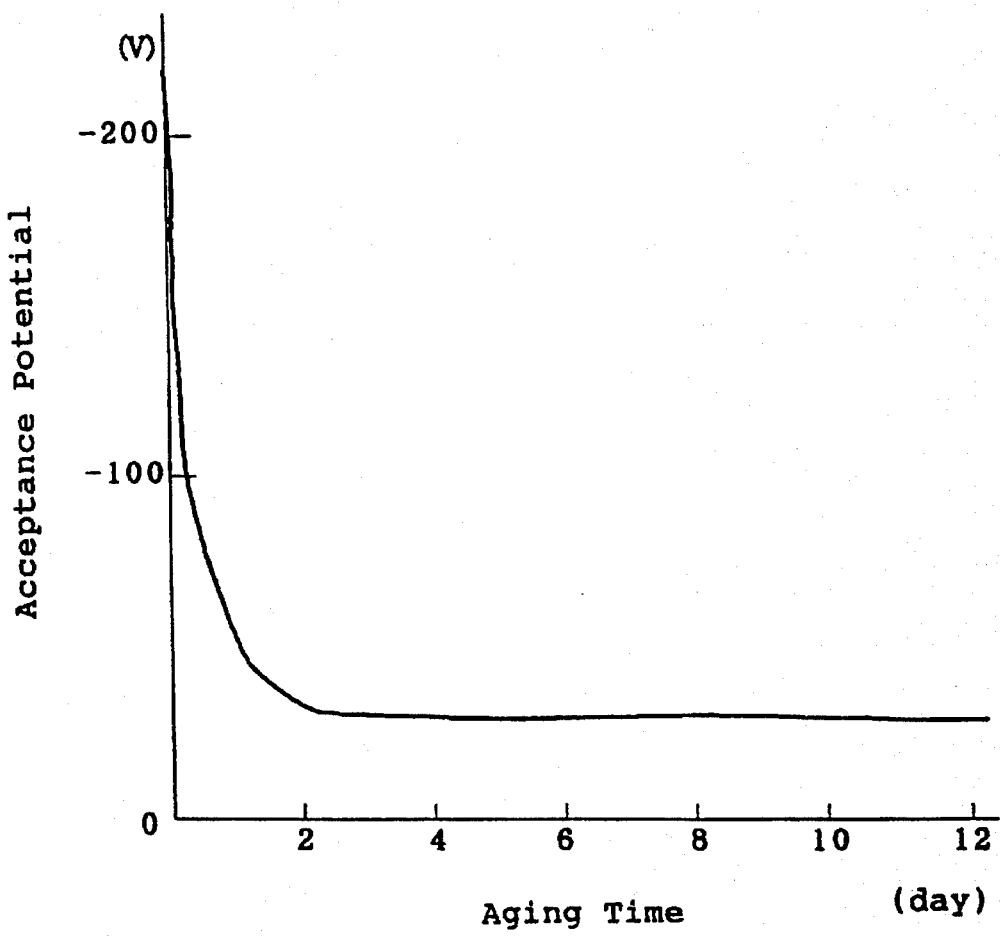
FIG. 18 is a graph showing the change of acceptance potential of the photoelectric sensor caused by aging.

FIG. 18 shows the change of the acceptance potential with time with regard to the photoelectric sensor of the present invention. In the graph of FIG. 18, the axis of ordinates represents the acceptance potential (V), and the axis of abscissas represents the aging time (day). The acceptance potential rapidly changes immediately after the production of the photoelectric sensor and becomes constant 2 to 3 days after the production. At the time when the acceptance potential has become constant, the photoelectric sensor exhibits its performance to the full.

Figure 19:
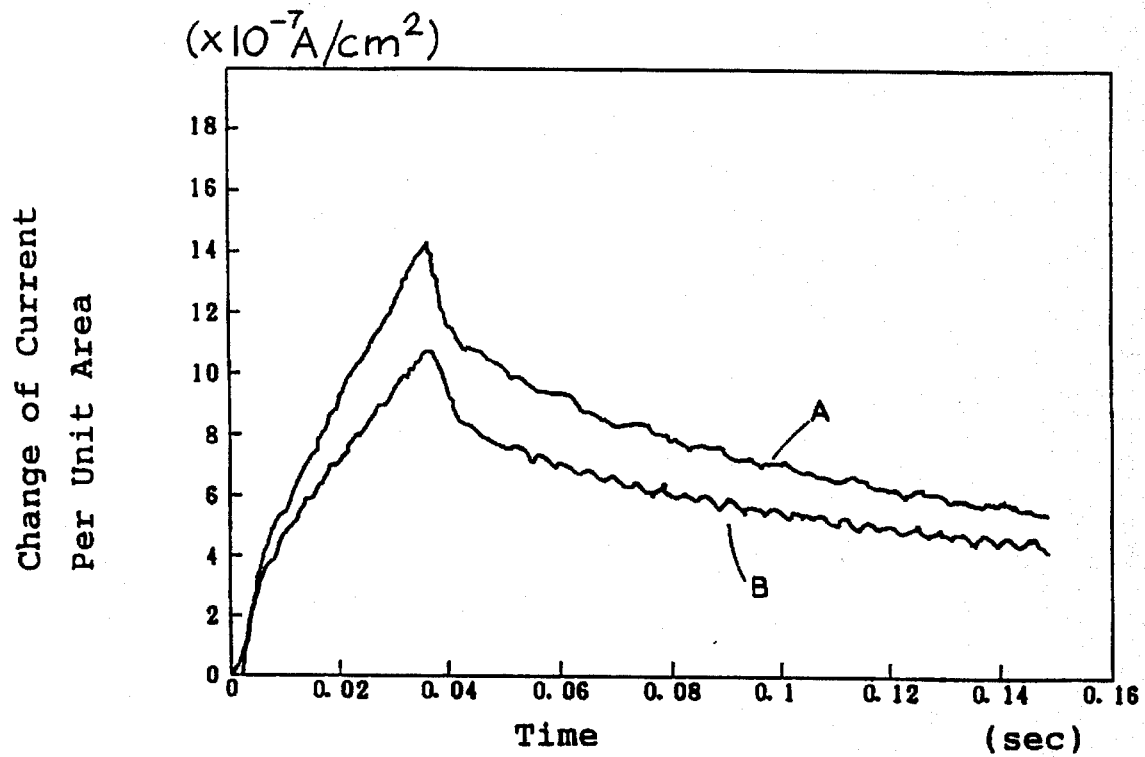
FIG. 19 is a graph showing electrical characteristics of the photoelectric sensor a half day after the production thereof and also showing electrical characteristics of the photoelectric sensor after aging.

FIG. 19 shows the results of measurement of electrical characteristics of the photoelectric sensor. The line B shows the results of measurement for a sample photoelectric sensor a half day after the production of it, and the line A shows the results of measurement for the same sample after it had been aged for 3 days. It will be understood from the graph that the photoelectric sensor aged for 3 days shows an amplifying action more remarkably than the photoelectric sensor aged for a half day.

It should be noted that the above-described results of measurement were obtained from a hole transport type photoelectric sensor and that in the case of an electron transport type photoelectric sensor, similar results can be obtained by carrying out measurement with the polarities set opposite to the above. It should be noted that the results of measurement for an electron transport photoelectric sensor may be opposite in polarity to the above.

Figure 1:
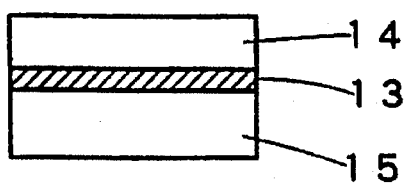
FIG. 1 is a sectional view for explanation of a photoelectric sensor of the present invention.

The following is a description of a single-layer photoelectric sensor in which the photoconductive layer of the photoelectric sensor according to the present invention comprises a single layer. FIG. 1 is a sectional view for explanation of the single-layer photoelectric sensor, in which reference numeral 13 denotes an electrode, 14 a photoconductive layer, and 15 a substrate.

The photoconductive layer 14 is formed of an inorganic or organic photoconductive substance. Examples of inorganic photoconductive substances include Se, Se-Te, ZnO, $TiO_2$, Si, CdS, etc. These substances may be used alone or in the form of a combination of two or more of them. Such an inorganic photoconductive material is stacked on the electrode to a layer thickness of 1 μm to 30 μm, preferably 3 μm to 20 μm, by vapor deposition, sputtering, CVD, etc. It is also possible to use an inorganic photoconductive substance in the form of finely divided particles in combination with a binder. Examples of binders usable in the present invention include a silicone resin, a polycarbonate resin, a polyvinyl formal resin, a polyvinyl acetal resin, a polyvinyl butyral resin, a styrene resin, a styrene-butadiene copolymer resin, an epoxy resin, an acrylic resin, a saturated or unsaturated polyester resin, a methacrylic resin, a vinyl chloride resin, a vinyl acetate resin, a vinyl chloride-vinyl acetate copolymer resin, etc. These binder resins may be used alone or in the form of a combination of two or more of them. It is preferable to disperse 0.1 to 10 parts by weight, preferably 1 to 5 parts by weight, of finely divided photoconductive particles in 1 part by weight of a binder resin material.

Organic photoconductive substances include dispersions of high- and low-molecular photoconductive substances in an insulating binder. Examples of high-molecular photoconductive substances are polyvinyl carbazole (PVK), and poly-N-ethylenic unsaturated group-substituted carbazoles in which an ethylenic unsaturated group, e.g., allyl group or acryloxyalkyl group, is contained in place of the vinyl group in PVK. Examples of high-molecular photoconductive substances further include poly-N-ethylenic unsaturated group-substituted phenothiazines, e.g., poly-N-acrylphenothiazine, poly-N-(β-acryloxy)phenothiazine, etc., and polyvinyl pyrene. Among these substances, poly-N-ethylenic unsaturated group-substituted carbazoles, particularly polyvinyl carbazole may preferably be employed.

Examples of low-molecular photoconductive substances are oxadiazoles substituted by alkylaminophenyl group or the like, a triphenylmethane derivative, a hydrazone derivative, a butadiene derivative, a stilbene derivative, etc. It is also possible to form the photoconductive layer by using a charge generating substance and a charge transport substance, which are employed in a double-layered photoelectric sensor. In such a case, the charge generating and transport substances may be mixed in the ratio of from 1:1 to 1:10, preferably from 1:2 to 1:5.

An organic photoconductive layer having film-forming properties may be formed by dispersing 0.1 to 10 parts by weight, preferably 0.1 to 1 part by weight, of an electrically insulating resin material in 1 part by weight of one selected from among the above organic photoconductive substances. An organic photoconductive layer produced by any of the above-described methods is formed on the electrode so that the dry film thickness is in the range of 1 µm to 50 µm, preferably in the range of 3 µm to 20 µm. Within the film thickness range, the photoelectric sensor exhibits excellent sensitivity and image quality.

Figure 2:
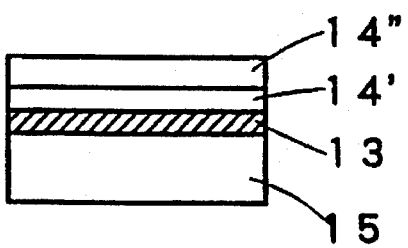
FIG. 2 is a sectional view for explanation of another photoelectric sensor of the present invention.

Next, a double-layered photoelectric sensor will be explained. FIG. 2 is a sectional view for explanation of the double-layered photoelectric sensor, in which reference numeral 13 denotes an electrode, 14' a charge generation layer, 14" a charge transport layer, and 15 a substrate.

As illustrated in the figure, the double-layered photoelectric sensor has a charge generation layer and a charge transport layer, which are successively formed on the electrode. This type of photoelectric sensor includes an inorganic material photoelectric sensor and an organic material photoelectric sensor.

The charge generation layer 14' in the inorganic material photoelectric sensor is formed on the electrode to a thickness of 0.05 µm to 1 µm by vapor deposition, sputtering, CVD, etc. using a material such as Se-Te or Si doped with sulfur or oxygen, for example.

Next, a charge transport layer is formed on the charge generation layer to a thickness of 1 82 m to 50 µm, preferably 3 µm to 20 µm, in the same way as the above using a material such as Se, $As_2$, $Se_3$, Si, or Si doped with methane, for example.

The charge generation layer 14' in the organic material photoelectric sensor is composed of a charge generating substance and a binder. Examples of charge generating substances usable in the present invention are cationic dyes, e.g., pyrylium dyes, thiapyrylium dyes, azulenium dyes, cyanine dyes, azulenium salt dye, etc., squalium salt dyes, phthalocyanine pigments, perylene pigments, polycyclic quinone pigments, e.g., pyranthrone pigments, etc., indigo pigments, quinacridone pigments, pyrrole pigments, and azo pigments, which are shown below. The dyes and pigments may be used alone or in the form of a combination of two or more of them.

Specific examples of charge generating substances usable in the present invention are those which are described, for example, in Japanese Patent Application Laid-Open (KOKAI) Nos. 64-105956, 49-105536, 47-37543, 47-37544, 62-2267, 61-162555, 01-17553, 64-38753, 64-28652, 64-19356, 64-28650, 64-29848, 01-198761, 01-198762, 01-198763, 01-180553, 01-97760, 01-164954, 64-21459, 56-120649, 64-25748, 64-22969, 01-201668, 01-200362, 01-200361, 01-146843, 01-146844, 01-146845, 01-146846, 01-146847, 01-106864, 01-201670, and 01-255861.

① Pyrylium dye

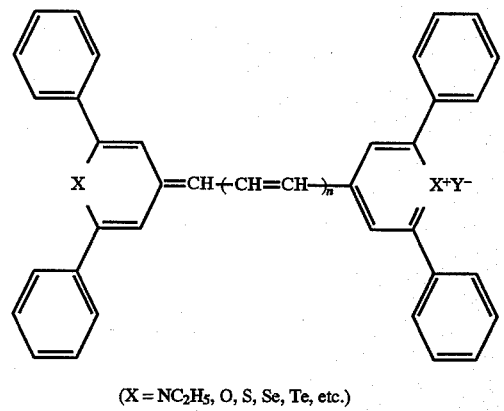

(X = $NC_2H_5$, O, S, Se, Te, etc.)

② Thiapyrylium dye

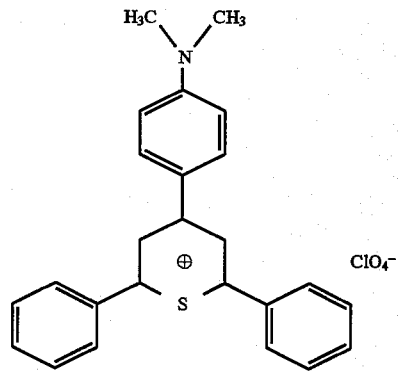

③ Azulenium dye

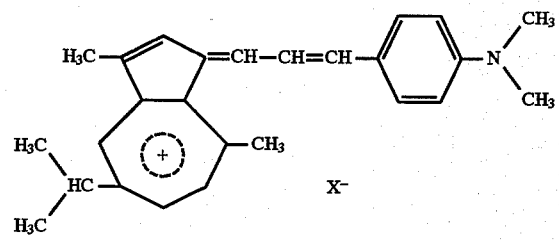

④ Cyanine dye

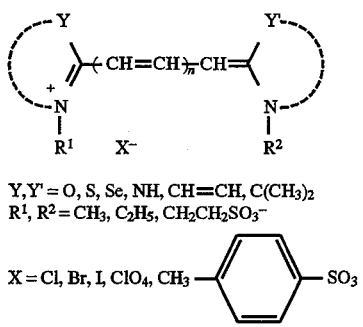

Y,Y' = O, S, Se, NH, CH=CH, C(CH$_3$)$_2$
R$^1$, R$^2$ = CH$_3$, C$_2$H$_5$, CH$_2$CH$_2$SO$_3^-$

X = Cl, Br, I, ClO$_4$, CH$_3$—⟨⟩—SO$_3$ n = 0, 1, 2, 3

⑥ Azulenium salt

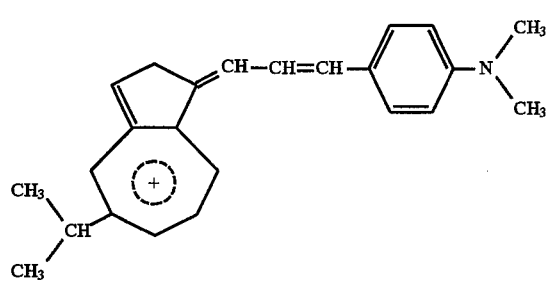

⑦ Squalium salt

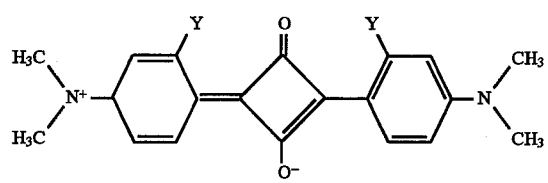

Y = H, OH, CH$_3$

⑧ Phthalocyanine pigment

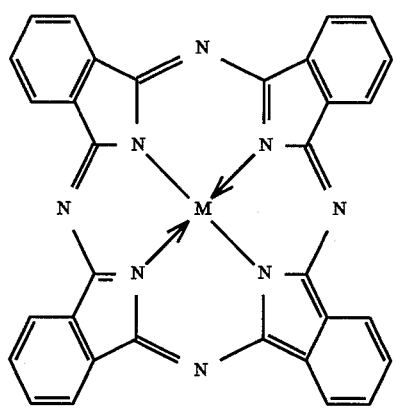

M = Cu, Mg, etc.

⑨ Perylene pigment

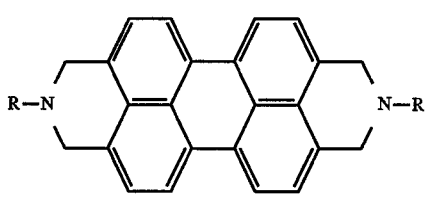

⑩ (continued)

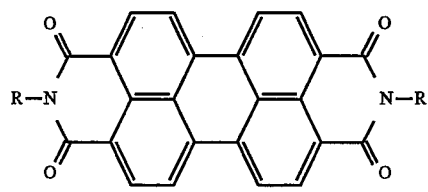

R = CH$_3$, 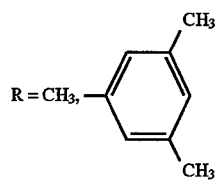

⑪ Polycyclic quinone pigment

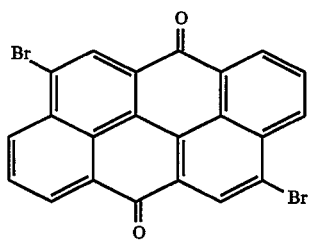

⑫ Indigo pigment

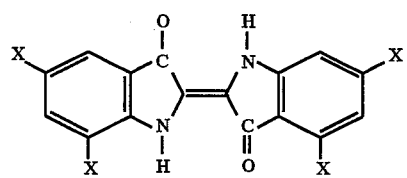

X = H, Cl, Br

⑬ Quinacridone pigment

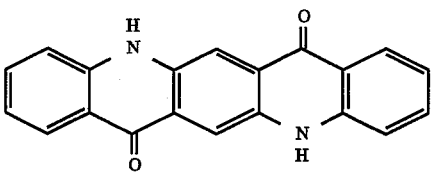

⑭ Pyrrol pigment

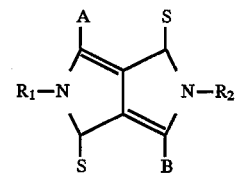

A, B = alkyl group, aralkyl group, cycloalkyl group, carbocyclic or heterocyclic aromatic ring
R$_1$, R$_2$ = hydrogen atom, or substituent ring not imparting water-solubility In addition, many azo pigments are usable. The chemical structure of particularly preferable azo pigments may be expressed by the central skeleton A and the coupler portion Cp as follows:

A$(-$N=N$-$Cp$)_n$
Specific examples of A are as follows:
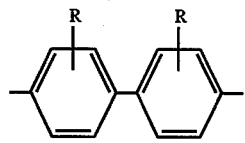
A1
R = H, Cl, OCH$_3$
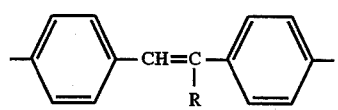
A2
R = H, CN
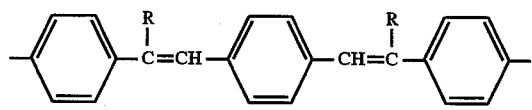
A3
R = H, CN
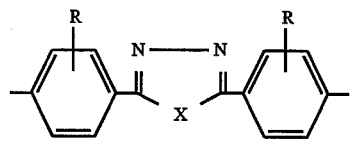
A4
X = O, S
R = H, CH$_3$, Cl
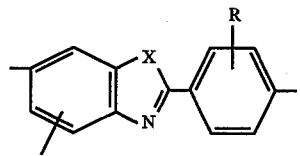
A5
X = O, S
R = H, CH$_3$, Cl
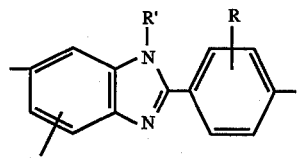
A6
R = H, CH$_3$, Cl, etc.
R' = H, CH$_3$, 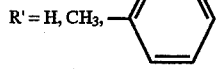
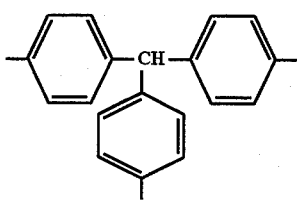
A7
-continued
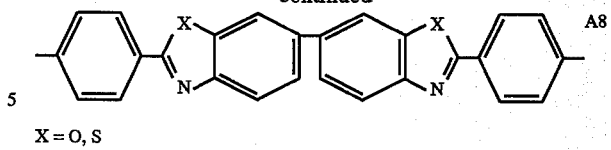
A8
X = O, S
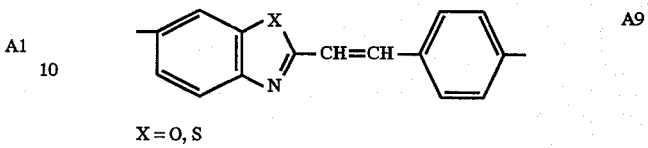
A9
X = O, S
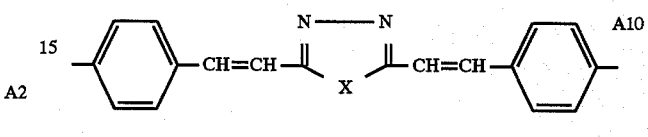
A10
X = O, S
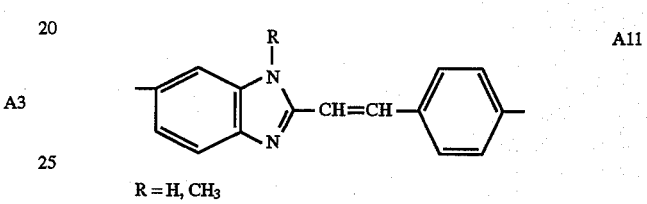
A11
R = H, CH$_3$
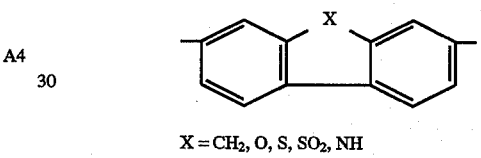
A12
X = CH$_2$, O, S, SO$_2$, NH
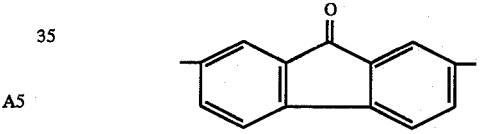
A13
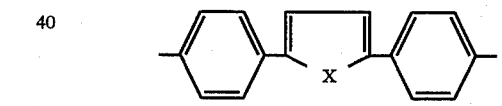
A14
X = O, S
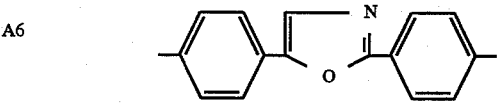
A-15
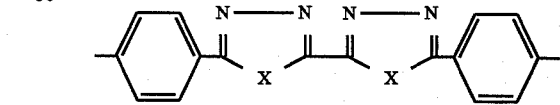
A16
X = O, S
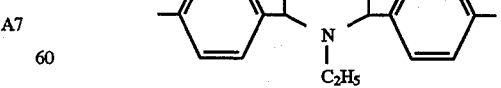
A17
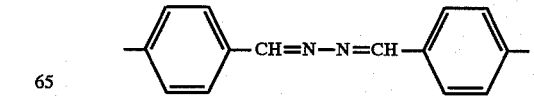
A18

-continued
| | |
|---|---|
| 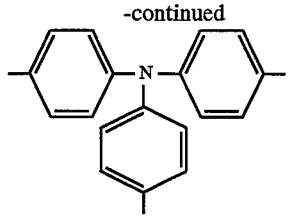 | A19 |
| 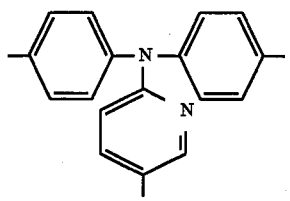 | A20 |
|   R = H, CH₃ | A21 |
| 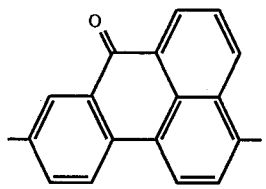 | A22 |
| 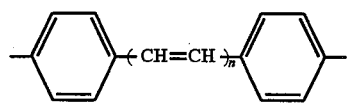  (n = 1, 2, 3,) | A23 |
| 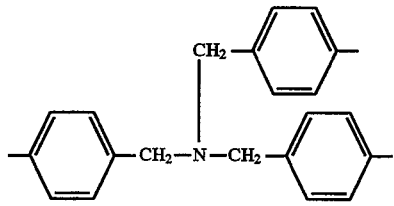 | A24 |
| 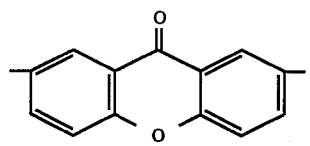 | A25 |
| 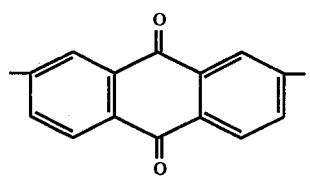 | A26 |
| 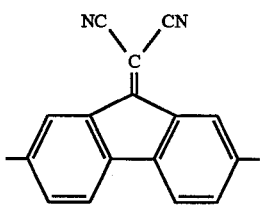 | A27 |
| | |
|---|---|
| 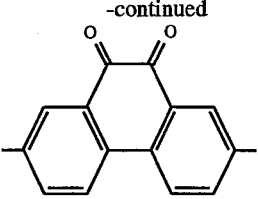 | A28 |
| 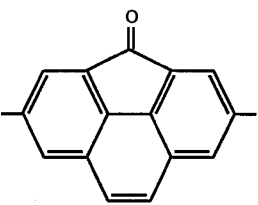 | A29 |
Specific examples of Cp are as follows:
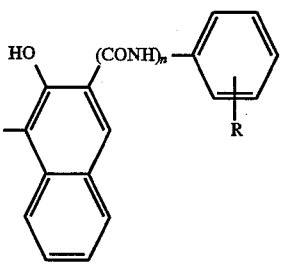  Cp-1
R = H, halogen atom, alkoxy group, alkyl group, nitro group, etc.
n = 1 or 2
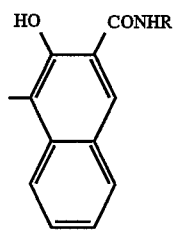  Cp-2
R = CH₃, C₂H₅, C₃H₇
 Cp-3
R = alkyl group, 
R' = hydrogen atom, halogen atom alkoxy group, alkyl group, nitro group
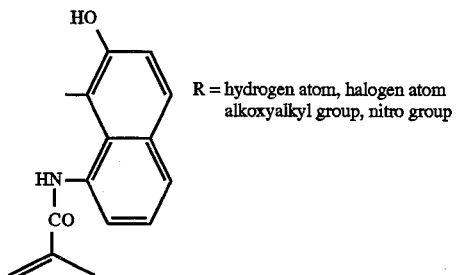 Cp-4
R = hydrogen atom, halogen atom alkoxyalkyl group, nitro group Cp-5

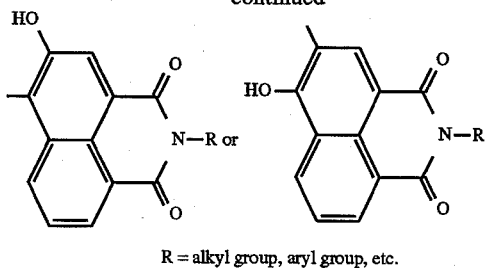

R = alkyl group, aryl group, etc.

Cp-6

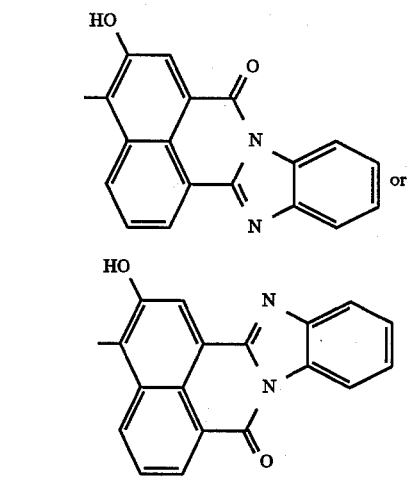

Cp-7

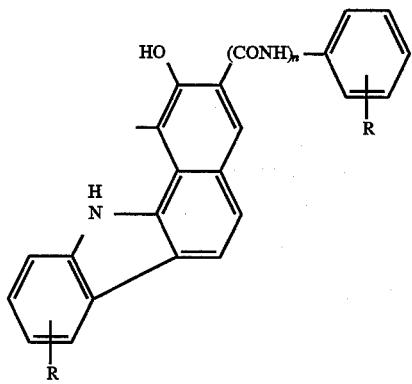

R = hydrogen atom, halogen atom, alkoxyl group alkyl group, nitro group, alkyl amino group, etc.

n = 1 or 2

By properly combining the above central skeleton A and coupler Cp, an azo dye suitable for use as a charge generating substance can be obtained.

Examples of binders usable in the present invention are a silicone resin, a polycarbonate resin, a polyvinyl formal resin, a polyvinyl acetal resin, a polyvinyl butyral resin, a styrene resin, a styrene-butadiene copolymer resin, an epoxy resin, an acrylic resin, a saturated or unsaturated polyester resin, a methacrylic resin, a vinyl chloride resin, a vinyl acetate resin, a vinyl chloride-vinyl acetate copolymer resin, etc. These binder resins may be used alone or in the form of a combination of two or more of them.

Preferable examples of charge generating substances are fluorenone-azo pigment and a bis-azo pigment. Preferable examples of binders are a polyester resin, a vinyl chloride-vinyl acetate copolymer resin, and a polyvinyl butyral resin.

It is preferable to mix 0.1 to 10 parts by weight, preferably 0.2 to 1 part by weight, of a binder with 1 part of a charge generating substance. The dry film thickness of the charge generation layer is in the range of 0.01 µm to 1 µm, preferably in the range of 0.1 µm to 0.5 µm. Within this thickness range, the photoelectric sensor exhibits excellent sensitivity and image quality.

The charge transport layer 14" is composed of a charge transport substance and a binder. The charge transport substance is a substance having excellent properties to transport an electric charge generated in the charge generation layer. Examples of charge transport substances usable in the present invention are oxadiazole, oxazole, triazole, thiazole, triphenylmethane, styryl, pyrazoline, hydrazone, aromatic amine, carbazole, polyvinyl carbazole, stilbene, enamine, azine, triphenylamine and butadiene compounds, polycyclic aromatic compounds, and stilbene dimers, the chemical structures of which are shown below. The charge transport substance must have excellent hole transport properties.

Preferable examples are butadiene, stilbene and triphenylamine charge transport substances. Specific examples of charge transport substances are those which are described, for example, in Japanese Patent Application Laid-Open (KOKAI) Nos. 62-287257, 58-182640, and 48-43942, Japanese Patent Application Post-Exam Publication No. 34-5466, Japanese Patent Application Laid-Open (KOKAI) Nos. 58-198043, 57-101844, 59-195660, 60-69657, 64-65555, 01-164952, 64-57263, 64-68761, 01-230055, 01-142654, 01-142655, 01-155357, 01-155358, 01-161245, 01-142643, and 02-61644.

① Oxadiazole compound

② Oxazole compound

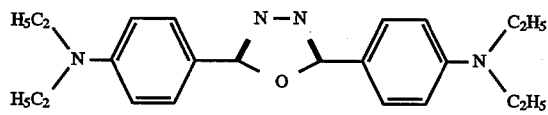

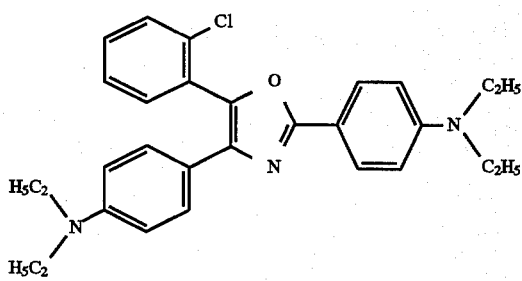

-continued
③ Triazole compound
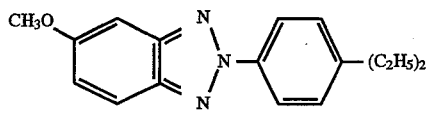
④ Thiazole compound
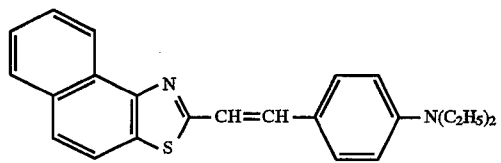
⑤ Triphenylmethane compound
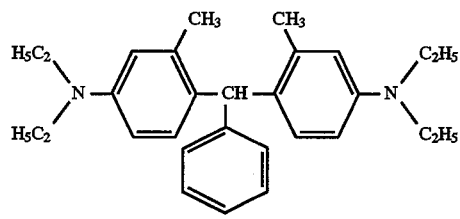
⑥ Styryl compound
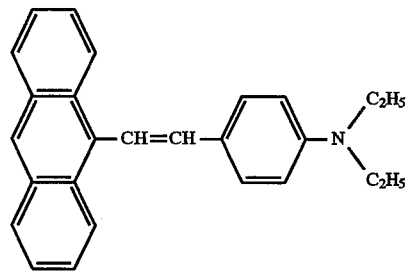
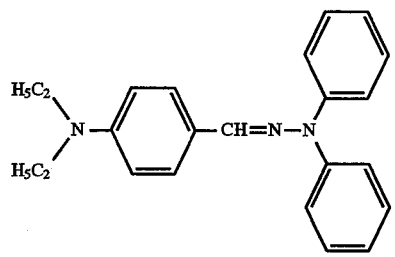
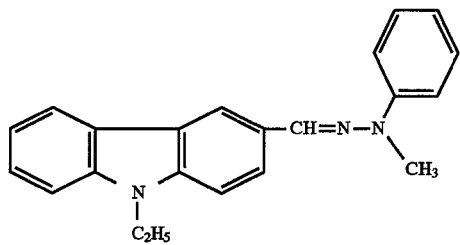
⑦ Pyrazoline compound
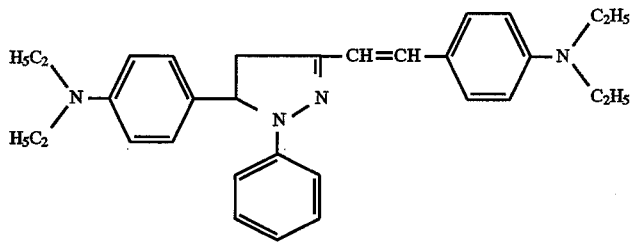
⑧ Hydrazone compound
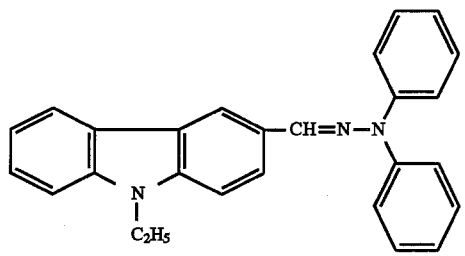
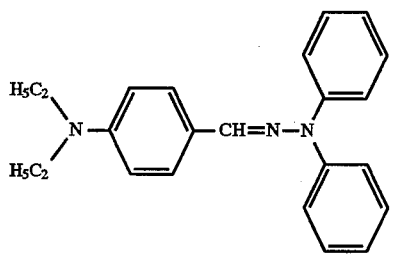

-continued
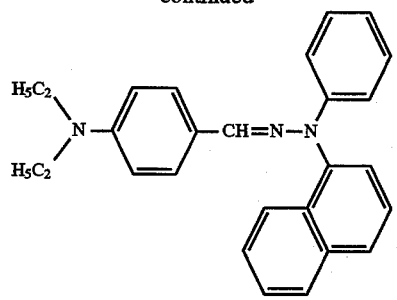
⑨ Triphenylamine compound
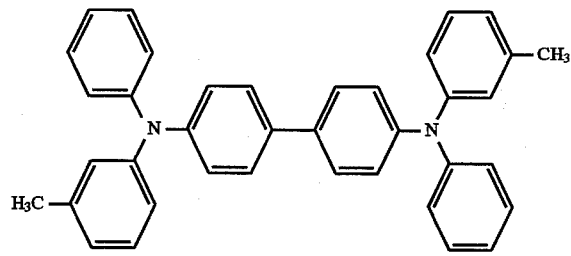 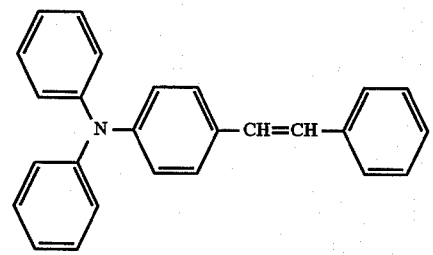
⑩ Carbazole compound
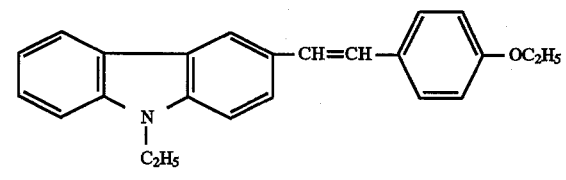 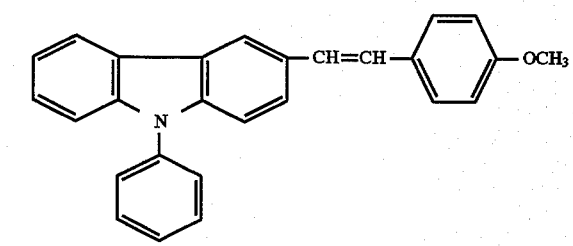
⑪ Polyvinyl carbazole compound   ⑫ Stilbene compound
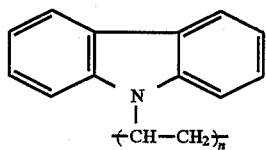 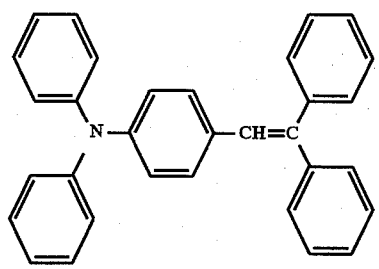
⑬ Enamine compound
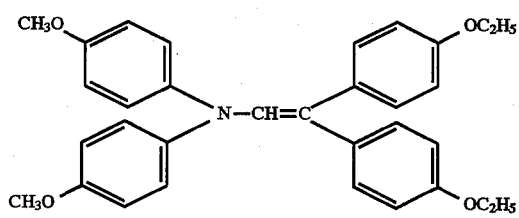
⑭ Azine compound
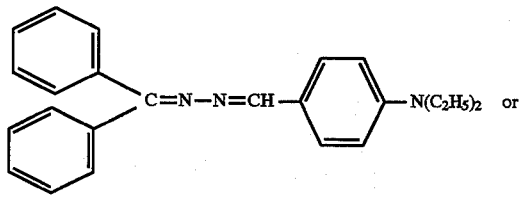 or 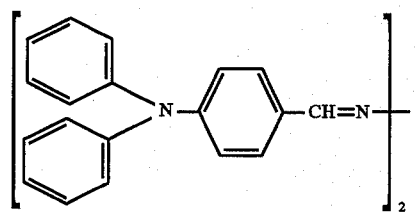

⑮ Stilbene dimer
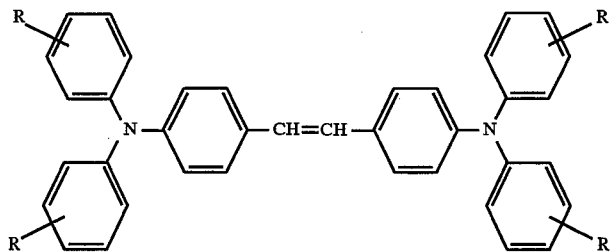
R represents methyl, methoxy, chlorine in ortho, meta, para positions.
⑯ Butadiene compounds
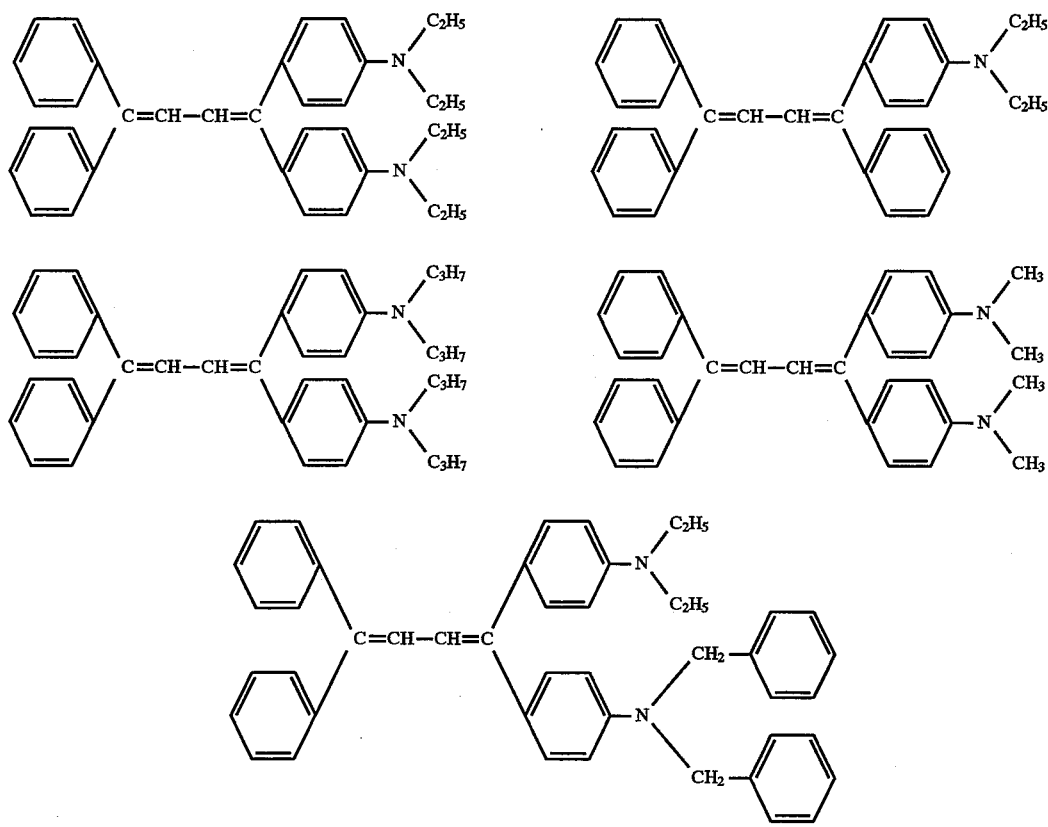
⑰ Diene compounds
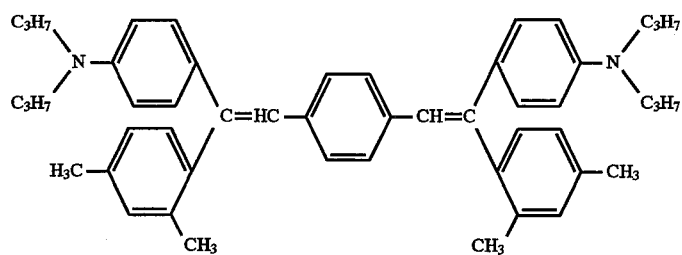

-continued

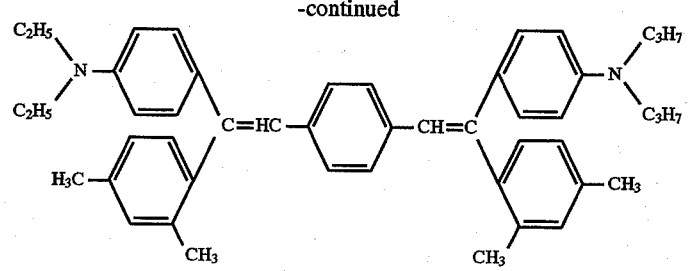

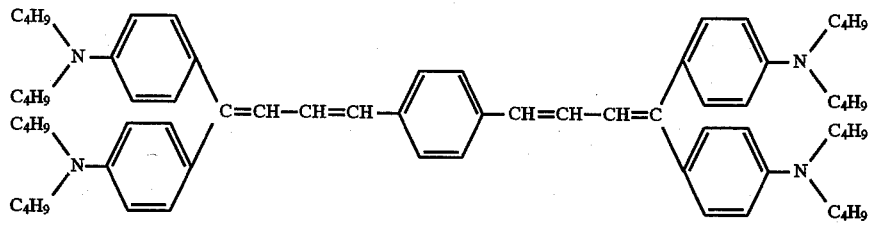

Regarding to the combination of charge generating and transport substances, it is preferable to select materials so that the ionization potential of the charge transport substance is lower than that of the charge generating substance. With such a combination, a preferable current density can be obtained in the photoelectric sensor of the present invention. Favorable examples are a combination of a fluorenone-azo pigment (charge generating substance) and a stilbene charge transport substance, and a combination of a bis-azo pigment (charge generating substance) and a butadiene or hydrazone charge transport substance.

In a case where electrons are transported as carriers in place of holes as in the above-described example, electron transport substances as shown below may be used:

Electron transport substances

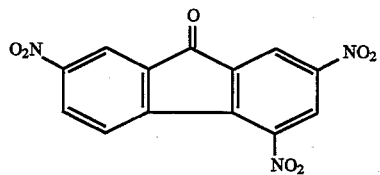

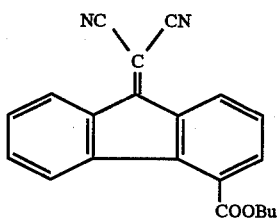

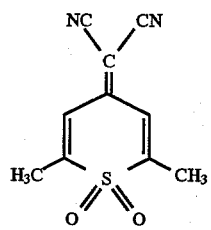

-continued

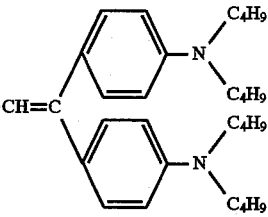

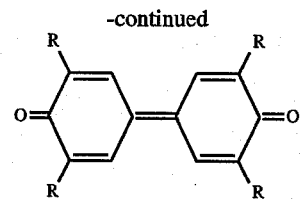

As for the binder, it is possible to use the same binders as those mentioned for the charge generation layer, and in addition, a polyarylate resin and a phenoxy resin can be used for the binder. Preferable examples of binders are a styrene resin, a styrene-butadiene copolymer resin, and a polycarbonate resin. It is preferable to use 0.1 to 10 parts by weight, preferably 0.1 to 1 part by weight, of a binder per part by weight of a charge transport substance. The dry film thickness of the charge transport layer is in the range of 1 µm to 50 µm, preferably in the range of 3 µm to 20 µm. With such a film thickness, excellent sensitivity and image quality can be obtained.

Charge generation and transport substances which enable film formation by vapor deposition can be used alone without a binder.

When an organic photoconductive layer is to be formed on the above-described single-layer or double-layered photoelectric sensor, it is preferable to use a coating solution prepared using as a solvent 1,2-dichloroethane, 1,1,2-trichloroethane, chlorobenzene, tetrahydrofuran, cyclohexanone, dioxane, 1,2,3-trichloropropane, ethyl cellosolve, 1,1,1-trichloroethane, methyl ethyl ketone, chloroform, toluene, xylene, etc. The coating solution may be coated by blade coating, dipping, or spinner coating, for example.

The electrode 13 needs to be transparent if the information recording medium (described later) is opaque. However, if the information recording medium is transparent, the electrode 13 may be either transparent or opaque. Any material which stably gives a resistivity of not higher than $10^6$ ohm-cm can be used for the electrode 13. Examples of such material are a thin metallic conductive film, e.g., gold, platinum, zinc, titanium, copper, iron, tin, etc., a metallic oxide conductive film, e.g., tin oxide, indium oxide, zinc oxide, titanium oxide, tungsten oxide, vanadium oxide, etc., and an organic conductive film, e.g., quaternary ammonium salt, and so forth. These materials may be used alone or in the form of a composite material comprising two or more of them. Among these materials, oxide conductors are preferable; indium-tin oxide (ITO) is particularly preferable.

The electrode 13 is formed by vapor deposition, sputtering, CVD, coating, plating, dipping, electrolytic polymerization, etc. The film thickness of the electrode needs to be changed depending upon the electrical characteristics of the material thereof and the level of voltage applied to record information. For example, the thickness is about from 10 nm to 300 nm in the case of an ITO film. The electrode 13 may be formed either on the whole area between the substrate and the information recording layer or in conformity with a desired pattern. The electrode 13 may also be formed by stacking two or more different kinds of material.

The substrate 15 needs to be transparent if the information recording medium (described later) is opaque. However, if the information recording medium is transparent, the substrate 15 may be either transparent or opaque. The substrate 15 has the shape of card, film, tape, disk or the like and supports the photoelectric sensor so as to provide the required strength. Accordingly, the substrate 15 need not be provided if the photoelectric sensor itself has supporting properties, and there are no specific restrictions on the thickness and material of the substrate 15, provided that it is sufficiently strong to support the photoelectric sensor. Examples of usable materials are a flexible plastic film, or a rigid material such as glass, plastic sheet, card, etc. made of polyethylene, polypropylene, polyethylene terephthalate, polymethyl methacrylate, polymethyl acrylate, polyester, polycarbonate, etc.

It should be noted that if the electrode 13 is transparent, anti-reflection properties are preferably imparted to the substrate by stacking a layer having anti-reflection effect on the surface of the substrate 15 which is remote from the electrode 13, or by adjusting the film thickness of the transparent substrate to a level at which anti-reflection effect is obtainable, or by combining together these two measures, according to need.

The photoconductive layer may contain additives such as an electron accepting substance, a sensitizing dye, an antioxidizing agent, an ultraviolet absorbing agent, a light stabilizer, etc. Electron accepting substances and sensitizing dyes have functions to adjust and stabilize the base current and to attain sensitization.

Examples of electron accepting substances include nitro-substituted benzenes, amino-substituted benzenes, halogen-substituted benzenes, substituted naphthalenes, benzoquinones, nitro-substituted fluorenones, chloranils, and the compounds enumerated above as examples of charge transport substances. Examples of sensitizing dyes are a triphenylmethane dye, a pyrylium salt dye, a xanthene dye, and a leuco dye.

Examples of antioxidizing agents are phenol-, sulfur- and phosphorus-containing antioxidizing agents. Examples of ultraviolet absorbing agents are salicyclic acid-, benzophenone-, benzotriazole- and cyanoacrylate-containing ultraviolet absorbing agents. Examples of light stabilizers are ultraviolet light stabilizers, hindered amine light stabilizers, etc.

An electron accepting substance and a sensitizing dye are each added in the ratio of 0.0001 to 1 part by weight, preferably 0.01 to 1 part by weight, to 1 part by weight of a photoconductive substance. If the lower limit of the above range, i.e., 0.0001 part by weight, is not reached, the desired action cannot be obtained. If the upper limit of the above range, i.e., 1 part by weight, is exceeded, an adverse effect is made on the amplifying action.

An antioxidizing agent, an ultraviolet absorbing agent, and a light stabilizer are each added in the ratio of 0.0001 to 1 part by weight, preferably 0.01 to 1 part by weight, to 1 part by weight of a photoconductive substance, alone or in the form of a combination of a plurality of agents. If the lower limit of the above range, i.e., 0.0001 part by weight, is not reached, no advantageous effect is obtained from the addition of these substances. If the upper limit of the above range, i.e., 1 part by weight, is exceeded, an adverse effect is made on the amplifying action.

In the case of a double-layered photoelectric sensor, the above-described substances may be added to each of the charge generation and transport layers in the same ratio. Preferably, these substances are added to the charge generation layer.

The process for producing the photoelectric sensor of the present invention will be explained below.

(1) Treatment of the substrate

Since unevenness on the surface of the substrate of the photoelectric sensor produces an adverse effect on the characteristics of the photoelectric sensor, the surface of the substrate, e.g., a soda glass substrate, is polished by sandblasting so as to be as smooth as ±0.1 μm or less.

The smoothed substrate is cleaned by scrubbing, ultrasonic washing, etc. using a cleaning fluid, e.g., an alkali cleaning agent or a neutral cleaning agent, an organic solvent, etc., thereby removing fats and oils or other contaminants from the substrate surface. Thereafter, rinsing is carried out with pure water, followed by drying, thereby purifying the surface of the substrate.

(2) Film formation for the electrode

An electrically conductive film is formed on the sufficiently purified surface of the substrate to provide an electrode. That is, a metal film or a metal oxide film, e.g., an ITO film, is formed by vapor deposition, sputtering, CVD, plating, dipping, thermal decomposition of a compound concerned, etc. The conductive film thus formed preferably has a resistivity of not higher than $10^6$ ohm-cm. In the case of an ITO film, for example, the film thickness is preferably in the range of about 10 nm to 300 nm, and the light transmittance is preferably not lower than 80%.

The conductive film may be formed on the whole area of the surface of the substrate that faces the information recording layer of the photoelectric sensor or in conformity with any desired pattern formed.

(3) Treatment of the electrode

Then, the electrode provided on the substrate is cleaned in the same way as in the case of the substrate. That is, the surface of the electrode is cleaned by scrubbing, ultrasonic washing, etc. using a cleaning fluid, e.g., an alkali cleaning agent or a neutral cleaning agent, an organic solvent, etc., thereby removing fats and oils or other contaminants from the electrode surface. Thereafter, rinsing is carried out with pure water, followed by drying, thereby purifying the surface of the electrode.

Cleaning by scrubbing is particularly Preferable. Scrubbing is preferably carried out as follows: After pure water has been sprayed on the electrode, scrubbing is carried out for 10 sec. to 60 sec. with a brush made of nylon or acrylic fibers or a roll formed of a porous synthetic resin material. Thereafter, the electrode is cleaned by spraying pure water thereon. Then, the substrate is spun to remove water from the electrode. Furthermore, infrared drying is preferably carried out. The scrubbing process may be repeated a plurality of times.

(4) Production of the photoconductive layer

There are two cases where the photoconductive layer formed on the electrode is an inorganic photoconductive layer and an organic photoconductive layer, respectively. An inorganic photoconductive layer is formed by a film forming method, e.g., sputtering, vapor deposition, CVD, etc., using an inorganic photoconductive substance, or by coating with a dispersion of finely divided particles of an inorganic photoconductive substance in a synthetic resin material.

In the case of an organic photoconductive layer, an organic photoconductive substance is dispersed in an organic solvent, together with a binder. In particular, when a pigment is used as an organic photoconductive substance, it is necessary to enhance the dispersibility of finely divided particles of the pigment by using a sand grinder, a high-strength shearing dispersing machine, a colloid mill, or an ultrasonic dispersing apparatus.

The photoconductive layer may have either a single-layer structure or a double-layered structure including a charge generation layer and a charge transport layer. In either case, the surface condition of the photoelectric sensor after the photoconductive layer has been formed has an effect on the image quality. Therefore, the surface of the photoconductive layer is required to be smooth and uniform.

(5) Production of the charge generation layer

In a case where the organic photoconductive layer comprises a single layer, the thickness of the layer is in the range of 1 μm to 30 μm, whereas in a case where it comprises two layers, that is, a charge generation layer and a charge transport layer, the charge generation layer is exceedingly thin, i.e., the thickness thereof is in the range of 0.1 μm to 0.5 μm.

Accordingly, the dispersion for forming a charge generation layer must be dispersed to a high degree. For this purpose, it is possible to use a sand grinder, a high-strength shearing dispersing machine, a colloid mill, an ultrasonic dispersing apparatus, or an emulsifying dispersing apparatus in which the components of a dispersion are made to collide with each other at high speed under high pressure. It is preferable to disperse the material so that the 50% average particle diameter is not larger than 1 μm, preferably not larger than 0.5 μm, in the measurement by the diffracted light of forward and sideward scattered light.

The coating solution adjusted to a predetermined concentration is filtered to separate aggregates and other undesired matter. Thereafter, it is coated on the electrode by spinner coating, blade coating, applicator coating, etc.

Since the charge generation layer is thin in thickness, the coating process is preferably carried out as follows: A coating solution having a low solid content is coated on the electrode, and the solvent evaporation rate is controlled in a closed container so that the uniformity of the coating film is enhanced. After the greater part of the solvent has evaporated, the coating film is really dried to form a given charge generation layer.

It is also preferable to allow the substrate, equipment and material to stand for an adequate period of time in an atmosphere within a predetermined temperature range in advance of the coating process and to carry out coating thereafter in the same atmosphere. Further, since an air stream occurring in the drying atmosphere during the drying process, that is, from the time the coating solution is applied until a dry skin film has been formed on the surface of the coating, has an adverse effect on the uniformity of the coating film, it is preferable to maintain a calm condition. The temperature of the atmosphere is in the range of 0° to 50° C., preferably in the range of 5° C. to 30° C., with an allowance of ±20%, preferably ±10%, with respect to the set temperature.

(6) Production of the charge transport layer

In a case where the photoconductive layer comprises two layers, that is, a charge generation layer and a charge transport layer, a coating solution for the charge transport layer is coated on the charge generation layer in the same way as the charge generation layer. That is, a material for the charge transport layer is uniformly dissolved in an organic solvent, and the resulting solution is filtered to prepare a coating solution, which is then coated on the charge generation layer. To make the layer thickness uniform, the organic solvent is removed with the organic solvent content in the drying atmosphere being adjusted. After the organic solvent has volatilized, real drying is carried out.

Since the surface condition of the charge transport layer depends on the rate of evaporation of the organic solvent from the applied coating solution, the evaporation rate must be properly adjusted. If an organic solvent having a high evaporation drying rate is used, wavy unevenness of thickness occurs. Thus, it is difficult to obtain a uniform coating film. If an organic solvent having a low evaporation rate is used, a longer drying time is needed, and differences in the film thickness are likely to occur due to the effect of surface tension. Accordingly, if a coating solution is prepared by using a mixed solvent containing an organic solvent having a high drying rate and an organic solvent having a low drying rate, a good coating film is obtained. It is particularly preferable to combine together a solvent having a vapor pressure of not lower than 100 mmHg and a high evaporation rate and a solvent having a vapor pressure of not higher than 100 mmHg and a low evaporation rate. Examples of organic solvents having a high evaporation rate include 1,2-dichloroethane, dichloromethane, tetrahydrofuran, cyclohexane, chloroform, etc. Examples of organic solvents having a low evaporation rate include 1,1,2-trichloroethane, chlorobenzene, 1,4-dioxane, 1,2,3-trichloropropane, methyl ethyl ketone, toluene, etc.

Since the coating atmosphere temperature and the coating solution drying temperature have a large effect on the evaporation of the solvent, it is preferable to make a temperature adjustment. The coating atmosphere temperature is preferably in the range of 0° to 50° C., more preferably in the range of 5° C. to 30° C. with an allowance of ±20%, preferably ±10° C., with respect to the set temperature. The coating film drying atmosphere temperature may be determined according to the solvent used. However, it is preferably in the range of 60° C. to 100° C. with an allowance of ±5%.

It is also preferable to allow the substrate, equipment and material to stand for an adequate period of time in an atmosphere within a predetermined temperature range in advance of the coating process and to carry out coating thereafter in the same atmosphere in the same way as in the case of the coating process for the charge generation layer. Further, since an air stream occurring in the drying atmosphere during the drying process, that is, from the time the coating solution is applied until a dry skin film has been formed on the surface of the coating, has an adverse effect on the uniformity of the coating film, it is preferable to maintain a calm condition.

With a view to increasing the sensitivity of the photoelectric sensor of the present invention, it is preferable to raise the weight ratio of the charge transport component to the binder in the charge transport layer. A weight ratio of 5:1 or higher is particularly preferable. However, if the proportion of the charge transport component is excessively large, the strength of the coating film lowers, so that the coating film is likely to crack during the drying process. Therefore, it is preferable to carry out slow cooling from the drying temperature to the room temperature after the completion of the drying process. It is particularly preferable to carry out cooling at a rate not higher than 4° C. per minute.

(7) Storage

The photoelectric sensor, which has been properly dried, is preferably stored under conditions where the brightness, temperature, humidity, atmosphere, etc. are appropriately adjusted. If the photoelectric sensor is stored in dark at a relative humidity of not higher than 60% for the purpose of aging, the desired performance of the photoelectric sensor can be elicited to the full.

(8) Cutting and formation of leads for the electrode

The photoelectric sensor thus obtained is cut into a predetermined size, and leads for the electrode are formed for electrical connection required when a voltage is applied during exposure.

The following is a description of a photoelectric sensor according to the present invention in which the photoconductive layer has photo-induced memory effect (light fatigue effect). Photo-induced memory effect is an effect whereby the electrical conductivity raised by irradiation with light lasts for a predetermined period of time even after the termination of the light irradiation.

Examples of photosensitive members include those which are employed, for example, in Japanese Patent Application Post-Exam Publication No. 04-66022.

A photoconductive layer having such photo-induced memory effect may be formed from a material obtained by dispersing in an insulating binder resin organic high- and low-molecular photoconductive substances used for the photoconductive layer in the single-layer photoelectric sensor.

However, it should be noted that such a conventional photosensitive member having photo-induced memory effect cannot be used as a photoelectric sensor for information recording to an information recording medium as in the case of the photoelectric sensor of the present invention. Thus, the photoelectric sensor of the present invention is totally different from the known photosensitive member having photo-induced memory effect in terms of the function and the way in which it is used.

It is necessary in order to produce satisfactory photo-induced memory effect to add a memory effect imparting agent to the photoconductive layer.

Examples of such memory effect imparting agent include an aryl methane dye represented by formula (1):

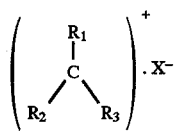

Formula (1)

(where at least one of $R_1$, $R_2$ and $R_3$ is a substance represented by formula (2) or (3); otherwise it represents a hydrogen atom, an alkyl group, an aryl group, or an aralkyl group)

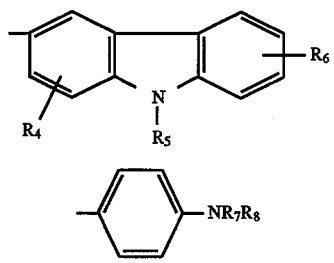

Formula (2)

Formula (3)

In formula (1), $X^-$ represents an anion, for example, a halogen ion, i.e., $Cl^-$, $Br^-$, $I^-$, etc., an anion, i.e., $BF_4^-$, $SbF_6^-$, $PF_6^-$, $ASF_6^-$, etc., or $M_nX_m^-$ (where M is a metal atom, X is a halogen atom, and m and n are integers).

Among compounds represented by formula (1), a combination of an aryl methane dye in which $R_1$ and $R_2$ are a N-ethyl-substituted carbazole group each and $R_3$ is a phenyl group, or an aryl methane dye in which $R_1$ and $R_2$ are a p-dimethylaminophenyl group each and $R_3$ is a phenyl group, and a covalent complex anion, i.e., $BF_6^-$ or $PF_6^-$, is preferable because it gives a photoconductive layer of high persistent conductivity.

Examples of other memory effect imparting substances include diazonium salts, anhydrides, o-benzosulfoimide, ninhydrins, cyano compounds, nitro compounds, sulfonyl chloride, diphenyl or triphenyl methane, o-benzoylbenzoic acid, etc. Specific examples which are particularly preferable among these substances will be shown below.

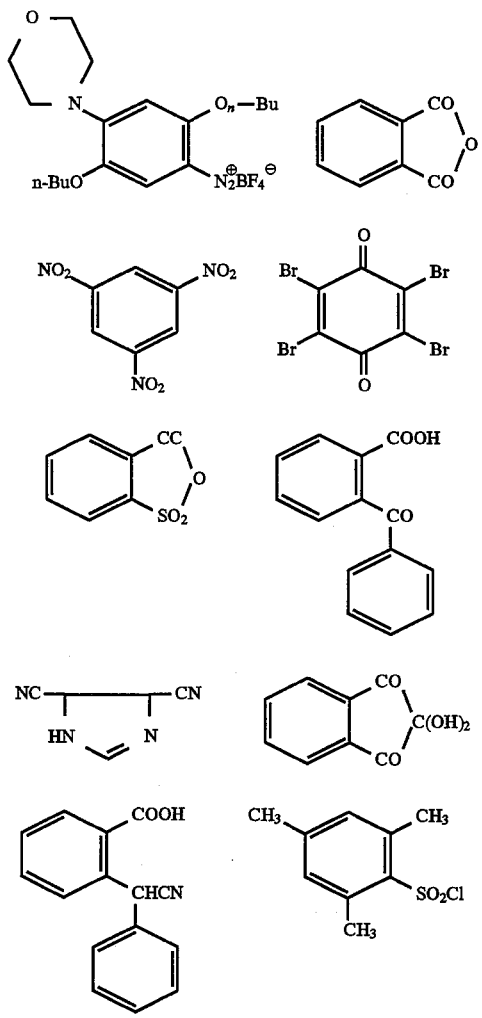

Specific examples of memory effect imparting substances include leuco dyes as shown below:

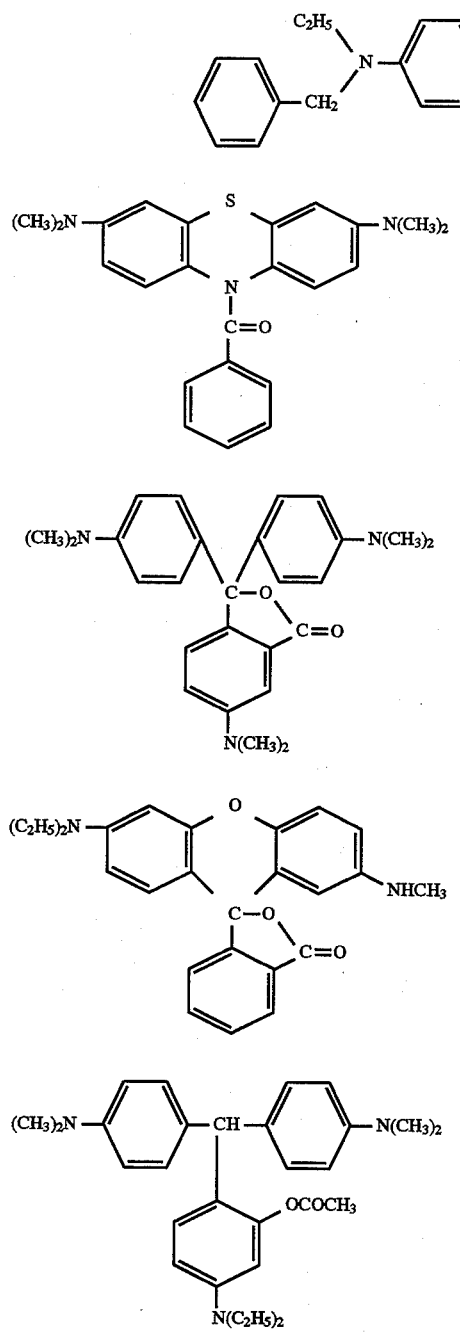
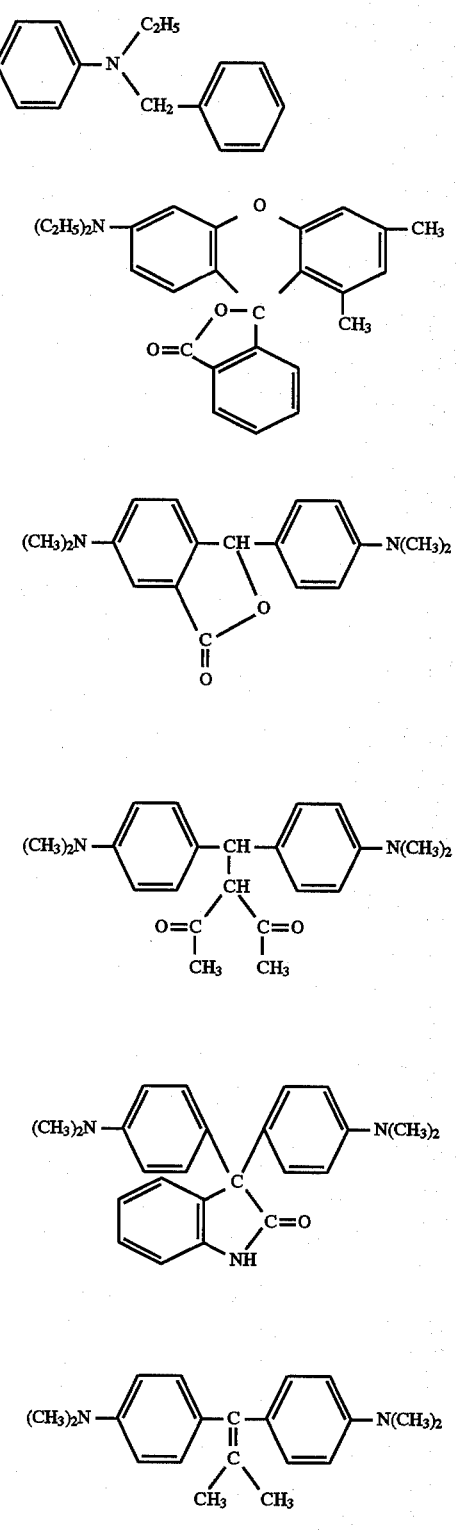

47

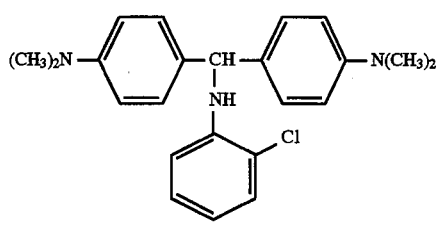

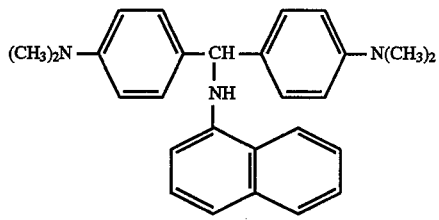

48

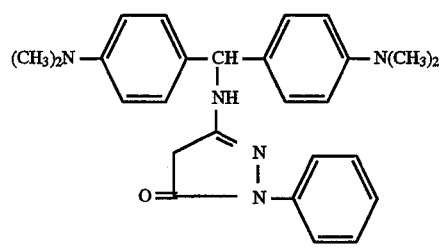

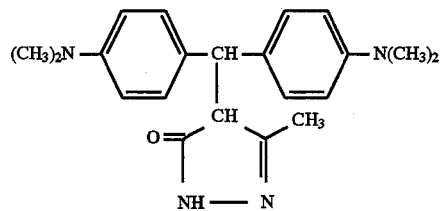

-continued

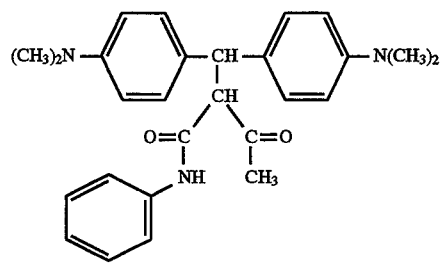

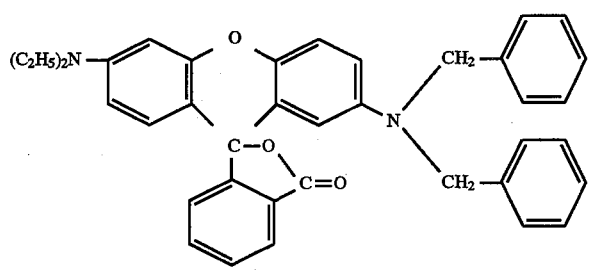

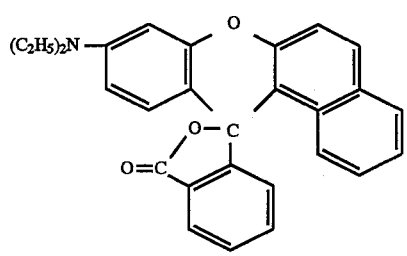

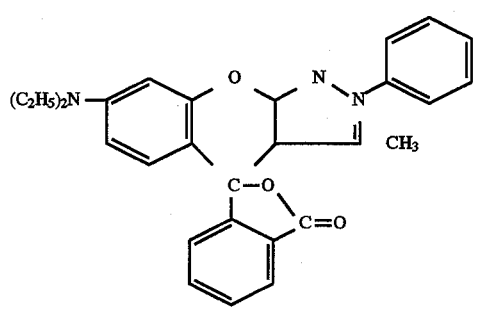

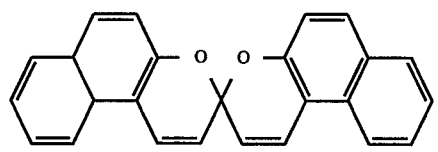

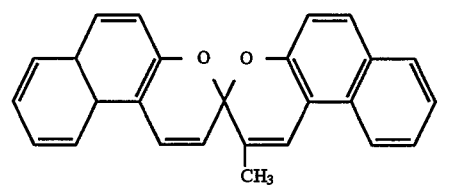

A memory effect imparting agent selected from among the above substances is added in the ratio of 0.001 to 1 part by weight, particularly 0.001 to 0.1 part by weight, to 1 part by weight of an organic photoconductive substance. If the amount of memory effect imparting agent added exceeds 1 part by weight, the amplifying function of the photoelectric sensor markedly lowers, which is unfavorable.

In some memory effect imparting substances, the spectral sensitivity is not in the visible light region. Therefore, in a case where light information in the visible light region is used, an electron accepting substance, a sensitizing dye, etc. may be added to the photoconductive layer in order to impart thereto sensitivity in the visible light region. Examples of electron accepting substances usable for this purpose are nitro-substituted benzene, diamino-substituted benzene, halogen-substituted benzene, quinones, and trinitrofluorenones. Examples of usable sensitizing dyes are a triphenyl methane dye, a pyrylium salt dye, and a xanthene dye. An electron accepting substance and a sensitizing dye are each added in the ratio of 0.001 to 1 part by weight, preferably 0.01 to 1 part by weight, to 1 part by weight of an organic photoconductive substance. In a case where light information is in the infrared region, a pigment, e.g., phthalocyanine, or a pyrrole or cyantne dye should be added in an amount approximately equal to the above. If the information light used is in the ultraviolet region or a shorter wavelength region, a light-absorbing substance appropriate for the wavelength region concerned should be added in the same amount as the above. Thus, the intended object can be attained.

In the state of being a finished product, the photoelectric sensor produced in the manner described above has no semiconductivity, which characterizes the present invention, and hence cannot be used in the present invention. For the photoelectric sensor to become usable in the present invention, it is allowed to stand for a predetermined time in bright, thereby becoming a sensor capable of exhibiting the desired semiconductivity even in dark. It is also possible to uniformly expose the whole surface of the photoelectric sensor to a sufficient amount of light for exposure before the sensor is actually used.

Although the mechanism in which a rise in conductivity is induced by the memory effect is not clear, it is considered as follows: Electrons at the ground level of the memory effect imparting agent are excited by irradiation with light and raised to the activation level, resulting in holes being produced at the ground level. Since the electron energy level of the memory effect imparting agent and that of the organic photoconductive substance are considered to be relatively close to each other, these substances induce mutual interaction to reach a metastable state. Consequently, the paired ions of the memory effect imparting agent metastably exist, and this is observed as memory property because of the metastable state. It is considered that the metastable paired ions act in the same way as the above-described trap sites, thus inducing a rise in conductivity and an amplifying action.

A photosensitive member which has heretofore been known as a material having memory effect (persistent conductivity) is an insulator in its state of being a finished product without having been subjected to a special treatment, and pattern-shaped persistent conductivity is produced in the course of giving conductivity to the material by applying a light pattern thereto. By utilizing the difference between the insulating portion and the persistent conductivity portion, an image is formed. However, the fact is merely that persistent conductivity occurs. There has been no precedent in which the persistent conductivity is combined satisfactorily with the photocurrent amplifying action. In the present invention, the semiconductive properties which the photoelectric sensor already has when it is to be used are physical properties essential for the amplifying action, which characterizes the present invention. The desired amplifying action occurs only in a photoelectric sensor having semiconductive properties. In a photoelectric sensor having insulating properties, the amplifying action of the present invention does not occur.

Figure 3:
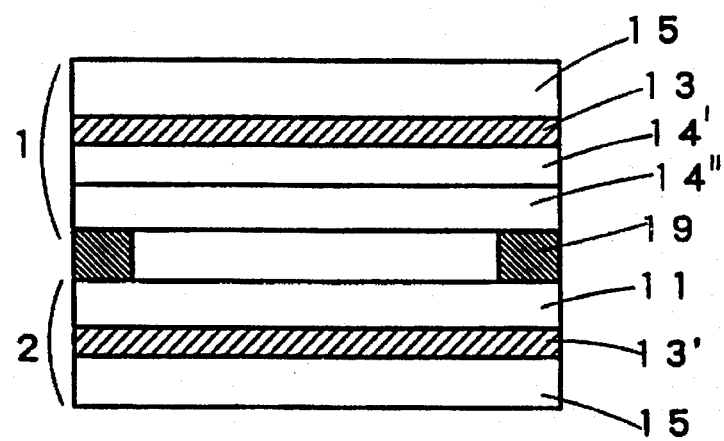
FIG. 3 is a sectional view for explanation of a first information recording system of the present invention.

Next, the information recording system of the present invention will be described. FIG. 3 is a sectional view for explanation of a first information recording system, in which the above-described photoelectric sensor 1 is disposed to face an information recording medium 2 across a spacer 19. The information recording medium 2 has an information recording layer 11 and an electrode 13' successively stacked on a substrate 15. Although in the following information recording system a double-layered photoelectric sensor is shown as an example of the photoelectric sensor, it should be noted that a single-layer photoelectric sensor is usable in the same way.

First, the information recording medium 2 will be explained. There is a case where the information recording medium used in the present invention has an information recording layer formed of a polymer dispersed liquid crystal.

The polymer dispersed liquid crystal has a structure in which resin particles are dispersed in a liquid crystal phase. Examples of usable liquid crystal materials are a smectic liquid crystal, nematic liquid crystal, cholesteric liquid crystal and a mixture of these liquid crystals. However, it is preferable to use a smectic liquid crystal from the point of view of retaining the liquid crystal alignment and holding the recorded information permanently, that is, from the viewpoint of memory effect.

Examples of smectic liquid crystals usable in the present invention are as follows: cyanobiphenyl, cyanoterphenyl and phenylester liquid crystals, in which the end group of a liquid crystalline substance has a long carbon chain; liquid crystal substances that present smectic A phase, e.g., fluorine liquid crystal; liquid crystal substances presenting smectic C phase, which are used as ferroelectric liquid crystals; and liquid crystal substances that present smectic H, G, E or F phase.

It is also possible to use a nematic liquid crystal. By mixing a nematic liquid crystal with a smectic or cholesteric liquid crystal, the memory effect can be enhanced. It is possible to use known nematic liquid crystals, for example, Schiff's base, azoxy, azo, phenyl benzoate, cyclohexyl phenyl ester, biphenyl, terphenyl, phenylcyclohexane, phenylpyridine, phenyloxazine, polycyclic ethane, phenylcyclohexene, cyclohexylpyrimidine, phenyl and tolan liquid crystals. It is also possible to use a mixture of a liquid crystal material and a polyvinyl alcohol or the like which is prepared in the form of micro-capsules. It should be noted that it is preferable to select a liquid crystal material having higher anisotropy of refractive index with a view to obtaining a higher contrast.

Examples of materials which are preferable to use for forming the resin phase are ultraviolet curing resin materials which are compatible with a liquid crystal material or a common solvent therewith in the form of a monomer or an oligomer. Examples of such ultraviolet curing resin materials are acrylic and methacrylic esters, i.e., multifunctional monomers and multifunctional urethane and ester oligomers, e.g., dipentaerythritol hexaacrylate, trimethylolpropane triacrylate, polyethylene glycol diacrylate, polypropylene glycol diacrylate, isocyanuric acid (ethylene oxide modified) triacrylate, dipentaerythritol pentaacrylate, dipentaerythritol tetraacrylate, neopentyl glycol diacrylate, hexanediol diacrylate, etc., and monofunctional monomers or oligomers, e.g, nonyl phenol modified acrylate, N-vinyl-2-pyrrolidone, 2-hydroxy-3-phenoxypropyl acrylate, etc.

As to the solvent, any common solvent can be used, for example, hydrocarbon solvents represented by xylene, halogenated hydrocarbon solvents represented by chloroform, alcohol derivative solvents represented by methyl cellosolve, and ether solvents represented by dioxane.

Examples of photo-curing agents usable in the present invention to cure an ultraviolet curing resin are 2-hydroxy-2-methyl-1-phenylpropane-1-one ("Darocure 1173", manufactured by Merck & Co., Inc.), 1-hydroxycyclohexyl phenyl ketone ("Irgacure 184", manufactured by Ciba-Geigy Ltd.), 1-(4-isopropylphenyl)-2-hydroxy-2-methylpropane-1-one ("Darocure 1116", manufactured by Merck & Co., Inc.), benzyl dimethyl ketal ("Irgacure 651", manufactured by Ciba-Geigy Ltd.), 2-methyl-1-[4-(methylthio)phenyl]-2-morpholinopropanone-1 ("Irgacure 907", manufactured by Ciba-Geigy Ltd.), a mixture of 2,4-diethylthioxanthone ("Kayacure DETX", manufactured by Nippon Kayaku Co., Ltd.) and p-dimethylamino ethyl benzoate ("Kayacure EPA", manufactured by Nippon Kayaku Co., Ltd.), and a mixture of isopropylthioxanthone ("Quantacure. ITX", manufactured by Wordblekinsop Co., Ltd.) and p-dimethylamino ethyl benzoate. However, 2-hydroxy-2-methyl-1-phenylpropane-1-one, which is liquid, is particularly preferable from the viewpoint of compatibility with a liquid crystal and a resin material, e.g., a polymer forming monomer or oligomer.

It is preferable to use a liquid crystal and a resin material in such a ratio that the liquid crystal content in the information recording layer is 10% to 90% by weight, more preferably 40% to 80% by weight. If the liquid crystal content is less than 10% by weight, light transmittance is low even when the molecules in the liquid crystal phase are aligned by recording of information, whereas, if the liquid crystal content exceeds 90% by weight, the liquid crystal oozes to the surface and the side of the information recording layer, causing unevenness of the recorded information. By allowing the information recording layer to contain a large amount of liquid crystal, the contrast ratio can be improved, and the operating voltage can be lowered.

The information recording layer is formed by a method wherein a mixed solution, which is prepared by dissolving or dispersing a resin material, a liquid crystal, a photo-curing agent, etc. in a solvent, is coated on an electrode layer by a coating method using a blade coater, a roll coater or a spin coater, and the resin material is cured by light or heat. If necessary, a leveling agent may be added to the mixed solution to improve the coatability of the solution and to thereby obtain excellent surface properties.

In addition, it is necessary to heat the mixed solution of a resin material and a liquid crystal to a level higher than the temperature at which the mixed solution maintains its isotropic phase, and to dissolve the liquid crystal and the ultraviolet curing resin material in each other completely. In this way, it is possible to obtain an information recording layer in which the resin phase and the liquid crystal phase are uniformly dispersed. If the information recording layer is ultraviolet-cured at a temperature lower than the temperature at which the liquid crystal shows an isotropic phase, large phase separation occurs between the liquid crystal and the resin material, thus giving rise to problems. That is, the liquid crystal domain grows excessively, preventing the skin layer from being formed completely over the surface of the information recording layer, so that the liquid crystal will ooze out. In addition, the ultraviolet curing resin material is matted, so that it becomes difficult to take in information accurately. Further, there are cases where the ultraviolet curing resin material cannot even retain the liquid crystal and hence no information recording layer is formed. On the other hand, if heating is needed for maintaining the isotropic phase when the solvent is evaporated, particularly, wetting properties of the mixed solution with respect to the electrode layer lower, making it impossible to obtain a uniform information recording layer.

Further, a fluorocarbon surface-active agent may be added for the purpose of maintaining the wetting properties with respect to the electrode layer and forming a film over the surface of the information recording layer. Examples of fluorocarbon surface-active agents usable for this purpose include Fluorad FC-430 and FC-431 (manufactured by Sumitomo 3M (K.K.)), N-(n-propyl)-N-(β-acryloxyethyl)-perfluorooctyl sulfonamide (EF-125M, manufactured by Mitsubishi Material Co., Ltd.), N-(n-propyl)-N-(β-methacryloxyethyl)-perfluorooctyl sulfonamide (EF-135M, manufactured by Mitsubishi Material Co., Ltd.), perfluorooctanesulfonic acid (EF-101, manufactured by Mitsubishi Material Co., Ltd.), perfluorocaprylic acid (EF-201, manufactured by Mitsubishi Material Co., Ltd.), and N-(n-propyl)-N-perfluorooctane sulfonamide ethanol (EF-121, manufactured by Mitsubishi Material Co., Ltd.), and further include EF-102, EF-103, EF-104, EF-105, EF-112, EF-121, EF-122A, EF-122B, EF-122C, EF-122A3, EF-123A, EF-123B, EF-132, EF-301, EF-303, EF-305, EF-306A, EF-501, EF-700, EF-201, EF-204, EF-351, EF-352, EF-801, EF-802, EF-125DS, EF-1200, EF-L102, EF-L155, EF-L174 and EF-L215, which are manufactured by Mitsubishi Material Co., Ltd.). It is also possible to use 3-(2-perfluorohexyl)ethoxy-1,2-dihydroxypropane (MF-100, manufactured by Mitsubishi Material Co., Ltd.), N-n-propyl-N-2,3-dihydroxypropylperfluorooctyl sulfonamide (MF-110, manufactured by Mitsubishi Material Co., Ltd.), 3-(2-perfluorohexyl)ethoxy-1,2-epoxypropane (MF-120, manufactured by Mitsubishi Material Co., Ltd.), N-n-propyl-N-2,3-epoxypropylperfluorooctyl sulfonamide (MF-130, manufactured by Mitsubishi Material Co., Ltd.), perfluorohexyl ethylene (MF-140, manufactured by Mitsubishi Material Co., Ltd.), N-[3-trimethoxysilyl)propyl] perfluoroheptyl carboxylic acid amide (MF-150, manufactured by Mitsubishi Material Co., Ltd.), N-[3-trimethoxysilyl)propyl] perfluoroheptyl sulfonamide (MF-160, manufactured by Mitsubishi Material Co., Ltd.), etc. The fluorocarbon surface-active agent is used in the proportions of 0.1% to 20% by weight to the total amount of liquid crystal and resin material used.

In addition, the concentration of solid matter in the coating solution used for formation of an information recording layer is preferably set in the range of 10% to 60% by weight. When the coating layer is to be cured, curing conditions, i.e., the kind of resin material used, concentration, coating layer temperature and ultraviolet irradiation conditions, are properly set, thereby making it possible to form a skin layer made of only a resin layer, that is, having no liquid crystal phase, as an outer surface layer. Thus, it is possible to increase the proportion of liquid crystal used in the information recording layer and also possible to prevent the liquid crystal from oozing out on the surface of the information recording layer.

Although ultraviolet curing resin materials have been described as resin materials, it is also possible to use thermosetting resin materials which are compatible with a solvent common to the liquid crystal material, for example, an acrylic resin, methacrylic resin, polyester resin, polystyrene resin, copolymers composed mainly of these resin materials, epoxy resin, silicone resin, etc.

Since the thickness of the information recording layer influences the definition of recorded information, it is preferable to set the thickness of the layer after it has been dried in the range of 0.1 μm to 10 μm, more preferably 3 μm to 8 μm. By doing so, the operating voltage can be lowered with the definition maintained at high level. If the information recording layer is excessively thin, the contrast of the information recording part becomes low, whereas, if the layer is excessively thick, the operating voltage becomes high.

If the information recording layer has self-supporting properties and hence the substrate is omitted, since a skin layer is formed on the surface of the information recording layer, an ITO film, for example, can be stacked thereon by vapor deposition, sputtering or the like without cracking and without lowering in electrical conductivity. In such a case, the information recording medium is preferably produced by providing an electrode on the information recording layer provided on a temporary substrate and then separating the temporary substrate from the information recording layer.

The electrode 13' of the information recording medium is provided on the substrate 15 by using the same material as that for the electrode 13 of the above-described photoelectric sensor and the same forming method as that for the electrode 13.

The information recording medium is disposed to face the photoelectric sensor across the spacer 19, as shown in FIG. 3, and the electrodes 13 and 13' are connected to each other through a voltage source V, thereby forming a first information recording system. At least one of the electrodes 13 and 13' in this system must be transparent.

The spacer is preferably formed by using an insulating resin film, for example, a polyester such as polyethylene terephthalate, polyimide, polyethylene, polyvinyl chloride, polyvinylidene chloride, polyacrylonitrile, polyamide, polypropylene, cellulose acetate, ethyl cellulose, polycarbonate, polystyrene, polytetrafluoroethylene, etc. The spacer may also be formed by coating and drying a solution of one of the above resin materials. If an electrode pattern is formed so as not to overlap the spacer, the spacer may be formed by vapor deposition using a metallic material, e.g., aluminum, selenium, tellurium, gold, platinum, zinc, copper, iron, tin, etc., or an inorganic or organic compound. The thickness of the spacer defines the air gap length between the photoelectric sensor and the information recording medium and has an effect on the distribution of a voltage applied to the information recording layer. Therefore, the thickness of the spacer is preferably 100 µm or less, more preferably in the range of 3 µm to 30 µm.

Figure 4:
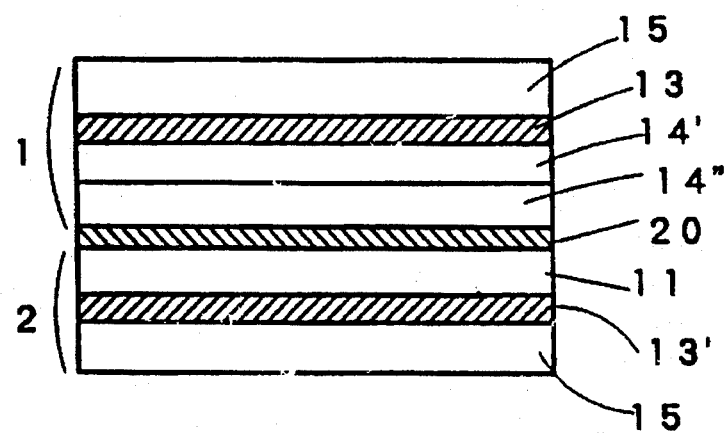
FIG. 4 is a sectional view for explanation of a second information recording system of the present invention.

Next, a second information recording system will be explained. FIG. 4 is a sectional view of the second information recording system according to the present invention, in which reference numeral 20 denotes a dielectric layer, and the same reference numerals as those in FIG. 2 denote the same contents.

The second information recording system is arranged such that the photoelectric sensor and the information recording medium in the first information recording system are disposed to face each other across a dielectric layer 20 without an air gap. The second information recording system is particularly suitable for an arrangement in which the photoconductive layer of the photoelectric sensor is formed by coating using a solvent. The arrangement of the second information recording system makes it possible to prevent unevenness of the recorded image which might otherwise be caused by elution of the liquid crystal from the information recording layer by the interaction between the photoconductive layer and the information recording layer if the latter is coated directly on the former, or elution of the photoconductive material by a solvent used for forming the information recording layer. It is also possible to integrate the photoelectric sensor and the information recording medium into one unit.

The material for forming the dielectric layer 20 needs to be incompatible with either of the materials for forming the photoconductive layer and the information recording layer and must not have electrical conductivity. If the material is electrically conductive, the space charge is diffused, causing deterioration of the resolution. Therefore, insulating properties are required. However, since the dielectric layer lowers the voltage distributed to the liquid crystal layer or degrades the definition, it is preferable for the layer thickness to be as small as possible, preferably 2 µm or less. On the other hand, reduction in the layer thickness gives rise to not only generation of information noise due to the interaction that progresses with the passage of time but also the problem of permeation due to defects such as pinholes at the time of coating the material for stacking the layer. Since the permeability depends on the proportion of the solid content of the material to be coated for stacking, the kind of solvent used and the viscosity, the layer thickness is properly set in accordance with the material which is to be coated. The layer thickness is preferably 10 µm or less, more preferably in the range of 0.1 µm to 3 µm. When the voltage distribution to each layer is taken into consideration, it is preferable to use a material having a high dielectric constant as well as to minimize the layer thickness.

For example, the dielectric layer is preferably formed by depositing an inorganic material, e.g., $SiO_2$, $TiO_2$, $CeO_2$, $Al_2O_3$, $GeO_2$, $Si_3N_4$, AlN, TiN, etc., by vapor deposition, sputtering, chemical vapor deposition (CVD), etc. It is also possible to use an aqueous solution of polyvinyl alcohol, water-system polyurethane, water glass, etc. as a water-soluble resin material which is less compatible with an organic solvent and to coat such an aqueous solution by spin coating, blade coating, roll coating and so forth. Further, a coatable fluorocarbon resin may also be used. In such a case, it may be dissolved in a fluorine-containing solvent and coated by spin coating or stacked by blade coating, roll coating, etc.

Coatable fluorocarbon resins which are preferable to use include fluorocarbon resins disclosed, for example, in Japanese Patent Application Laid-Open (KOKAI) No. 01-131215, and organic materials, e.g., poly-para-xylylene, etc., which are subjected to film formation in a vacuum system.

Figure 20:
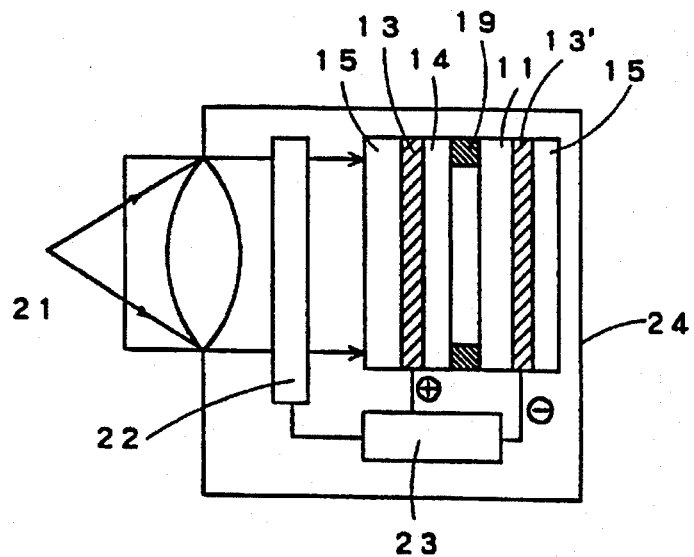
FIG. 20 illustrates an information recording method of the present invention.

The following is a description of an information recording method for the first and second information recording systems of the present invention. FIG. 20 is a sectional view for explanation of the information recording method for the first information recording system of the present invention. For the second information recording system also, the information recording method is carried out in the same way. In the figure, reference numeral 11 denotes an information recording layer, 13 an electrode of a photoelectric sensor, 13' an electrode of an information recording medium, 14 a photoconductive layer, 21 a light source, 22 a shutter having a driving mechanism, 23 a pulse generator serving as a power source, and 24 a camera obscura.

When information light is incident on the information recording system with a voltage applied between the electrodes 13 and 13' from the pulse generator 23, photocarriers are generated in the photoconductive layer 14 at the region where the light is incident, and the photocarriers move as far as the interface of the photoconductive layer 14 on the side thereof which is closer to the information recording layer 11 by the electric field formed by the two electrodes 13 and 13', causing redistribution of the voltage. As a result, the molecules in the liquid crystal phase in the information recording layer 11 are aligned in the pattern of information light, thereby recording the desired information. The voltage application time and the exposure time may be properly set according to the imaging conditions. The voltage application time is preferably in the range of 2 msec. to 200 msec., and the exposure time is preferably in the range of 1/200 sec. to 1/2 sec.

When the information recording layer of the information recording medium is a polymer dispersed liquid crystal in particular, the sensitivity of the photoelectric sensor must be set in the operating voltage region of the liquid crystal. That is, the contrast voltage, which is a difference between the potential (light potential) applied to the information recording medium at the exposed region and the potential (dark potential) applied to the information recording medium at the unexposed region, must be set at a high level in the operating region of the crystal liquid in the information recording medium.

Therefore, the dark potential that is applied to the liquid crystal layer at the unexposed region of the photoelectric sensor, for example, must be set at a level approximately equal to the operation initiating potential of the liquid crystal. Accordingly, the photoelectric sensor is required to have a conductivity at which a base current in the range of $10^{-4}$ A/cm$^2$ to $10^{-7}$ A/cm$^2$, preferably in the range of $10^{-5}$ A/cm$^2$ to $10^{-7}$ A/cm$^2$, is generated under the condition where the resistivity of the information recording medium is in the range of $10^{10}$ ohm-cm to $10^{13}$ ohm-cm and an electric field of $10^5$ V/cm to $10^6$ V/cm is given to the photoelectric sensor. With a photoelectric sensor in which the base current is less than $10^{-7}$ A/cm$^2$, the molecules in the liquid crystal phase are not aligned even if exposure light is applied. With a photoelectric sensor in which the base current exceeds $10^{-4}$ A/cm$^2$, a large current flows at the same time as the voltage application is initiated even if no exposure light is applied, causing the molecules of the liquid crystal to be aligned. Therefore, even if exposure is carried out, no transmittance difference can be obtained between the exposed and unexposed regions. In addition, a photoelectric sensor in which the base current is less than $10^{-7}$ A/cm$^2$ shows no amplifying action as occurs in the present invention in the electric field strength region of $10^5$ V/cm to $10^6$ V/cm. Even if the base current value is made equal to or more than $10^{-7}$ A/cm by applying an electric field of $10^6$ V/cm or more, the exceedingly high field strength will invite electric discharge breakdown and image noise. Therefore, such method is unfavorable.

In addition, since the operating voltage and its range differ among liquid crystals, when the level of applied voltage and voltage application time are to be set, it is preferable to properly set the voltage distribution in the information recording medium so that the voltage distributed to the information recording layer will fall in the operating voltage region of the liquid crystal used.

In some cases, the information recording method of the present invention may be carried out in the following manner, depending upon the type of photoelectric sensor. That is, in order to generate photocarriers in the photoelectric sensor before the application of a voltage between the electrodes 13 and 13', uniform, strong exposure is first carried out for 30 sec. or longer with light of 1,000 lux, for example, and then exposure is carried out in dark under voltage application.

The information recording method of the present invention enables planar analog recording and makes it possible to obtain recording at the liquid crystal particle level and hence high resolution, and it also permits the exposure light pattern to be retained in the form of a visible image by the molecular alignment in the liquid crystal phase.

To record information with the information recording system, a method that uses a camera or a recording method that uses laser may be employed. The recording method by a camera uses an information recording medium in place of a photographic film used in an ordinary camera. Either an optical or electrical shutter can be used for this camera. It is also possible to conduct color photography by using a color filter by which light information is separated into R, G and B light components and taken out in the form of parallel rays through prisms, and forming one frame from three information recording mediums for R, G and B light components or from one set of R, G and B images recorded on different portions of one information recording medium.

In the recording method by laser, argon laser (514 nm, 488 nm), helium-neon laser (633 nm) or semiconductor laser (780 nm, 810 nm, etc.) may be used as a light source. Laser exposure corresponding to an image signal, character signal, code signal or line drawing signal is performed by scanning. Analog recording such as recording of an image is effected by modulating the intensity of laser light, whereas digital recording such as recording of characters, code or line drawing is effected by on/off control of laser light. An image that consists of halftone dots is formed by on/off controlling laser light through a dot generator. It should be noted that the photoconductive layer in the photosensitive member need not have panchromatic spectral characteristics, but it is only required to have sensitivity to the wavelength of the laser light source employed.

Figure 21:
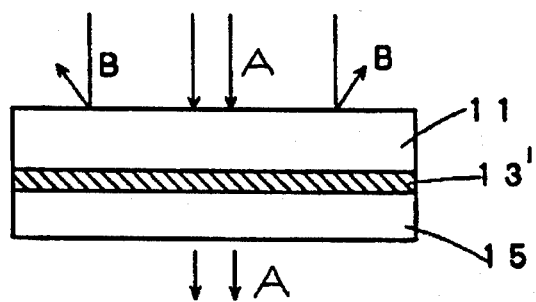
FIG. 21 illustrates a method of reproducing recorded information from an information recording system of the present invention.

The exposure light information recorded on the information recording medium is reproduced by transmitted light, as shown in FIG. 21. In the case of the first information recording system, light is applied to the information recording medium separated from the system, whereas, in the case of the second information recording system, light is applied thereto in this state, without separating the information recording medium. Consequently, in the information recording region, light A is transmitted because the liquid crystal molecules are aligned in the direction of the electric field, whereas, in the region where no information has been recorded, light B is scattered, thus presenting a contrast with the information recording region. The recorded information may be read by reflected light by use of a light-reflecting layer.

Information that is recorded by the molecular alignment in the liquid crystal is visible information which can be read by visual observation, and it can also be read in the form of an enlarged image by using a projector. When laser scanning or CCD is used, the information can be read with high accuracy. It should be noted that occurrence of scattered light can be prevented by using a Schlieren optical system, if necessary.

In the above-described information recording medium, information recorded by exposure light is made visible by the molecular alignment in the liquid crystal, and the information once made visible can be kept from disappearing by properly selecting a combination of a liquid crystal and a resin material. Thus, memory properties can be imparted to the information recording medium. Since the recorded visible information can be erased by heating the information recording medium to a high temperature near the isotropic phase transition temperature, the information recording medium can be reused.

As the information recording medium in the information recording system, it is also possible to use an electrostatic information recording medium having an electric charge retaining layer as an information recording layer, as described, for example, in Japanese Patent Application Laid-Open (KOKAI) Nos. 03-7942, 05-107775, 05-107776, 05-107777, and 04-70842. In this case/information is stored in the form of an electrostatic charge in the information recording medium. Therefore, the electrostatic charge can be reproduced by toner development, or by an electric potential reading method as described, for example, in Japanese Patent Application Laid-Open (KOKAI) No. 01-290366. However, since in the photoelectric sensor of the present invention the base current is larger than in the case of the conventional photoelectric sensors, and the dark potential is inevitably high. Therefore, correction must be made in the potential reading process.

It is also possible to use an information recording medium having a thermoplastic resin layer as an information recording layer, as described, for example, in Japanese Patent Application Laid-Open (KOKAI) No. 04-46347. In this case, after information has been stored in the form of an electrostatic charge on the surface of the information recording medium in the same way as the above, the thermoplastic resin layer is heated to thereby store the information as a frost image, which can be reproduced as visible information. Since in this case also the dark potential is high, consideration must be given when image formation is effected.

The photoelectric sensor of the present invention, which is used for recording light information on an information recording medium, has a photoconductive layer formed on an electrode. The photoelectric sensor has semiconductive properties. When information exposure is carried out with a voltage being applied between the photoelectric sensor and the information recording medium, the electric field or electric charge given to the information recording medium is amplified. If the voltage is continuously applied even after the termination of the information exposure, the photoelectric sensor sustains the electrical conductivity and continuously gives the electric field or electric charge to the information recording medium. Although the reason for the characteristics of the photoelectric sensor is not clear, it is considered that in the photoelectric sensor of the present invention all photocarriers generated as a result of the irradiation with information light do not move in the direction of the width of the photoconductive layer under the voltage application condition, but some photocarriers are trapped in trap sites present in the photoconductive layer or at the interface between the electrode and the photoconductive layer, and trapped carriers are accumulated with time, so that under the voltage application condition, a current induced by the trapped carriers flows in addition to the photocurrent generated by exposure, amplifying the apparent photocurrent. It is further surmised that when exposure is terminated with the voltage application condition maintained, photocarriers generated by the exposure immediately decay and disappear, but the decay of the trapped carriers is gentle, and hence the current induced by the trapped carriers flows in a sufficient amount although it decays.

Consequently, the use of the photoelectric sensor of the present invention enables information recording of high sensitivity to be effected on an information recording medium.

Examples of the present invention will be described below.

EXAMPLE 1

(Preparation of a double-layered photoelectric sensor)

On a glass substrate having a thickness of 1.1 mm and thoroughly cleaned, an ITO film having a sheet resistivity of 800 ohm/sq. and a thickness of 100 nm was grown by sputtering to obtain an electrode. The electrode was subjected to a cleaning treatment twice by using a scrubber cleaning machine (Plate Cleaner, Model 602, trade name, manufactured by Ultratech Co., Ltd.). The cleaning treatment was comprised of spraying of pure water for 2 sec., scrubber cleaning for 20 sec., rinsing with pure water for 15 sec., removal of water by high-speed rotation for 25 sec., and infrared drying for 55 sec. The surface of the electrode thus treated was coated with a coating solution in 0.4 sec. by a spinner at 1,400 rpm. The coating solution was prepared by mixing 3 parts by weight of a fluorenone-azo pigment having the following structure as a charge generating substance, 1 part by weight of a polyester resin material (Vylon 200, manufactured by Toyobo Co., Ltd.), 98 parts by weight of 1,4-dioxane, and 98 parts by weight of cyclohexanone and shaking the mixture for 6 hours in a paint shaker.

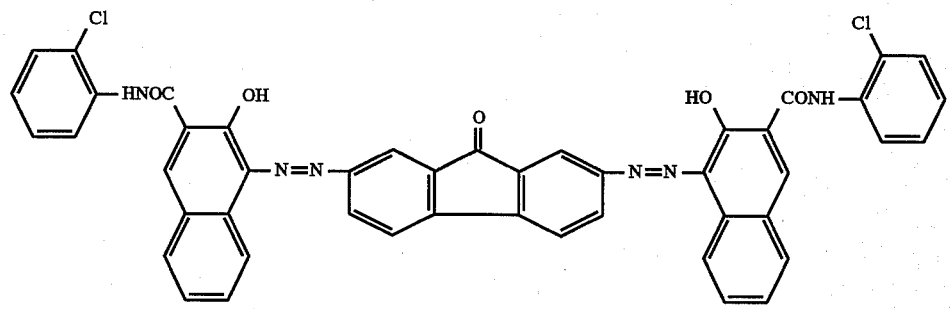

After the coating process, the coated electrode was allowed to stand under a calm condition until a dry film was formed on the surface of the coating so that the surface of the coating film was unadherable, thereby effecting leveling drying. Thereafter, drying was carried out for 1 hour at 100° C. Thus, a charge generation layer having a thickness of 0.3 μm was stacked on the electrode.

The surface of the charge generation layer was coated with a coating solution in 0.4 sec. by a spinner at 400 rpm. The coating solution was prepared by uniformly dissolving 25 parts by weight of a para-dimethyl stilbene having the following structure as a charge transport substance, and 5 parts by weight of a polystyrene resin material (HRM-3, manufactured by Denki Kagaku Kogyo K.K.) in 102 parts by weight of chlorobenzene and 68 parts by weight of dichloromethane.

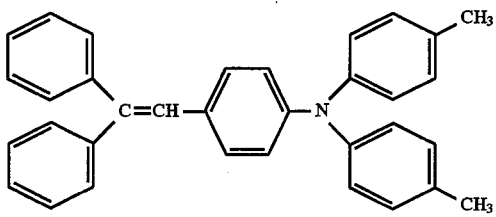

After leveling drying, the coating was dried for 2 hours at 80° C., thereby stacking a charge transport layer on the charge generation layer, and thus obtaining a photoelectric sensor having a photoconductive layer of 20 μm in thickness that comprised the charge generation and transport layers. The results of measurement for the photoelectric sensor of the present invention will be shown below. The measurement was carried out after the photoelectric sensor had been aged for 3 days in dark at a relative humidity of not higher than 60%.

(Electrical characteristics of the photoelectric sensor)

To measure the electrical characteristics of the photoelectric sensor obtained as described above, a sample for measurement was prepared by depositing a gold electrode having a size of 0.16 cm$^2$, a thickness of 10 nm and a sheet resistivity of 1,000 ohm/sq. on the charge transport layer of the photoelectric sensor, and a current measuring system as shown in FIG. 12 was constructed. In the figure, reference numeral 15 denotes a photoelectric sensor substrate, 13 a photoelectric sensor electrode, 14 a photoconductive layer including a charge generation layer and a charge transport layer, 30 a gold electrode, 31 a light source, 32 a shutter (No. 0 electromagnetic shutter, manufactured by Copal Co., Ltd.), 33 a shutter driving mechanism, 34 a pulse generator (manufactured by Yokogawa Rewlett-Packard Co.), and 35 an oscilloscope.

In the current measuring system, a DC voltage of 300 V was applied between the photoelectric sensor electrode 13 as a positive electrode and the gold electrode 30 as a negative electrode, and at the same time, light was applied from the glass substrate side for 0.033 sec. 0.5 sec. after the initiation of the voltage application. In this state, the current flowing in the photoelectric sensor was measured with the light irradiation initiation time set at t=0. As the light for irradiation, green light was selected from light emitted from a xenon lamp (L2274, manufactured by Hamamatsu Photonics K.K.) as a light source by using a green filter (manufactured by Vacuum Optics Co., of Japan), and the intensity of light was measured with an illuminometer (manufactured by Minolta Camera Co., Ltd.) to obtain green light having a luminous intensity of 20 lux. FIG. 5 shows the filter characteristics.

The voltage application was continued for 0.15 sec. from the light irradiation initiation time even after the termination of the light irradiation, and the change of current with time during the voltage application was measured with the oscilloscope 35. In another experiment, no exposure was carried out, but the voltage application alone was performed, and the change of current with time was measured in the same way as the above. It should be noted that the measurement was carried out at room temperature.

The results of the measurement are shown in FIG. 13. In the graph of the figure, the axis of abscissas represents the voltage application time (second), and the axis of ordinates represents the current density (A/cm$^2$). In the figure, the line A shows the measured current value in the case where exposure was carried out, and the line B shows the measured current value in the case where no exposure was carried out, but the voltage application alone was performed.

As shown by the line A, two points (a) and (b) of inflections are observed on the curve representing the amount of current flowing in the photoelectric sensor of the present invention. It is considered from the comparison with a comparative sensor (described later) that the amount of current below the inflection point (a) is the amount of current flowing in proportion to the quantity of exposure energy (the current will be hereinafter referred to as "photo-induced current"), whereas the current above the inflection point (a) is the photo-induced current amplified by the photoelectric sensor. The inflection point (b) is a point of change in the amount of current due to the termination of the exposure. Thus, it will be understood that even after the termination of the exposure and even when no exposure is carried out, a current corresponding to the applied voltage continuously flows, and the current gradually decays. In other words, it will be understood from FIG. 13 that in the photoelectric sensor of the present invention, the photo-induced current continues to increase during the exposure, and it continuously flows even after the termination of the exposure and gradually decays after a predetermined time.

The resistivity was determined to be 1.6×10$^{11}$ ohm-cm from the value of current flowing in the photoelectric sensor.

(Preparation of an information recording medium)

On a glass substrate having a thickness of 1.1 mm, an ITO film having a thickness of 100 nm was grown as an electrically conductive layer by sputtering, thereby obtaining an electrode. Thereafter, the surface of the electrode was cleaned.

The surface of the electrode was coated with a coating solution by using a blade coater provided with a gap of 50 μm. The coating solution was obtained by uniformly dissolving 40 parts by weight of a multifunctional monomer (dipentaerythritol hexaacrylate, M-400, manufactured by Toa Gosei Chemical Industry Co., Ltd.), 2 parts by weight of a photo-curing initiator (2-hydroxy-2-methyl-1-phenylpropane-1-one, Darocure 1173, manufactured by Merck & Co., Inc.), 50 parts by weight of a liquid crystal [90% of which was a smectic liquid crystal (S-6, manufactured by Merck & Co., Ltd.) and 10% of which was a nematic liquid crystal (E31LV, manufactured by Merck & Co., Ltd.)], and 3 parts by weight of a surface-active agent (Fluorad FC-430, manufactured by Sumitomo 3M) in 96 parts by weight of xylene. The coating was dried for 3 minutes at 47° C. and then vacuum-dried for 2 minutes at 47° C. Immediately thereafter, the dry coating film was cured by irradiation with ultraviolet rays at 0.3 J/cm$^2$, thereby obtaining an information recording medium having an information recording layer of 6 μm in thickness.

A cross-section of the information recording layer was dried after the liquid crystal had been extracted with hot methanol, and then the internal structure of the information recording layer was observed with a scanning electron microscope having a magnifying power of 1,000 (S-800, manufactured by Hitachi, Ltd.). As a result, it was revealed that the surface of the information recording layer was covered with the ultraviolet curing resin material having a thickness of 0.6 μm and the inside of the layer had a structure in which the liquid crystal phase that formed a continuous layer was filled with the resin particle phase having a particle diameter of 0.1 μm.

(Information recording method)

The photoelectric sensor of the present invention and the information recording medium, prepared as described above, were disposed to face each other across an air gap defined by a spacer of polyimide film having a thickness of 10 μm.

The stack structure thus obtained was incorporated in an information recording system as shown in FIG. 20. A DC voltage of 750 V was applied between the respective electrodes of the photoelectric sensor and the information recording medium for 0.05 sec., and at the same time, exposure was carried out by projecting a gray scale from the photoelectric sensor side for 1/30 sec. at an exposure of 0.2 to 200 lux with an imaging camera (made by reconstructing RB67, manufactured by Mamiya Camera Co., Ltd.). After the exposure, the information recording medium was taken out. As a result, record regions comprising light-transmitting portions corresponding to the gray scale were observed on the information recording layer.

Figure 22:
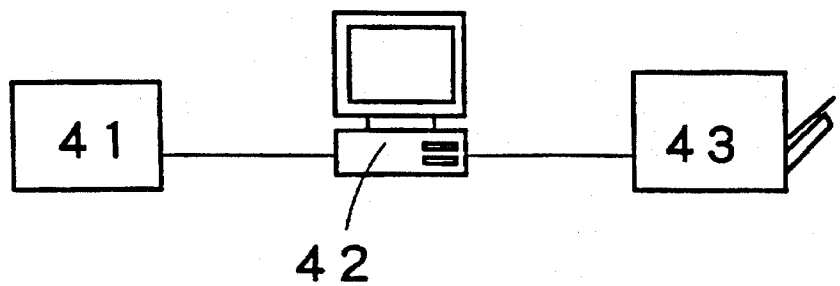
FIG. 22 illustrates another method of reproducing recorded information from an information recording system of the present invention.

Next, the information recorded on the information recording medium was reproduced by an information output system constructed as shown in FIG. 22. In the figure, reference numeral 41 denotes a film scanner, 42 a personal computer, and 43 a printer.

The information recorded on the information recording medium was read with a scanner (made by reconstructing LS-3500, manufactured by Nikon Corporation) employing a CCD line sensor, and the read information was output by using a sublimation transfer printer (SP-5500, manufactured by JVC). As a result, a favorable print corresponding to the gray scale was obtained.

(Preparation of a comparative photoelectric sensor and electrical characteristics thereof)

On a glass substrate having a thickness of 1.1 mm and thoroughly cleaned, an ITO film having a thickness of 100 nm was grown by sputtering to obtain an electrode. The electrode was subjected to a cleaning treatment twice by using a scrubber cleaning machine (Plate Cleaner, Model 602, trade name, manufactured by Ultratech Co., Ltd.). The cleaning treatment was comprised of spraying of pure water for 2 sec., scrubber cleaning for 20 sec., rinsing with pure water for 15 sec., removal of water by high-speed rotation for 25 sec., and infrared drying for 55 sec.

Next, $SiO_2$ was stacked on the electrode to a thickness of 100 nm by electron beam vapor deposition, thereby forming an insulating layer. Further, a double-layered photoconductive layer was provided on the insulating layer in the same way as in Example 1, thereby preparing a photoelectric sensor.

Electrical characteristics of this photoelectric sensor were measured by using a current measuring system similar to that used in Example 1. The results of the measurement are shown in FIG. 14. In another experiment, no exposure was carried out, but the voltage application alone was performed, and the change of current with time was measured in the same way as the above. The results of the measurement are also shown in the figure. It will be understood from the figure that only when exposure is carried out, an increase in the photocurrent according to the light irradiation is observed, and since there is no photocurrent amplifying action, the current obtained is substantially equal to the steady-state current, and hence the amount of current that contributes to the information recording is not much, and that when the exposure is terminated, the current immediately decays and disappears.

An information recording system similar to the above was prepared by using the comparative photoelectric sensor and the above-described information recording medium. A DC voltage of 750 V was applied between the two electrodes for 0.05 sec., and at the same time, exposure was carried out by projecting a gray scale from the photoelectric sensor side for 1/30 sec. at an exposure of 0.2 to 200 lux in the same way as in Example 1. After the exposure, the information recording medium was taken out, and the recorded information was read and output by an information output system similar to the above. It was revealed that the information recording medium had no information recorded thereon. For the photoelectric sensor to be used for information recording, it is necessary to apply light of higher intensity or to carry out exposure for a longer time. Thus, the comparative photoelectric sensor cannot be used for information recording of high sensitivity.

(Comparison as to information recording performance between the photoelectric sensor of the present invention and the comparative photoelectric sensor)

Figure 23:
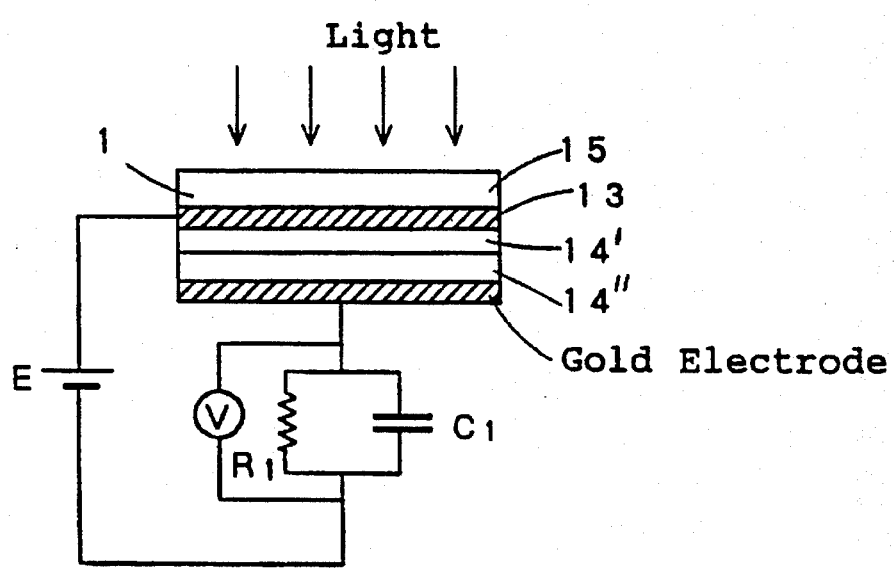
FIG. 23 illustrates a measuring circuit used to evaluate electrical characteristics of the photoelectric sensor according to the present invention.

For comparison as to the performance of recording information onto an information recording medium between the photoelectric sensor of the present invention and the comparative photoelectric sensor, a gold electrode having a size of 0.16 $cm^2$, a thickness of 10 nm and a sheet resistivity of 1,000 ohm/sq. was stacked on the charge transport layer of each photoelectric sensor to prepare a sample for measurement, and a voltage measuring circuit comprising the sample for measurement, a capacitor $C_1$ (160 pF), a resistor $R_1$ (1,000 Mohm) a power source (E), and a voltmeter (V) was prepared, as shown in FIG. 23. The combination of the capacitor and the resistor corresponds to an information recording medium.

Figure 24:
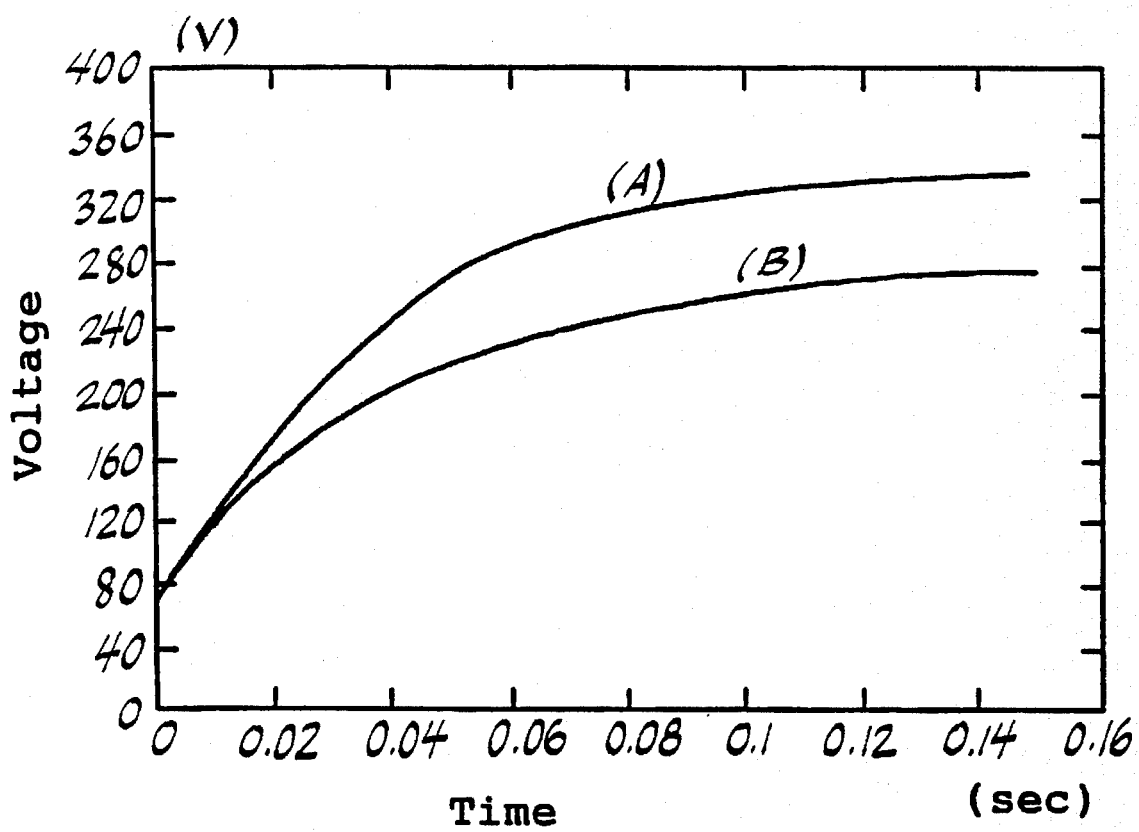
FIG. 24 is a graph showing the changes of voltage in the photoelectric sensor of the present invention when it was exposed and when no exposure was carried out.
Figure 25:
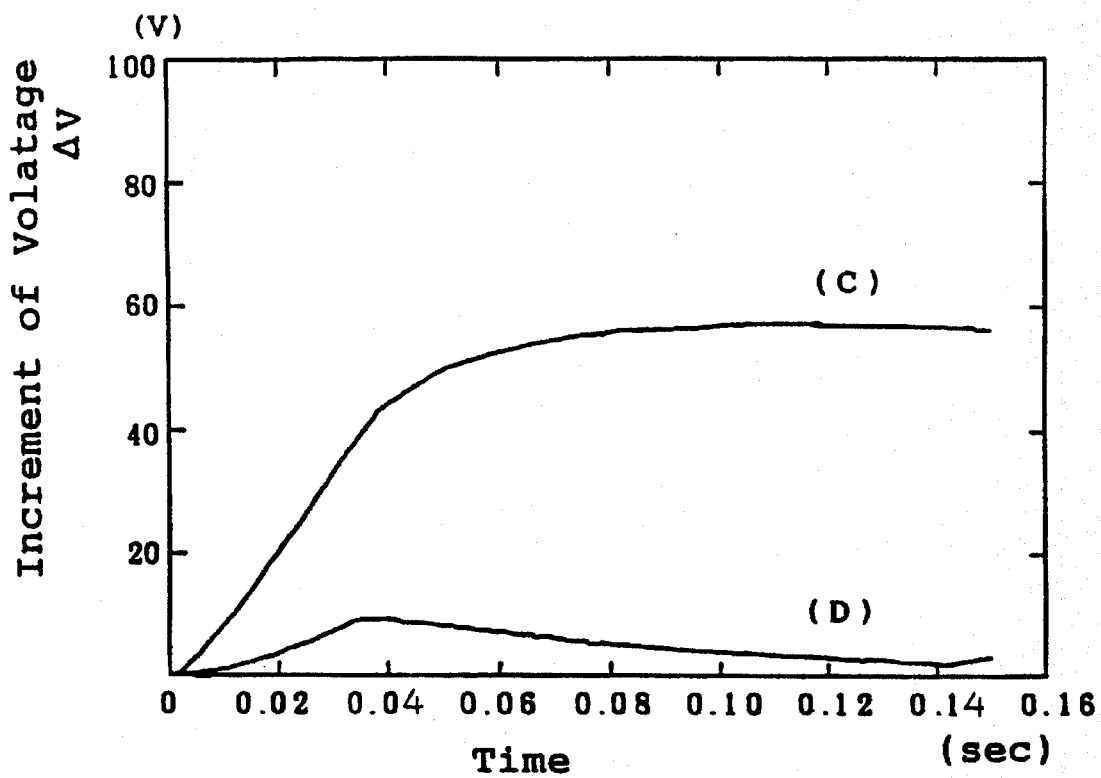
FIG. 25 shows a simulation of a voltage change on an information recording medium when the photoelectric sensor of the present invention was employed.

With the measuring circuit, a predetermined DC voltage (500 V in this Example) was applied between the photoelectric sensor electrode as a positive electrode and the gold electrode as a negative electrode, and at the same time, the sample was irradiated with light from the glass substrate side for 0.033 sec. The behavior of the current flowing in the photoelectric sensor during the time of measurement was measured from the time (t=0) of initiation the light irradiation. It should be noted that as the light for irradiation, green light was selected from light emitted from a xenon lamp (L2274, manufactured by Hamamatsu Photonics K.K.) as a light source by using a green filter (manufactured by Vacuum Optics Co., of Japan), and the intensity of light was measured with an illuminometer (manufactured by Minolta Camera Co., Ltd.) to obtain green light having a luminous intensity of 20 lux. FIG. 5 shows the filter characteristics. Even after the termination of the light irradiation, the voltage application was continued for 0.15 sec. from the initiation of the light irradiation, and the change of the voltage with time during the voltage application was measured with an oscilloscope. The results of the measurement are shown in FIG. 24, together with the results of measurement for another experiment in which exposure was not carried out, but the voltage application alone was performed. In the figure, the line A shows the change of the voltage with time in the case where exposure was carried out, and the line B shows the voltage change in the case where no exposure was carried out. FIG. 25 shows the change with time of the difference between the voltage measured when exposure was carried out and the voltage measured when no exposure was carried out, that is, the change with time of the increment ($\Delta V$) of the voltage caused by the light irradiation. In the figure, the line C shows the increment of the voltage in the case of the photoelectric sensor according to the present invention, and the line D shows that in the case of the comparative photoelectric sensor.

The increment of the voltage may be considered to be information recorded on the information recording medium.

Accordingly, the larger ΔV, the higher the photoelectric sensor performance. It will be confirmed by the results thus obtained that the photoelectric sensor of the present invention is suitable for information recording of high sensitivity in comparison to the comparative photoelectric sensor.

(Comparison as to stored charge light decay characteristics between the photoelectric sensor of the present invention and the comparative photoelectric sensor)

After the photoconductive layer of the photoelectric sensor of the present invention and that of the comparative photoelectric sensor had been corona-charged for 20 sec. at −5 kV, each photoelectric sensor was allowed to stand for 10 sec. to let dark decay occur. Then, green light of 25 lux was applied to the photoelectric sensor for 10 sec., and the change of the surface potential of each photoelectric sensor with time was measured with an electrostatic copying paper testing device (EPA-8100, manufactured by Kawaguchi Denki Works Co., Ltd.). The results of the measurement are shown in FIG. 17. In the graph of FIG. 17, the axis of abscissas represents the time (second) elapsed from the initiation of the corona charging until the termination of light decay, and the axis of ordinates represents the charge potential (V). In the figure, the line E shows the results of the measurement for the photoelectric sensor of the present invention, and the line F shows those for the comparative sensor.

Let us define the surface potential 10 sec. after the termination of the corona charging as acceptance potential. It will be understood from the figure that in the photoelectric sensor of the present invention, there is substantially no acceptance potential, and the dark decay is fast, whereas, in the comparative sensor, the acceptance potential is as high as about −700 V, and the dark decay is slow. Thus, the comparative sensor has stored charge light decay characteristics different from those of the photoelectric sensor of the present invention.

(Comparison as to thermally stimulated current characteristics between the photoelectric sensor of the present invention and the comparative sensor)

In the photoelectric sensor of the present invention, a certain amount of charge has been trapped in the charge trap sites before light amplification is performed. Therefore, it is possible to make an observation by measurement of the thermally stimulated current.

The thermally stimulated current in the photoelectric sensor of the present invention was measured as follows. A sample for measurement was prepared by depositing a gold electrode having a film thickness of 30 nm, a sheet resistivity of 1,000 ohm/sq., and a size of 0.16 cm² on the photoconductive layer, and the thermally stimulated current was measured with a short-circuit thermally stimulated current measuring device (manufactured by Toyo Seiki K.K.), as shown in FIG. 15. A DC voltage of 5 V was applied between the photoelectric sensor electrode as a positive electrode and the gold electrode as a negative electrode, and at the same time, the photoelectric sensor for measurement was heated at a heating rate of 10° C./min. The current flowing during the heating process was measured with a micro-ammeter.

In the figure, reference numeral 15 denotes a photoelectric sensor substrate, 13 a photoelectric sensor electrode, 14 a photoconductive layer including a charge generation layer and a charge transport layer, 30 a gold electrode, 100 a micro-ammeter, and 101 a DC power source. For the micro-ammeter 100 and the DC power source 101, a DC power source with a micro-ammeter (HP4140B, manufactured by Hewlett-Packard Co.) was used.

The temperature of the sample was measured near the sample, that is, at a sample mount part covered with a heat insulation cover, by using an alumel-chromel thermocouple.

The results of the measurement are shown in FIG. 16. In the graph of FIG. 16, the axis of abscissas represents the heating temperature (°C.), and the axis of ordinates represents the current value (A). In the figure, the line A shows the measured values of current flowing in the photoelectric sensor showing amplifying action. The line B shows the current values measured for the photoelectric sensor showing no amplifying action.

As shown by the line A, in the photoelectric sensor having amplifying action according to the present invention, a clear peaked waveform is observed besides the base current in the temperature range of 40° C. to 150° C. In the sample having no amplifying action, on the other hand, such a peaked waveform cannot be observed.

(Aging of the photoelectric sensor)

The change of the condition caused by the aging can be confirmed by the acceptance potential described in the above stored charge light decay measurement. The change of acceptance potential caused by aging was measured by using a sample aged, after the production of it, in dark at room temperature and at a relative humidity of not higher than 60%.

FIG. 18 shows the change of acceptance potential with time with regard to the photoelectric sensor of the present invention. In the graph of FIG. 18, the axis of ordinates represents the acceptance potential (V), and the axis of abscissas represents the aging time (day). At the time when the acceptance potential has become constant, the photoelectric sensor exhibits its performance to the full with good reproducibility.

FIG. 19 shows the results of measurement of electrical characteristics of the photoelectric sensor. The line B shows the results of measurement for a sample photoelectric sensor a half day after the production of it, and the line A shows the results of measurement for the same sample after it had been aged for 3 days. It will be understood from the graph that the photoelectric sensor aged for 3 days after the production thereof shows amplifying action more remarkably than the photoelectric sensor aged for a half day.

EXAMPLE 2

(Preparation of a double-layered photoelectric sensor)

On a glass substrate having a thickness of 1.1 mm and thoroughly cleaned, an ITO film having a thickness of 100 nm was grown by sputtering to obtain an electrode. The electrode was subjected to a cleaning treatment similar to that in Example 1.

The surface of the electrode thus treated was coated with a coating solution in 0.4 sec. by a spinner at 1,400 rpm. The coating solution was prepared by mixing 3 parts by weight of a bis-azo pigment having the following structure as a charge generating substance, 1 part by weight of a vinyl chloride-vinyl acetate mixed resin material (a mixture of Denka Vinyl #1000D, manufactured by Denki Kagaku Kogyo K.K., and 18,325.89J vinyl acetate resin, manufactured by Aldrich, in the ratio of 75:25), 98 parts by weight of 1,4-dioxane, and 98 parts by weight of cyclohexanone and thoroughly kneading the mixture by using a mixing machine.

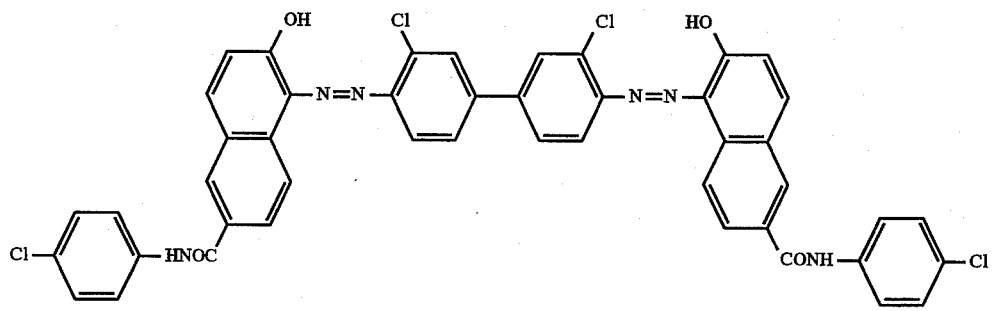

After the coating process, the coated electrode was allowed to stand under a calm condition until a dry film was formed on the surface of the coating so that the surface of the coating film was unadherable, thereby effecting leveling drying. Thereafter, drying was carried out for 1 hour at 100° C. Thus, a charge generation layer having a thickness of 300 nm was stacked on the electrode.

The surface of the charge generation layer was coated with a coating solution in 0.4 sec. by a spinner at 350 rpm. The coating solution was prepared by uniformly dissolving 50 parts by weight of a butadiene derivative (T-405, manufactured by Anan Co., Ltd.) having the following structure as a charge transport substance and 10 parts by weight of a styrene-butadiene copolymer resin material (Clearen 730L, manufactured by Denki Kagaku Kogyo K.K.) in 68 parts by weight of chlorobenzene, 68 parts by weight of dichloromethane, and 136 parts by weight of 1,1,2-trichloroethane.

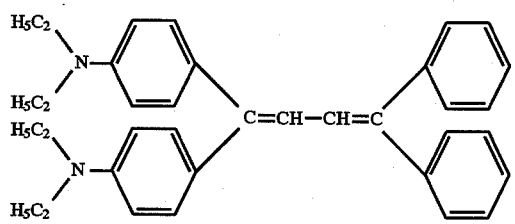

The coating was allowed to stand under a calm condition until a dry film was formed on the surface of the coating so that the surface of the coating film became unadherable, thereby effecting leveling drying. Thereafter, drying was carried out for 2 hours at 80° C., thereby stacking a charge transport layer on the charge generation layer, and thus obtaining a photoelectric sensor according to the present invention, which had a photoconductive layer of 20 µm in thickness that comprised the charge generation and transport layers. The photoelectric sensor was aged for 3 days in dark at a relative humidity of not higher than 60%.

(Electrical characteristics of the photoelectric sensor)

Figure 26:
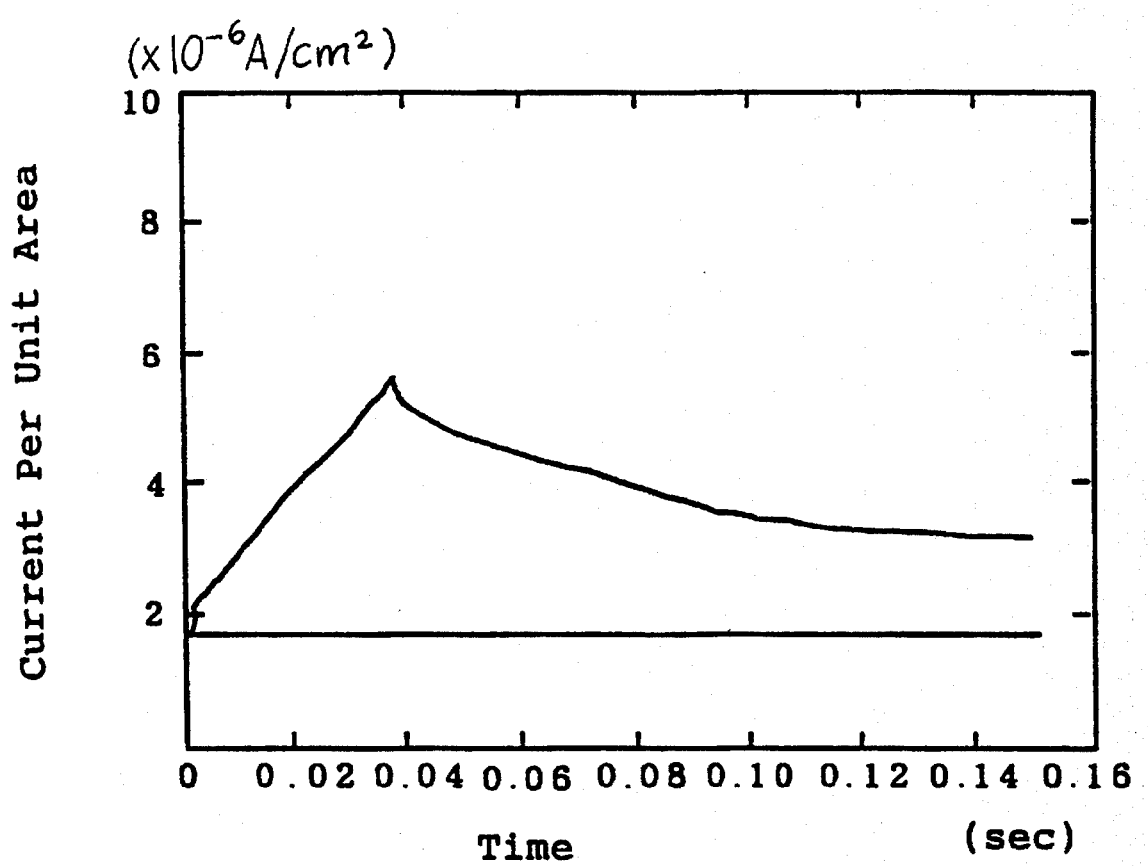
FIG. 26 is a graph showing electrical characteristics of one example of another photoelectric sensor according to the present invention.

A DC voltage of 300 V was applied to the photoelectric sensor, and at the same time, green light of 20 lux was applied from the glass substrate side for exposure for 1/30 sec. in the same way as in Example 1. The voltage application was continued for 0.15 se., and the change of current with time during the voltage application was measured with an oscilloscope. In another experiment, no exposure was carried out, but the voltage application alone was performed, and the change of current with time was measured in the same way as the above. The results of the two experiments are shown in FIG. 26. It will be understood from the figure that the photoelectric sensor has a photocurrent amplifying function similar to that of the photoelectric sensor in Example 1.

The resistivity was determined to be $1.0 \times 10^{11}$ ohm-cm from the value of current flowing in the photoelectric sensor.
(Information recording method)

With an information recording system constructed in the same way as in Example 1, a DC voltage of 750 V was applied between the respective electrodes of the photoelectric sensor and the information recording medium, and at the same time, exposure was carried out by projecting a gray scale from the photoelectric sensor side for 1/30 sec. The voltage application time was 0.05 sec. After the exposure, the information recording medium was taken out, and the recorded information was read and output by an information output system similar to that used in Example 1. As a result, a favorable print was obtained.

(Measurement of thermally stimulated current in the photoelectric sensor)

Figure 27:
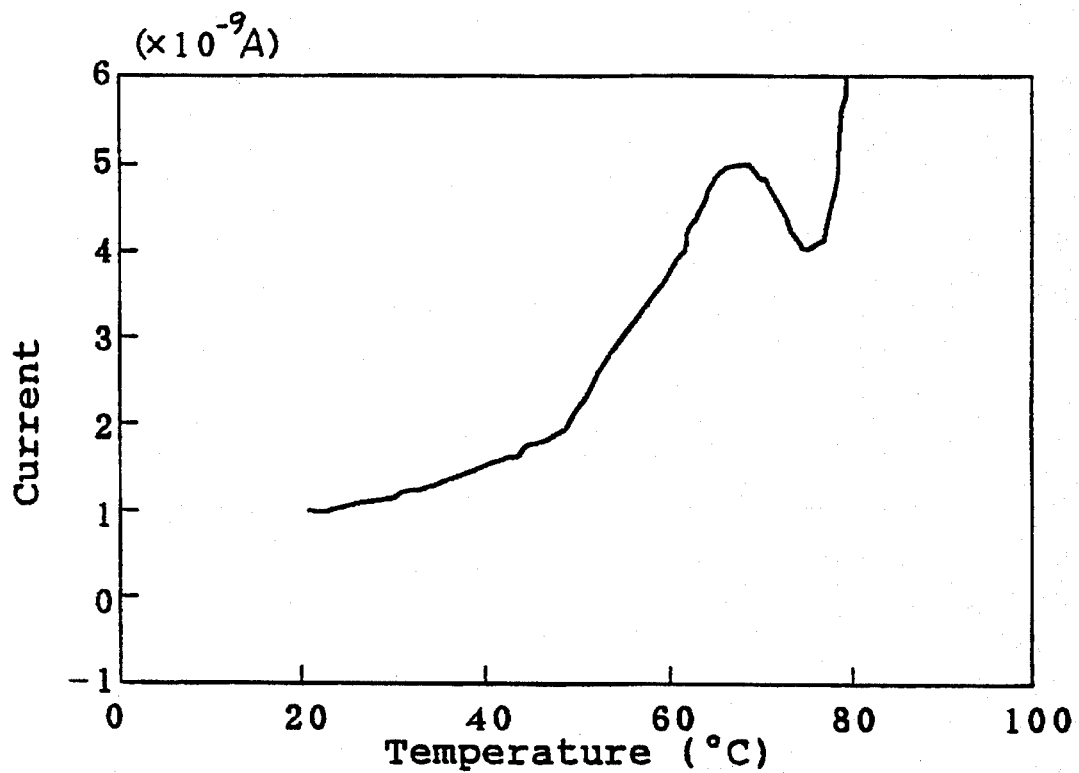
FIG. 27 is a graph showing the results of measurement of thermally stimulated current in another photoelectric sensor of the present invention.

Thermally stimulated current was measured by the same method as in Example 1. The results of the measurement are shown in FIG. 27. In the graph of FIG. 27, the axis of abscissas represents the heating temperature (°C.), and the axis of ordinates represents the current value. A clear peaked waveform was observed in the temperature range of 40° C. to 150° C. in the same way as in Example 1.

EXAMPLE 3

(Preparation of a photoelectric sensor)

Poly-N-vinylcarbazole (PVK) and a thiapyrylium salt dye having the following structure were mixed together in the molar ratio of 100:0.001.

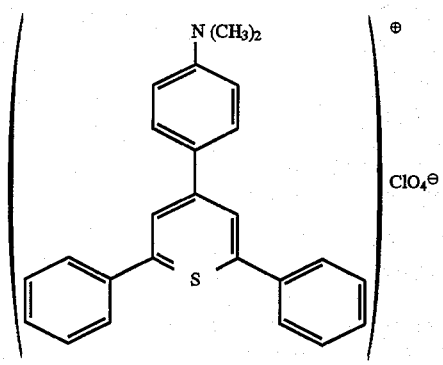

Then, the mixture was dissolved in chloroform so that the solid content in the resulting solution was 4% by weight. The solution thus prepared was coated on an ITO transparent electrode having a thickness of 100 nm and a sheet resistivity of 80 ohm/sq., which was formed on a glass substrate, at 3 cm/sec. by a blade coater provided with a gap of 200 µm. After it had been allowed to stand for 10 minutes, the coating was dried for 1 hour at 80° C., thereby preparing a photoelectric sensor having a thickness of 10 µm.

(Electrical characteristics of the photoelectric sensor)

Figure 28:
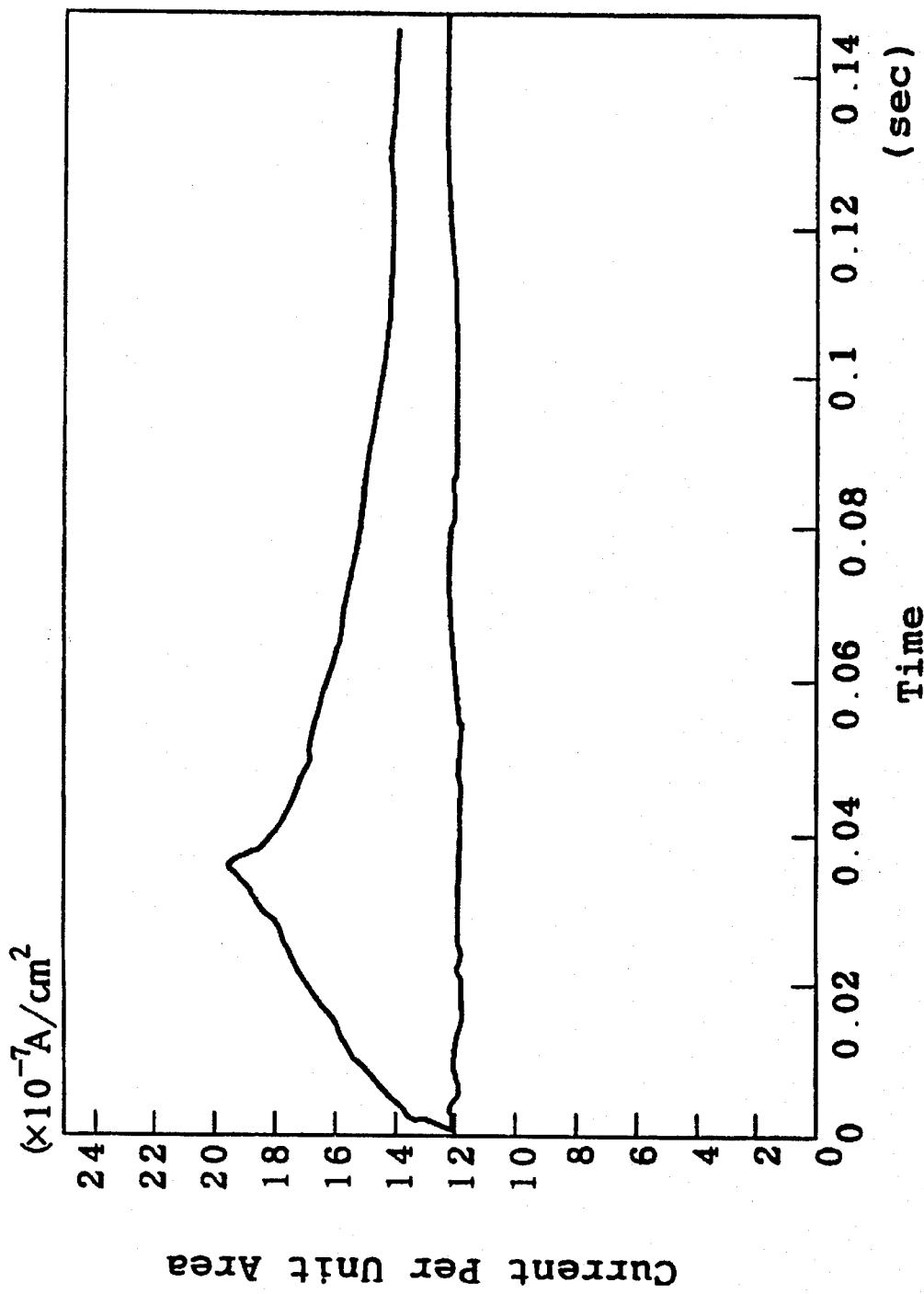
FIG. 28 is a graph showing electrical characteristics of another photoelectric sensor of the present invention.

A sample for measurement was prepared by depositing a gold electrode on the photoelectric sensor in the same way as in Example 1. The sample was allowed to stand for 2 days under the conditions of 25° C., 55% RH, and 200 lux, 1 m below a fluorescent lamp (36 W, single lamp; Watt Brighter FLR40SW/M/36, manufactured by Toshiba Corp.), thereby carrying out exposure, and thus making the photoelectric sensor semiconductive. Thereafter, with a current measuring system similar to that used in Example 1, a DC voltage of 300 V was applied between the two electrodes in a darkroom with the ITO electrode used as a positive electrode and, at the same time, green light of 20 lux was applied from the ITO electrode side for 1/30 sec. to effect exposure. The voltage application was carried out for 0.15 sec, and the change of current with time during the voltage application was measured. The results of the measurement are shown in FIG. 28.

It will be understood from the figure that the photoelectric sensor has a photocurrent amplifying function similar to that of the photoelectric sensor in Example 1. Similar advantageous effects were also obtained when the photoelectric sensor was subjected to preexposure treatment at 60 lux with a DC voltage of 300 V being applied to the photoelectric sensor in the same polarity relationship as the above.

EXAMPLE 4

A photoelectric sensor was prepared in the same way as in Example 3 except that a triphenylmethane dye (Malachite Green, BF$_4$ salt) having the following structure was employed in place of the thiapyrylium dye used in Example 3:

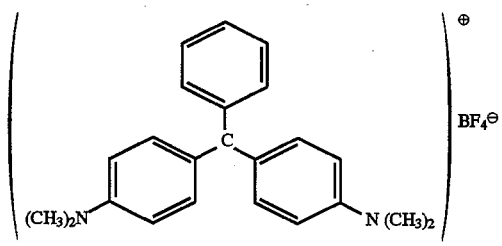

(Electrical characteristics of the photoelectric sensor)

Figure 29:
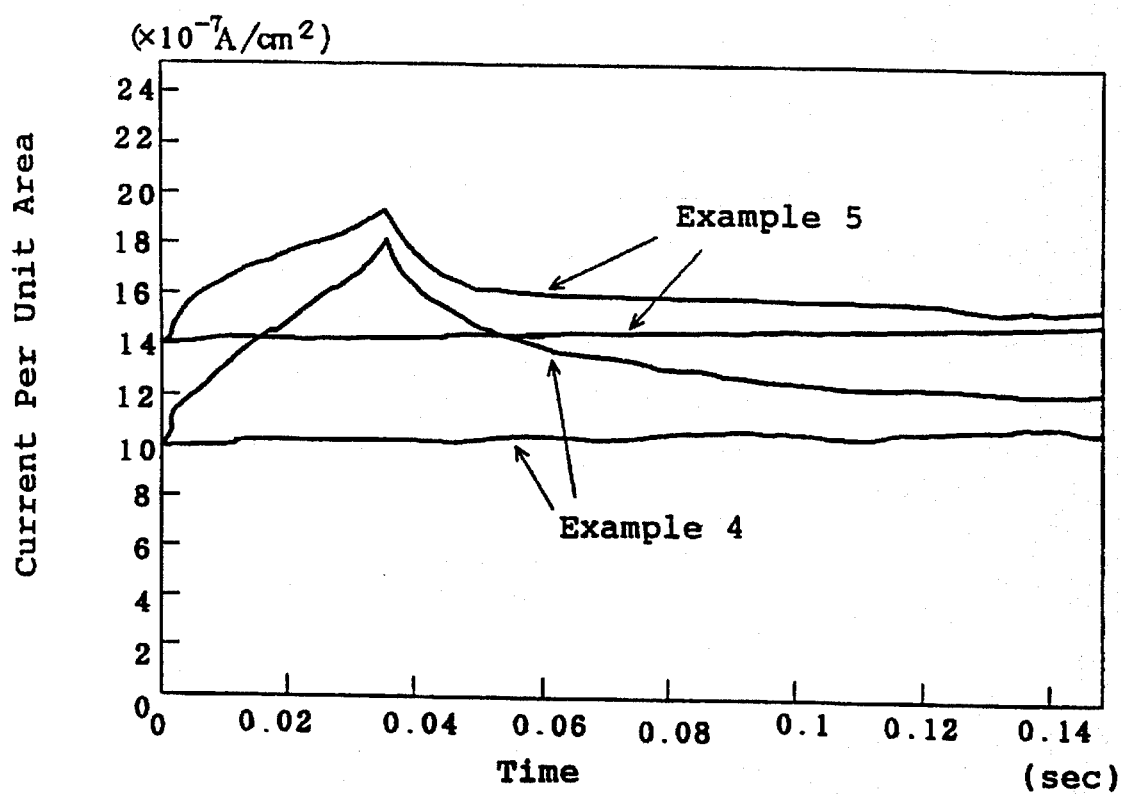
FIG. 29 is a graph showing electrical characteristics of other photoelectric sensors of the present invention.

Electrical characteristics of the photoelectric sensor were measured in the same way as in Example 3. The results of the measurement are shown in FIG. 29. The photoelectric sensor had a photocurrent amplifying function similar to that of the photoelectric sensor in Example 3. Similar advantageous effects were also obtained when the photoelectric sensor was subjected to preexposure treatment at 80 lux with a DC voltage of 300 V being applied to tke photoelectric sensor in the same polarity relationship as in the exposure process carried out under voltage application.

EXAMPLE 5

A photoelectric sensor was prepared in the same way as in Example 3 except that a triphenylmethane dye (Crystal Violet, BF$_4$ salt) having the following structure was employed in place of the thiapyrylium dye used in Example 3:

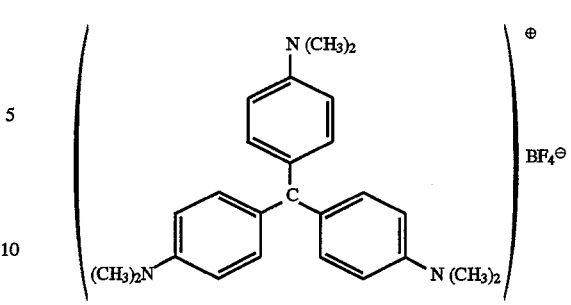

(Electrical characteristics of the photoelectric sensor)

Electrical characteristics of the photoelectric sensor were measured in the same way as in Example 3. The results of the measurement are shown in FIG. 29. The photoelectric sensor had a photocurrent amplifying function similar to that of the photoelectric sensor in Example 3.

EXAMPLE 6

A diparaxylyrene having the following structure was subjected to vapor phase polymerization under a vacuum to grow poly-monochloroparaxylylene on the photoconductive layer of the photoelectric sensor prepared in Example 1, thereby stacking a dielectric layer having a thickness of 0.6 μm on the photoconductive layer:

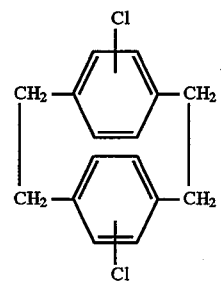

Next, an information recording layer was stacked on the dielectric layer in the same way as in Example 1 by using the coating solution comprising an ultraviolet curing resin material and a liquid crystal material, which was prepared in Example 1.

Next, ITO was grown to a thickness of 20 nm on the information recording layer by sputtering to stack an electrically conductive layer, thereby preparing an information recording system.

A DC voltage of 680 V was applied between the two electrodes of the information recording system, and at the same time, exposure was carried out by projecting a gray scale from the photoelectric sensor side for 1/30 sec at an exposure of 0.2 to 200 lux in the same way as in Example 1. The voltage application time was 0.08 sec. After the exposure, the information recording medium was taken out, and the recorded information was read and output by an information output system similar to that used in Example 1. As a result, a favorable print was obtained.

EXAMPLE 7

(Preparation of an information recording medium)

On a glass substrate thoroughly cleaned, SnO$_2$ was deposited to a thickness of 100 nm to prepare an electrode. Thereafter, the electrode was subjected to a cleaning treatment similar to that in Example 1. The surface of the cleaned electrode was coated with a coating solution in 5 sec. by a spinner at 2,000 rpm. The coating solution was obtained by uniformly mixing 4 parts by weight of a β-pinene polymer (Piccolite S115, manufactured by Rika Hercules Co.), 16 parts by weight of an α-methylstyrene polymer (Kristalex 3100, manufactured by Rika Hercules Co.), and 80 parts by weight of xylene. Thereafter, it was allowed to stand for 30 minutes at room temperature, thereby obtaining an information recording medium having an information recording layer of 0.7 μm in thickness.

(Information recording method)

An information recording system similar to that in Example 1 was prepared by using the photoelectric sensor prepared in Example 1 and the information recording medium prepared as described above. A DC voltage of 800 V was applied between the two electrodes, and at the same time, exposure was carried out by projecting a gray scale from the photoelectric sensor side for 0.1 sec. at an exposure of 0.2 to 200 lux. The voltage application time was 0.5 sec. After the exposure, the information recording medium was taken out and heated for 30 sec. at 80° C. to effect development. As a result, a frost image corresponding to the gray scale was formed.

It was possible to read the frost image formed on the information recording medium by the information output system as shown in FIG. 22 in the same way as in Example 1.

In the case of an information recording medium for forming a frost image, no satisfactory frost image can be formed thereon after the heating process unless the information recording medium has previously been charged to a certain potential. In this example, the information recording medium needs to be charged to a potential of about 150 V. Since the photoelectric sensor of the present invention is semiconductive, it is possible to realize both high sensitivity and the supply of the required base current. A photoelectric sensor other than such a semiconductive photoelectric sensor needs to be charged in advance or to increase the applied voltage at the time of information recording. However, it takes time and labor to charge the photoelectric sensor in advance, and if the applied voltage is increased, the possibility that electric discharge breakdown will occur rises.

EXAMPLE 8

(Preparation of an information recording medium)

On a glass substrate having a thickness of 1.1 mm and thoroughly cleaned, an ITO film having a thickness of 100 nm was grown by sputtering to obtain an electrode. Thereafter, the electrode was subjected to a cleaning treatment in the same way as in Example 1.

The surface of the electrode was coated by spinner coating method (1500 rpm; 20 sec) with a solution of 7% a fluorocarbon resin (Cytop, manufactured by Asahi Glass Company, Ltd., having a glass transition temperature of 100° C., a water absorption of 0.01% and a resistivity of $1 \times 10^{18}$ ohm-cm) in a fluorine-containing solvent, and it was dried for 3 hours at room temperature, thereby obtaining an information recording medium having an information recording layer of 3 μm in thickness.

(Information recording method)

An information recording system similar to that used in Example 1 was constructed by using the information recording medium prepared as described above and the photoelectric sensor prepared in Example 1. A DC voltage of 900 V was applied between the two electrodes, and at the same time, exposure was carried out by projecting a gray scale from the photoelectric sensor side for 1/30 sec. at an exposure of 0.2 to 200 lux. The voltage application time was 0.1 sec.

Figure 30:
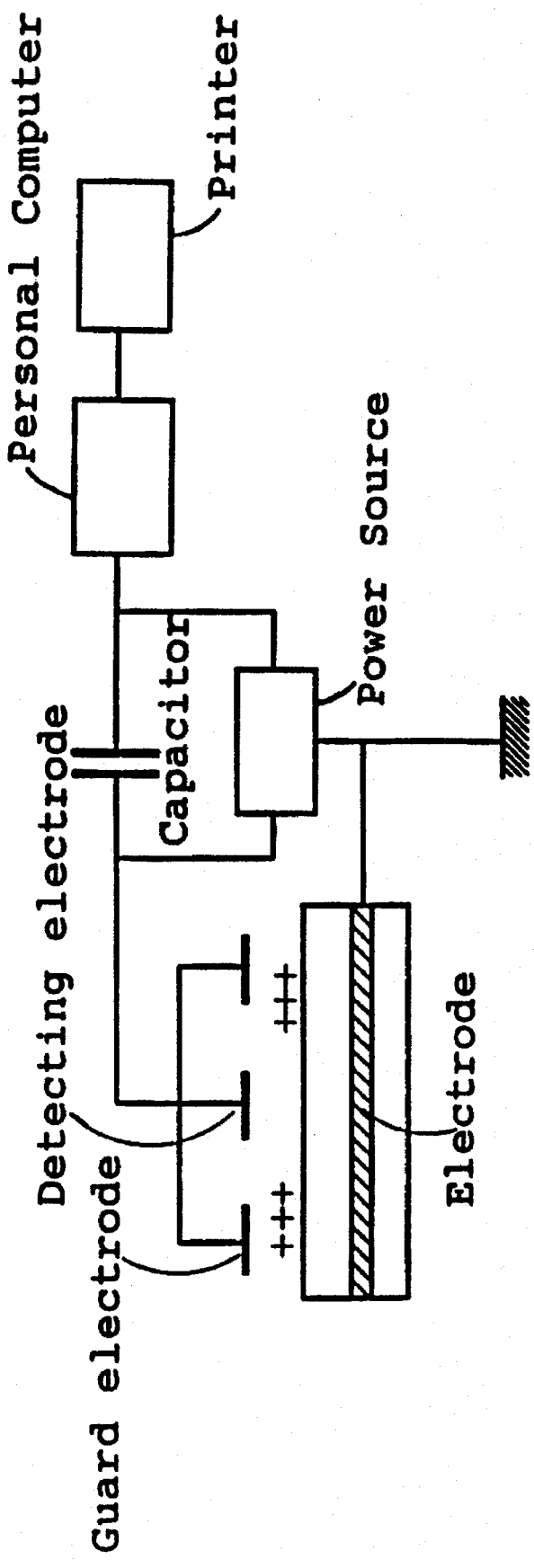
FIG. 30 illustrates another method for reproducing recorded information from the information recording system of the present invention.

It was possible to read the electrostatic information recorded on the resin surface of the information recording medium by an information output system as shown in FIG. 30 using a vibrating-reed electrometer (Model 344, manufactured by Trek Inc.).

If data processing is executed by previously subtracting a potential presumable to be unnecessary for reading, i.e., 200 V in this case, from the value of base current, information conversion can be effected even more promptly. If processing is executed without subtracting the unnecessary potential, data analysis takes a great deal of time, so that the processing executed thereafter cannot be carried out promptly.

In addition, since the photoelectric sensor of the present invention has an amplifying function, it is possible to convert even feeble light information into a potential difference. Accordingly, the photoelectric sensor of the present invention was capable of detecting a potential difference from a lower exposure region and hence had higher sensitivity than in the case of the conventional photoelectric sensor.

EXAMPLE 9

On a glass substrate having a thickness of 1.1 mm and thoroughly cleaned, an ITO film having a size of 0.16 cm$^2$, a sheet resistivity of 80 ohm/sq. and a thickness of 50 nm was grown by sputtering, thereby preparing a transparent electrode.

The electrode was subjected to a cleaning treatment twice by using a scrubber cleaning machine (Plate Cleaner, Model 602, manufactured by Ultratech Co., Ltd.). The cleaning treatment was comprised of spraying of pure water for 2 sec., scrubber cleaning for 20 sec., rinsing with pure water for 15 sec., removal of water by high-speed rotation for 25 sec., and infrared drying for 55 sec.

Various coating solutions were prepared by mixing 3 parts by weight of the same bis-azo pigment as that used in Example 2 as a charge generating substance, 1 part by weight of one of binder resins shown in Tables 1 and 2 below, and 196 parts by weight of one of solvents shown in Tables 1 and 2 and thoroughly kneading the mixture using a mixing machine. Each coating solution was coated on the electrode and allowed to stand under a calm condition until a dry film was formed on the surface of the coating so that the surface of the coating film was unadherable, thereby effecting leveling drying. Thereafter, drying was carried out for 1 hour at 100° C. Thus, a charge generation layer having a thickness of 0.3 μm was stacked on the electrode. It should be noted that the binder resins used in this example had a molecular weight in the range of 1,000 to 100,000, and that it is preferable to use a binder resin whose molecular weight falls in this range.

Then, a coating solution was prepared by uniformly dissolving 25 parts by weight of the same butadiene derivative (T-405, manufactured by Anan Co., Ltd.) as that used in Example 2 as a charge transport substance and 5 parts by weight of a styrene-butadiene copolymer resin material (Clearen 730L, manufactured by Denki Kagaku Kogyo K.K.) in 102 parts by weight of chlorobenzene and 68 parts by weight of dichloromethane. The coating solution was coated on the charge generation layer prepared as described above. After leveling drying, drying was carried out for 2 hours at 80° C., thereby forming a charge transport layer having a thickness of 20 μm. Thus, a photoelectric sensor was prepared.

After the photoelectric sensor thus prepared had been aged for 3 days, electrical characteristics, information recording performance and stored charge light decay characteristics of the photoelectric sensor were evaluated in the same way as in Example 1.

For the stored charge light decay characteristics, the acceptance potential (V) was measured; for the electrical characteristics, the base current density (A/cm$^2$) was measured; and for the information recording performance, the contrast voltage (V) was measured. The results of measurement for each of the binder resins are shown in Tables 1 and 2. It should be noted that the contrast voltage is defined as an increment of voltage measured 0.04 sec. after the initiation of the voltage application in the graph of FIG. 25.

Figure 31:
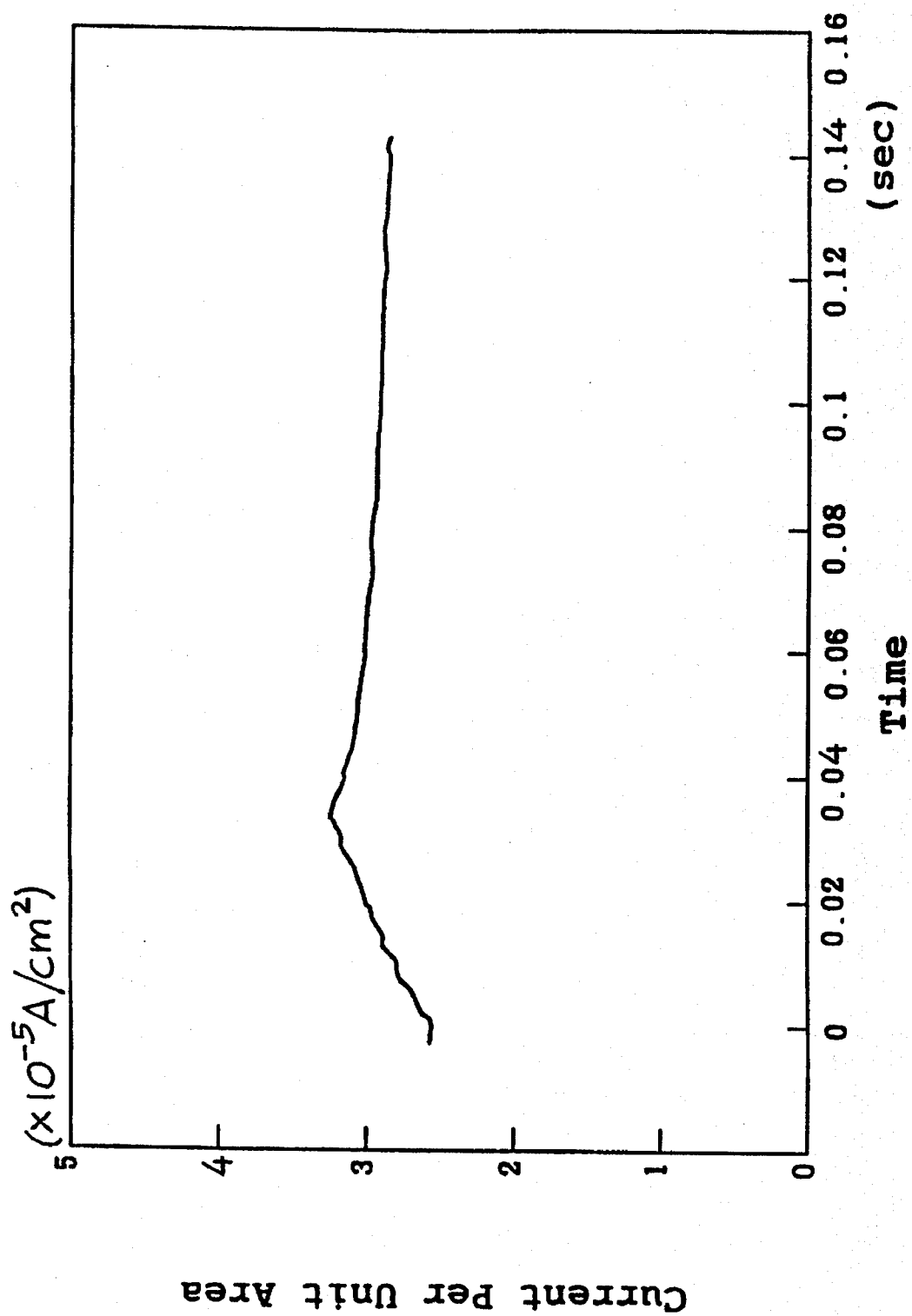
FIG. 31 is a graph showing electrical characteristics of another photoelectric sensor of the present invention.
Figure 32:
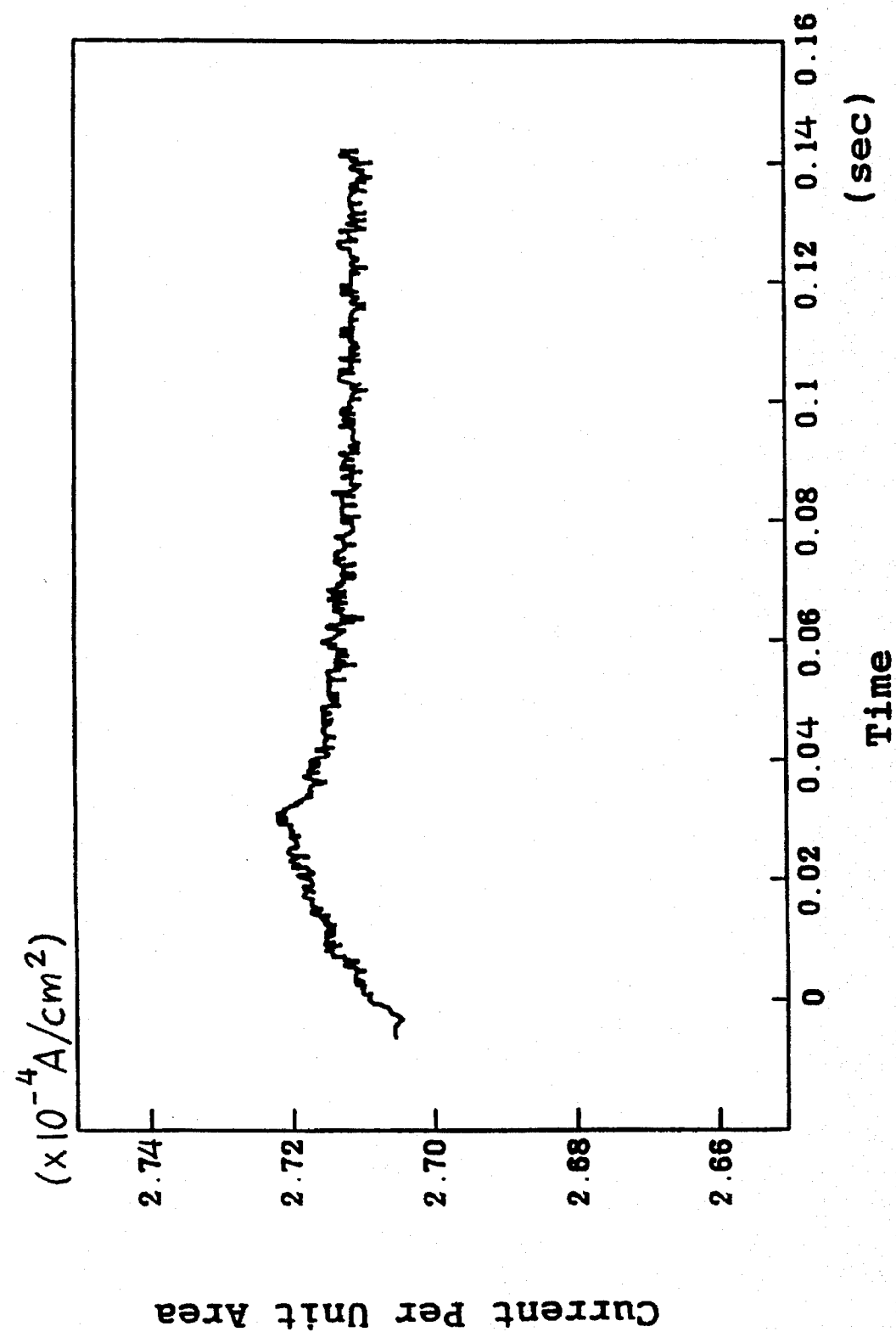
FIG. 32 is a graph showing electrical characteristics of another photoelectric sensor of the present invention.

The results of measurement for electrical characteristics of Sample Nos. 8 and 12 using polyvinyl chloride and polyvinylidene chloride are shown in FIGS. 31 and 32, respectively.

TABLE 1

| Sample No. | Resin | Solvent | Specific inductivity $\epsilon_s$(60 Hz) | Resistivity ($\Omega$-cm) | Water absorption (%) | Acceptance potential (V) | Dark current density (A/cm$^2$) | Contrast (V) |
|---|---|---|---|---|---|---|---|---|
| 1 | Polyvinyl chloride-acryl copolymer Eslec E-C110 (Sekisui Chemical) vinyl chloride: acryl = 83.6:16 | Cyclohexanone: THF = 3:7 | | | | −6 | 1.5 × 10$^{-5}$ | 20.9 |
| 2 | Polyester Vylon600 (Toyobo Co., Ltd.) | Cyclohexanone: THF = 3:7 | 3 | 10$^{15}$ | 0.08 | −6 | 1.5 × 10$^{-5}$ | 33.2 |
| 3 | Polyvinyl butyral (18,256-7 A) | Cyclohexanone: THF = 3:7 | 3.1 | 10$^{14}$ | 0.01 | −6 | 3.1 × 10$^{-6}$ | 28.7 |
| 4 | Polyvinyl acetate (18,325.89 J) | Cyclohexanone: THF = 3:7 | 3.2 | 10$^{16}$ | | −96 | 1.0 × 10$^{-6}$ | 17.0 |
| 5 | Polystyrene (17,889.41 J) | Cyclohexanone: THF = 3:7 | 2.5 | 10$^{17}$ | 0.03 | −18 | 3.8 × 10$^{-6}$ | 15.8 |
| 6 | Butyl methacrylate resin (18,152-8 A) | Cyclohexanone: THF = 3:7 | 3.8 | 10$^{16}$ | 0.07 | −40 | 3.1 × 10$^{-6}$ | 8.9 |
| 7 | Polycarbonate (17,831.80 J) | Tetrahydrofuran | 3.1 | 10$^{17}$ | 0.20 | −40 | 3.1 × 10$^{-6}$ | |
| 8 | Polyvinyl chloride (18,332.96 J) | Tetrahydrofuran | 3.7 | 10$^{15}$ | 0.25 | −2 | 2.6 × 10$^{-5}$ | 5.0 |
| 9 | Polyvinyl chloride-polyvinyl acetate copolymer (#1000D Denka) vinyl chloride: vinyl acetates = 68:32 | Cyclohexanone: THF=3.7 | 3.2 | 10$^{14}$ | | −4 | 1.4 × 10$^{-5}$ | 29.4 |
| 10 | Acrylonitrile-styrene copolymer (Sebian N-LD Daicel) | Cyclohexanone: THF=3.7 | 2.6 | 10$^{16}$ | | −3 | 1.9 × 10$^{-5}$ | 5.0 |
| 11 | Ethylene-vinyl acetate copolymer (Elvaroy U741D Mitsui-Du Pont Chemical) | Cyclohexanone: THF=3.7 | 3.4 | 10$^{14}$ | | −90 | 1.6 × 10$^{-6}$ | 15.0 |
| 12 | Polyvinylidene chloride (Saran F216 Asahi Chemical) | Cyclohexanone: THF=3.7 | 4.5 | 10$^{14}$ | 0.1 | ≈0 | 2.7 × 10$^{-4}$ | 0 |
| 13 | Ethyl cellulose (E290 Tokyo Kasei) | Cyclohexanone: THF=3.7 | 3.5 | 10$^{12}$ | 1.2 | −84 | 2.9 × 10$^{-6}$ | 8.6 |
| 14 | Polyvinyl formal (18,268-0 A) | Cyclohexanone: 1,4-dioxane=3:7 | | | | −29 | 1.9 × 10$^{-6}$ | 25.6 |
| 15 | Polyethylene oxide (17,858.10 J) | 1,2-dichloroethane | | | 0.1 | −276 | 2.4 × 10$^{-8}$ | 0 |

"A" represents No. of ALDRICH, and "J" represents No. of JANNSEN

TABLE 2

| Sample No. | Resin | Solvent | Acceptance potential (V) | Dark current density (A/cm$^2$) | Contrast (V) |
|---|---|---|---|---|---|
| 16 | Vinyl chloride-ethylene copolymer Ryuron E-430 (Toso) | Cyclohexanone: THF = 3:7 | −5 | 1.6 × 10$^{-5}$ | 30.6 |
| 17 | Vinyl chloride-ethylene copolymer Ryuron E-650 (Toso) | Cyclohexanone: THF = 3:7 | −6 | 1.7 × 10$^{-5}$ | 23.6 |
| 18 | Vinyl chloride-vinyl acetate copolymer (#1000A Denka) vinyl chloride/vinyl acetate = 86/14 | Cyclohexanone: THF = 3:7 | −5 | 2.1 × 10$^{-5}$ | 31.5 |

TABLE 2-continued

| Sample No. | Resin | Solvent | Acceptance potential (V) | Dark current density (A/cm$^2$) | Contrast (V) |
|---|---|---|---|---|---|
| 19 | Vinyl chloride-vinyl acetate copolymer (#1000LT Denka) vinyl chloride/vinyl acetate = 75/35 | Cyclohexanone: THF = 3:7 | −4 | $1.9 \times 10^{-5}$ | 32.0 |
| 20 | Vinyl chloride-vinyl acetate copolymer (#1000D Denka) vinyl chloride/vinyl acetate = 68/32 | Cyclohexanone: THF = 3:7 | −6 | $1.5 \times 10^{-5}$ | 33.3 |
| 21 | Polyester Vylon 103 (Toyobo Co., Ltd.) Tg = 47° C. mol. wt.: 20000–25000 | Cyclohexanone: THF = 3:7 | −3 | $3.4 \times 10^{-6}$ | 30.2 |
| 22 | Polyester Vylon 200 (Toyobo Co., Ltd.) Tg = 67° C. mol. wt.: 15000–20000 | Cyclohexanone: THF = 3:7 | −2 | $5.6 \times 10^{-6}$ | 35.8 |
| 23 | Polyester Vylon 290 (Toyobo Co. Ltd.) Tg = 72° C. mol. wt.: 20000–25000 | Cyclohexanone: THF = 3:7 | −2 | $1.3 \times 10^{-6}$ | 21.3 |
| 24 | Polyester Vylon 300 (Toyobo Co., Ltd.) Tg = 70° C. mol. wt.: 20000–25000 | Cyclohexanone: THF = 3:7 | −15 | $5.5 \times 10^{-6}$ | 36.3 |
| 25 | Polyester Vylon 600 (Toyobo Co., Ltd.) Tg = 47° C. mol. wt.: 14000–17000 | Cyclohexanone: THF = 3:7 | −4 | $5.3 \times 10^{-6}$ | 37.5 |
| 26 | Polyvinyl butyral PVA 20–24 (#2000-L Denka) | Cyclohexanone: THF = 3:7 | −11 | $6.8 \times 10^{-6}$ | 28.0 |
| 27 | Polyvinyl butyral PVA 18–22 (#3000-1 Denka) | Cyclohexanone: THF = 3:7 | −11 | $6.3 \times 10^{-6}$ | 40.5 |
| 28 | Polyvinyl butyral PVA 9–13 (#3000-K Denka) | Cyclohexanone: THF = 3:7 | −13 | $2.8 \times 10^{-6}$ | 30.4 |
| 29 | Polyvinyl butyral (18,256-7 Aldrich) | Cyclohexanone: THF = 3:7 | −19 | $3.3 \times 10^{-6}$ | |
| 30 | Acrylonitrile-styrene copolymer Eslea P NI-4931 (Sekisui Chemical) | 1,2-dichloroethane | −31 | $3.8 \times 10^{-6}$ | 4.1 |
| 31 | Polystyrene-polybutadiene copolymer Clearen 530L (Donki Kagaku Kogyo K.K.) | 1,2-dichloroethane | −58 | $1.1 \times 10^{-6}$ | 12.8 |

EXAMPLE 10

A coating solution was prepared by mixing 3 parts by weight of the same bis-azo pigment as that used in Example 2 and 1 part by weight of polyvinyl formal resin with 196 parts by weight of a mixed solvent comprising 1,4-dioxane and cyclohexanone in the ratio of 1:1 and thoroughly kneading the mixture by using a mixing machine. The coating solution was coated on an electrode prepared in the same way as in Example 9 and dried for 1 hour at 100° C., thereby forming a charge generation layer having a thickness of 0.3 μm.

Next, various coating solutions were prepared by uniformly dissolving 25 parts by weight of the same butadiene derivative (T-405, manufactured by Anan Co., Ltd.) as that used in Example 2 as a charge transport substance and 5 parts by weight of one of binder resins shown in Tables 3 and 4 below in 102 parts by weight of chlorobenzene and 68 parts by weight of dichloromethane. Each coating solution was coated on the charge generation layer prepared as described above. After leveling drying, drying was carried out for 2 hours at 80° C., thereby forming a charge transport layer having a thickness of 20 μm. Thus, a photoelectric sensor was prepared.

After the photoelectric sensor thus prepared had been aged for 3 days in dark, electrical characteristics, information recording performance and stored charge light decay characteristics of the photoelectric sensor were evaluated in the same way as in Example 1.

For the stored charge light decay characteristics, the acceptance potential (V) was measured; for the electrical characteristics, the base current density (A/cm$^2$) was measured; and for the information recording performance, the contrast voltage (V) was measured. The results of measurement for each of the binder resins are shown in Tables 3 and 4.

TABLE 3

| Sample No. | Resin | Solvent | Acceptance potential (V) | Dark current density (A/cm$^2$) | Contrast (V) |
|---|---|---|---|---|---|
| 32 | Polycarbonate Iupilon Z-200 (Mitsubishi Gas Chemical) | 1,1,2-trichloroethane: methylene chloride = 6:4 | −27 | $2.0 \times 10^{-6}$ | 29 |
| 33 | Polycarbonate DM-BPA-N3 (Denki Kagaku Kogyo K.K.) | 1,1,2-trichloroethane: methylene chloride = 6:4 | −25 | $2.0 \times 10^{-6}$ | 28 |
| 34 | Polycarbonate-polystyrene graft compolymer (Mitsubishi Gas Chemical) | 1,1,2-trichloroethane: methylene chloride = 6:4 | −31 | $1.8 \times 10^{-6}$ | 27 |

TABLE 3-continued

| Sample No. | Resin | Solvent | Acceptance potential (V) | Dark current density (A/cm$^2$) | Contrast (V) |
|---|---|---|---|---|---|
| 35 | Polystyrene GP (Mitsubishi Gas Chemical) | 1,1,2-trichloroethane:methylene chloride = 6:4 | −103 | $1.3 \times 10^{-6}$ | 40 |
| 36 | Polystyrene-polybutadiene copolymer Clearen 530L (Denki Kagaku Kogyo K.K.) | 1,1,2-trichloroethane:methylene chloride = 6:4 | −58 | $1.4 \times 10^{-6}$ | 30 |
| 37 | Acrylonitrile-styrene copolymer Eslec P NI-4931 (Sekisui Chemical) | 1,1,2-trichloroethane:methylene chloride = 6:4 | −51 | $1.4 \times 10^{-6}$ | 20 |
| 38 | Polystyrene-PPE (Mitsubishi Gas Chemical) | 1,1,2-trichloroethane:methylene chloride = 6:4 | −35 | $2.2 \times 10^{-6}$ | 34 |
| 39 | Polyvinyl chloride (18,332-96 JANSSEN) | Cyclohexanone:THF = 3:7 | −200 | $3.5 \times 10^{-7}$ | 10 |
| 40 | Polyarylate U-100 (Toyobo Co., Ltd.) | 1,1,2-trichloroethane:methylene chloride = 6:4 | −5 | $2.6 \times 10^{-6}$ | 7 |
| 41 | Phenoxy resin PKHH (Union Carbide) | 1,1,2-trichloroethane:methylene chloride = 6:4 | −35 | $2.3 \times 10^{-6}$ | 12 |
| 42 | Polybutyl methacrylate (18,152-8 ALDRICH) | 1,1,2-trichloroethane:methylene chloride = 6:4 | −35 | $2.2 \times 10^{-6}$ | 10 |
| 43 | Ethylene-vinyl acetate copolymer Elvaloy U741P (Mitsui-Du Pont Chemical) | 1,1,2-trichloroethane:methylene chloride = 6:4 | −45 | $2.0 \times 10^{-6}$ | 10 |
| 44 | Vinyl chloride-vinyl acetate copolymer (#1000D Denka) Vinyl chloride/vinyl acetate = 68/32 | 1,1,2-trichloroethane:methylene chloride = 6:4 | −422 | Not higher than $1 \times 10^{-9}$ | 0 |

TABLE 4

| Sample No. | Resin | Solvent | Acceptance potential (V) | Dark current density (A/cm$^2$) | Contrast (V) |
|---|---|---|---|---|---|
| 45 | Polycarbonate Iupilon Z-200 (Mitsubishi Gas Chemical) | 1,1 2-trichloroethane:methylene chloride = 6:4 | −27 | $2.0 \times 10^{-6}$ | 29.0 |
| 46 | Polycarbonate CO-TDD-2 (Mitsubishi Gas Chemical) | 1,1 2-trichloroethane:methylene chloride = 6:4 | −26 | $2.7 \times 10^{-6}$ | 23.3 |
| 47 | Polycarbonate CO-BPS-3 (Mitsubishi Gas Chemical) | 1,1 2-trichloroethane:methylene chloride = 6:4 | −30 | $1.7 \times 10^{-6}$ | 11.3 |
| 48 | Polystyrene Mol. wt.: 500000 MW-1 (Denki Kagaku Kogyo K.K.) | 1,1 2-trichloroethane:methylene chloride = 6:4 | −23 | $2.7 \times 10^{-6}$ | 34.1 |
| 49 | Polystyrene Mol. wt.: 600000 HMR-3 (Denki Kagaku Kogyo K.K.) | 1,1 2-trichloroethane:methylene chloride = 6:4 | −20 | $3.0 \times 10^{-6}$ | 32.1 |
| 50 | Poly-4-ter-butylstyrene (18,159-5 ALDRICH) | 1,1 2-trichloroethane:methylene chloride = 6:4 | −40 | $1.4 \times 10^{-6}$ | 34.1 |

TABLE 4-continued

| Sample No. | Resin | Solvent | Acceptance potential (V) | Dark current density (A/cm$^2$) | Contrast (V) |
|---|---|---|---|---|---|
| 51 | Poly-α-methylstyrene (19,182-5 ALDRICH) | 1,1 2-tri-chloroethane: methylene chloride = 6:4 | −21 | 2.5 × 10$^{-6}$ | 25.1 |
| 52 | Polyvinyl benzyl chloride (18,253-2 ALDRICH) | 1,1 2-tri-chloroethane: methylene chloride = 6:4 | −33 | 1.6 × 10$^{-6}$ | 14.8 |
| 53 | Acrylonitrile-butadiene-styrene copolymer TR1150 (Japan Synthetic Rubber) | 1,1 2-tri-chloroethane: methylene chloride = 6:4 | −33 | 1.7 × 10$^{-6}$ | 15 |
| 54 | Polyarylate P5001 (Toyobo Co. Ltd.) | 1,1 2-tri-chloroethane: methylene chloride = 6:4 | −21 | 2.0 × 10$^{-6}$ | 27.8 |

EXAMPLE 11

With the voltage measuring circuit shown in FIG. 23 and used for evaluation of the information recording performance of the photoelectric sensor in Example 1, similar evaluation was made by using the photoelectric sensor in Example 2.

The evaluation was made in the same way as in Example 1 except that exposure was carried out after a voltage of 600 V had been applied for ① 20 msec., ② 40 msec., ③ 60 msec., and ④ 80 msec. each, and the voltage application was continued even after the termination of the exposure. For a comparative sample, no voltage application was performed before the exposure.

Figure 33:
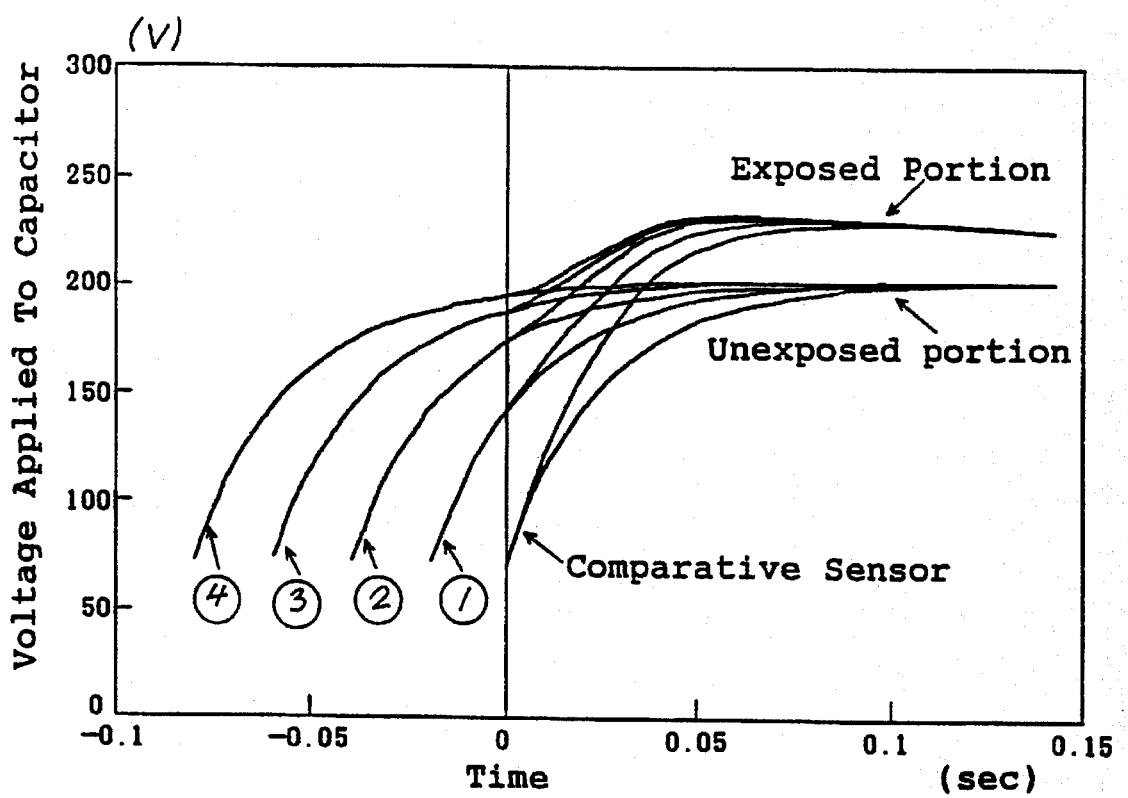
FIG. 33 is a graph showing information recording performance of the photoelectric sensors of the present invention.
Figure 34:
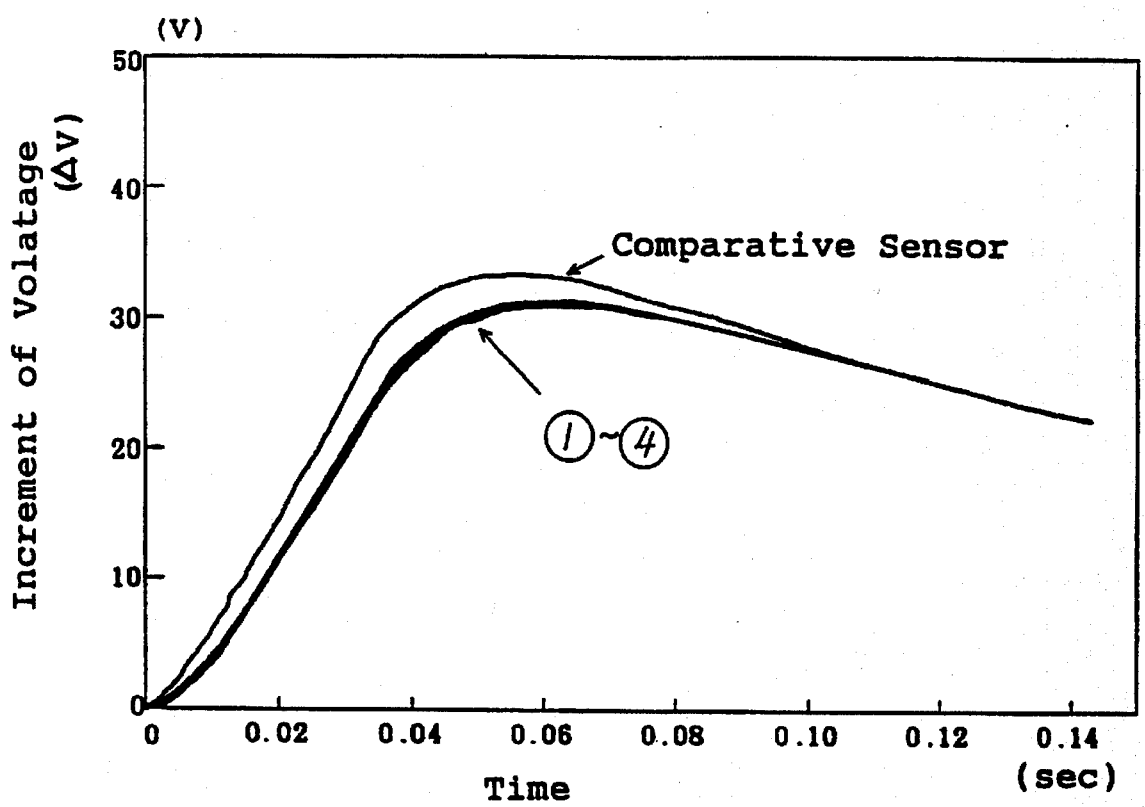
FIG. 34 is a graph showing information recording performance of the photoelectric sensors of the present invention.

The change with time of the voltage applied to the capacitor and the resistor is shown in FIG. 33, and the change with time of the increment (ΔV) of voltage caused by light irradiation is shown in FIG. 34.

As shown in FIG. 33, in comparison to the comparative sample, the samples to which a voltage was applied before the exposure also showed an approximately similar change in the voltage applied to the capacitor and exhibited an amplifying function.

It will be understood from FIG. 34 that it is possible to adjust the magnitude of voltage applied to an information recording medium, e.g., one made of a polymer dispersed liquid crystal that exhibits memory effect, by controlling the time of voltage application carried out before the exposure, and it becomes easy to set a voltage and an exposure time which are appropriate for the information recording medium used.

As has been described above, the photoelectric sensor of the present invention enables the electric field or electric charge, which is given to the information recording medium, to be amplified even when information exposure is effected by feeble light, so that it becomes possible to effect information recording of high sensitivity and high resolution to an information recording medium made of a liquid crystal, a frost image forming material, an electric charge retaining medium, etc. Recorded light information can be readily reproduced as visible information without the need for complicated optical, electrical or chemical processing. It is also possible to record a color image by carrying out exposure with light information separated into R, G and B light components.

What we claim is:

1. A photoelectric sensor, said photoelectric sensor being semiconductive, wherein when an electric field having an intensity of 10$^5$ V/cm to 10$^6$ V/cm is applied to said photoelectric sensor during voltage application, a passing current density on a portion unexposed to light is 10$^{-7}$ A/cm$^2$ to 10$^{-4}$ A/cm$^2$.

2. A photoelectric sensor comprising a photoconductive layer stacked on an electrode, said photoelectric sensor being semiconductive, wherein when said photoelectric sensor is exposed to light during voltage application, the amount of photo-induced current increases during exposure to light with time, increasing to an amount higher than the calculated theoretical amount of photoelectric current generated by the light exposure, and the photo-induced current gradually decreases after the termination of the light exposure when voltage is continuously applied.

3. A photoelectric sensor, wherein when said photoelectric sensor is charged at −5 KV for a period of 20 seconds by DC charging, absolute value of acceptance potential of the photoelectric sensor is less than 200 V.

4. A photoelectric sensor, wherein clear peak is observed within the range of 40° C. to 150° C. when a thermally stimulated current is measured at heating by the heating rate of 10° C./min. and applying a DC voltage of 5 V.

* * * * *